(12) United States Patent
Johnson et al.

(10) Patent No.: US 7,164,257 B2
(45) Date of Patent: Jan. 16, 2007

(54) METHOD AND SYSTEM FOR PROTECTION OF A LITHIUM-BASED MULTICELL BATTERY PACK INCLUDING A HEAT SINK

(75) Inventors: Todd W. Johnson, Wauwatosa, WI (US); Dennis J. Grzybowski, New Berlin, WI (US); Mark A. Kubale, West Bend, WI (US); Jay J. Rosenbecker, Menomonee Falls, WI (US); Karl F. Scheucher, Waite Hill, OH (US); Gary D. Meyer, Waukesha, WI (US); Jeffrey M. Zeiler, Delafield, WI (US); Kevin L. Glasgow, Lomira, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 0 days.

(21) Appl. No.: 11/322,862

(22) Filed: Dec. 30, 2005

(65) Prior Publication Data

US 2006/0103357 A1  May 18, 2006

Related U.S. Application Data

(62) Division of application No. 10/720,027, filed on Nov. 20, 2003.

(60) Provisional application No. 60/523,716, filed on Nov. 19, 2003, provisional application No. 60/523,712, filed on Nov. 19, 2003, provisional application No. 60/440,693, filed on Jan. 17, 2003, provisional application No. 60/440,692, filed on Jan. 17, 2003, provisional application No. 60/428,358, filed on Nov. 22, 2002, provisional application No. 60/428,452, filed on Nov. 22, 2002, provisional application No. 60/428,450, filed on Nov. 22, 2002.

(51) Int. Cl.
*H01M 10/46* (2006.01)

(52) U.S. Cl. .................................... 320/134

(58) Field of Classification Search ............... 320/112, 320/134, 136, 150, 153; 361/704, 709
See application file for complete search history.

(56) References Cited

U.S. PATENT DOCUMENTS

| | | | |
|---|---|---|---|
| 4,056,764 A | 11/1977 | Endo et al. | |
| 4,845,419 A | 7/1989 | Hacker | |
| 4,893,067 A | 1/1990 | Bhagwat et al. | |
| 4,937,528 A | 6/1990 | Palanisamy | |
| 4,973,896 A | 11/1990 | Shiga et al. | |
| 5,200,688 A | 4/1993 | Patino et al. | |
| 5,206,097 A | 4/1993 | Burns et al. | |
| 5,268,630 A | 12/1993 | Bhagwat et al. | |
| 5,272,380 A | 12/1993 | Clokie | |
| 5,280,229 A | 1/1994 | Faude et al. | |
| 5,350,993 A | 9/1994 | Toya et al. | |
| 5,355,073 A | 10/1994 | Nguyen | |
| 5,371,453 A | 12/1994 | Fernandez | |
| 5,498,950 A | 3/1996 | Ouwerkerk | |
| 5,547,775 A | 8/1996 | Eguchi et al. | |
| 5,557,192 A | 9/1996 | Tamai | |
| 5,563,496 A | 10/1996 | McClure | |
| 5,567,542 A | 10/1996 | Bae | |
| 5,572,108 A | 11/1996 | Windes | |
| 5,576,612 A * | 11/1996 | Garrett et al. .............. 320/106 |
| 5,598,085 A | 1/1997 | Hasler | |
| 5,606,242 A | 2/1997 | Hull et al. | |
| 5,684,387 A | 11/1997 | Patino | |
| 5,691,620 A | 11/1997 | Nagai et al. | |
| 5,691,623 A | 11/1997 | Tsantilis | |
| 5,708,351 A | 1/1998 | Takamoro | |
| 5,744,937 A | 4/1998 | Cheon | |
| 5,757,163 A | 5/1998 | Brotto et al. | |
| 5,789,900 A | 8/1998 | Hasegawa et al. | |
| 5,795,664 A | 8/1998 | Kelly | |
| 5,811,890 A | 9/1998 | Hamamoto | |
| 5,835,351 A | 11/1998 | Ulanski et al. | |
| 5,871,859 A | 2/1999 | Parise | |
| 5,894,212 A | 4/1999 | Balogh | |
| 5,963,019 A | 10/1999 | Cheon | |
| 5,986,430 A | 11/1999 | Fernandez et al. | |

(Continued)

FOREIGN PATENT DOCUMENTS

CA    2231260    6/1999

(Continued)

OTHER PUBLICATIONS

*IEEE 100 The Authoritative Dictionary of IEEE Standards Terms*, 7th ed., p. 91, Standards Information Network, IEEE Press, 2000.

(Continued)

*Primary Examiner*—Edward H. Tso
(74) *Attorney, Agent, or Firm*—Michael Best & Friedrich LLP

(57) ABSTRACT

A system and method for battery protection. In some aspects, a battery pack including a housing, a cell supported by the housing and power being transferable between the cell and an electrical device, a circuit supported by the housing and operable to control a function of the battery pack, and a heat sink in heat transfer relationship with the circuit and operable to dissipate heat from the circuit.

13 Claims, 75 Drawing Sheets

U.S. PATENT DOCUMENTS

| | | | |
|---|---|---|---|
| 5,994,875 | A | 11/1999 | Lee |
| 5,998,966 | A | 12/1999 | Gaza |
| 6,002,237 | A | 12/1999 | Gaza |
| 6,010,800 | A | 1/2000 | Stadnick et al. |
| 6,040,683 | A | 3/2000 | Mottier |
| 6,064,179 | A | 5/2000 | Ito et al. |
| 6,074,775 | A | 6/2000 | Gartstein et al. |
| 6,084,523 | A | 7/2000 | Gelnovatch et al. |
| 6,104,162 | A | 8/2000 | Sainsbury et al. |
| 6,124,698 | A | 9/2000 | Sakakibara |
| 6,144,186 | A | 11/2000 | Thandiwe et al. |
| 6,198,254 | B1 | 3/2001 | Satake et al. |
| 6,204,640 | B1 | 3/2001 | Sakakibara |
| 6,237,698 | B1 | 5/2001 | Carrier et al. |
| 6,275,004 | B1 | 8/2001 | Tamai et al. |
| 6,286,609 | B1 | 9/2001 | Carrier et al. |
| 6,296,065 | B1 | 10/2001 | Carrier |
| 6,324,339 | B1 | 11/2001 | Hudson et al. |
| 6,326,767 | B1 | 12/2001 | Small et al. |
| 6,329,788 | B1 | 12/2001 | Bailey, Jr. et al. |
| 6,329,796 | B1 | 12/2001 | Popescu |
| 6,337,557 | B1 | 1/2002 | Kates et al. |
| 6,362,600 | B1 | 3/2002 | Sakakibara |
| 6,433,510 | B1 | 8/2002 | Ribellino et al. |
| 6,440,602 | B1 | 8/2002 | Morita |
| 6,452,362 | B1 | 9/2002 | Choo |
| 6,489,751 | B1 | 12/2002 | Small et al. |
| 6,501,250 | B1 | 12/2002 | Bito et al. |
| 6,509,114 | B1 | 1/2003 | Nakai et al. |
| 6,518,731 | B1 | 2/2003 | Thomas et al. |
| 6,522,100 | B1 | 2/2003 | Hansford |
| 6,552,904 | B1 * | 4/2003 | Fung ............ 361/704 |
| 2001/0045803 | A1 | 11/2001 | Cencur |
| 2002/0125860 | A1 | 9/2002 | Schworm et al. |
| 2003/0096158 | A1 | 5/2003 | Takano et al. |
| 2005/0258801 | A9 | 11/2005 | Johnson et al. |

FOREIGN PATENT DOCUMENTS

| | | |
|---|---|---|
| DE | 3637669 | 5/1988 |
| DE | 19617805 | 11/1996 |
| DE | 10153083 | 5/2003 |
| EP | 265144 | 4/1988 |
| EP | 419806 | 4/1991 |
| EP | 621990 | 11/1994 |
| EP | 669692 | 2/1995 |
| EP | 0950864 | 8/1995 |
| EP | 767524 | 4/1997 |
| EP | 1039612 | 9/2000 |
| EP | 1191616 | 3/2002 |
| GB | 2289581 | 11/1995 |
| GB | 2293060 | 3/1996 |
| GB | 2336955 | 11/1999 |
| GB | 2354891 | 4/2001 |
| GB | 2354892 | 4/2001 |
| JP | 8196042 | 7/1996 |
| JP | 2000102185 | 4/2000 |
| JP | 2000102195 | 4/2000 |
| JP | 2001112182 | 4/2001 |
| JP | 2001218376 | 8/2001 |
| JP | 2002008732 | 1/2002 |
| JP | 2002369400 | 12/2002 |
| RO | 116233 | 11/2000 |
| WO | WO 93/14548 | 7/1993 |
| WO | WO 96/21954 | 7/1996 |
| WO | WO 99/63613 | 12/1999 |
| WO | WO 00/49699 | 8/2000 |
| WO | WO 01/03231 | 1/2001 |

OTHER PUBLICATIONS

MAKSTAR Ni-MH Battery System, Makita U.S.A., Inc., 1999-2002, 8 pages, La Mirada, CA USA.

* cited by examiner

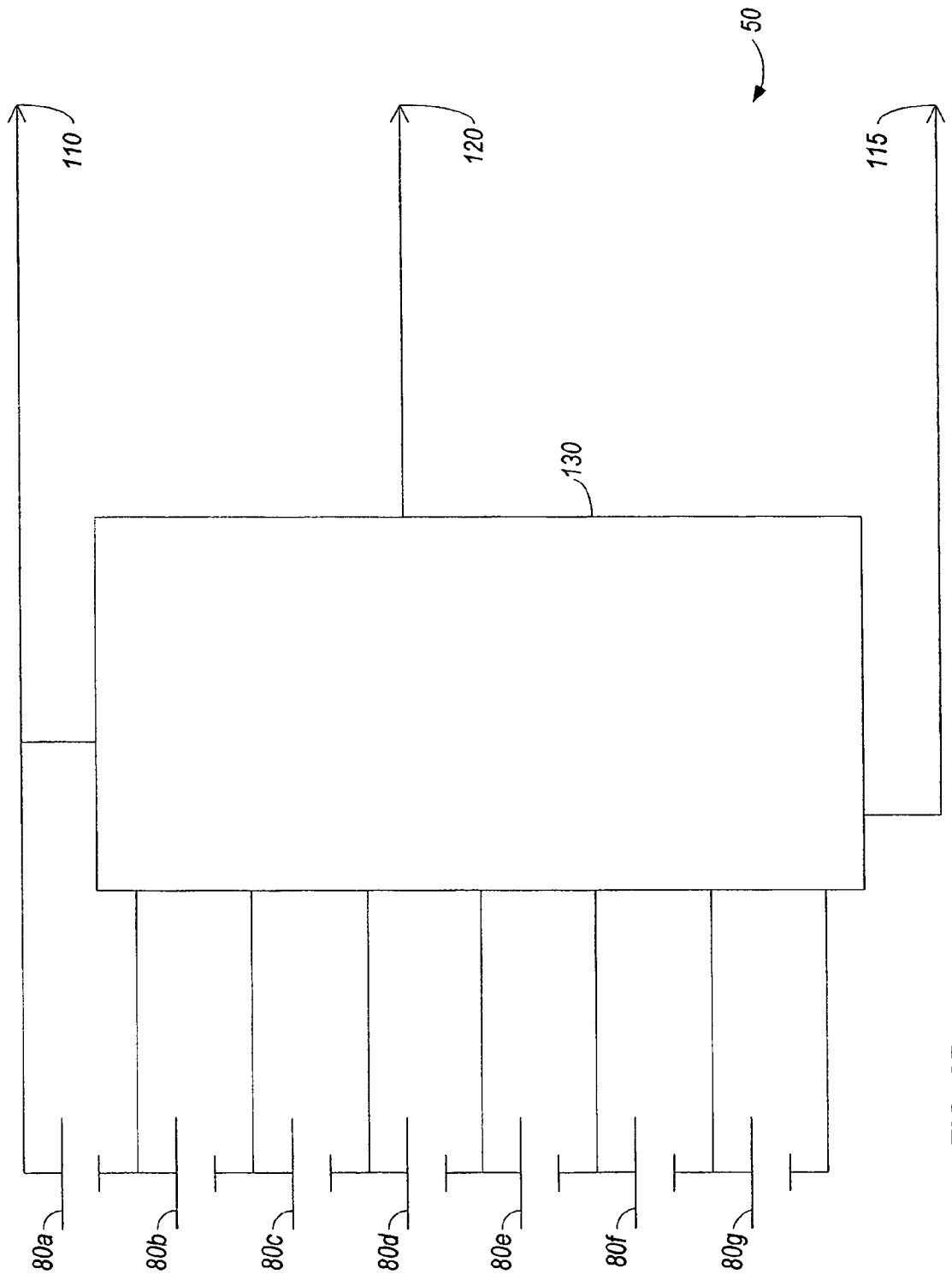

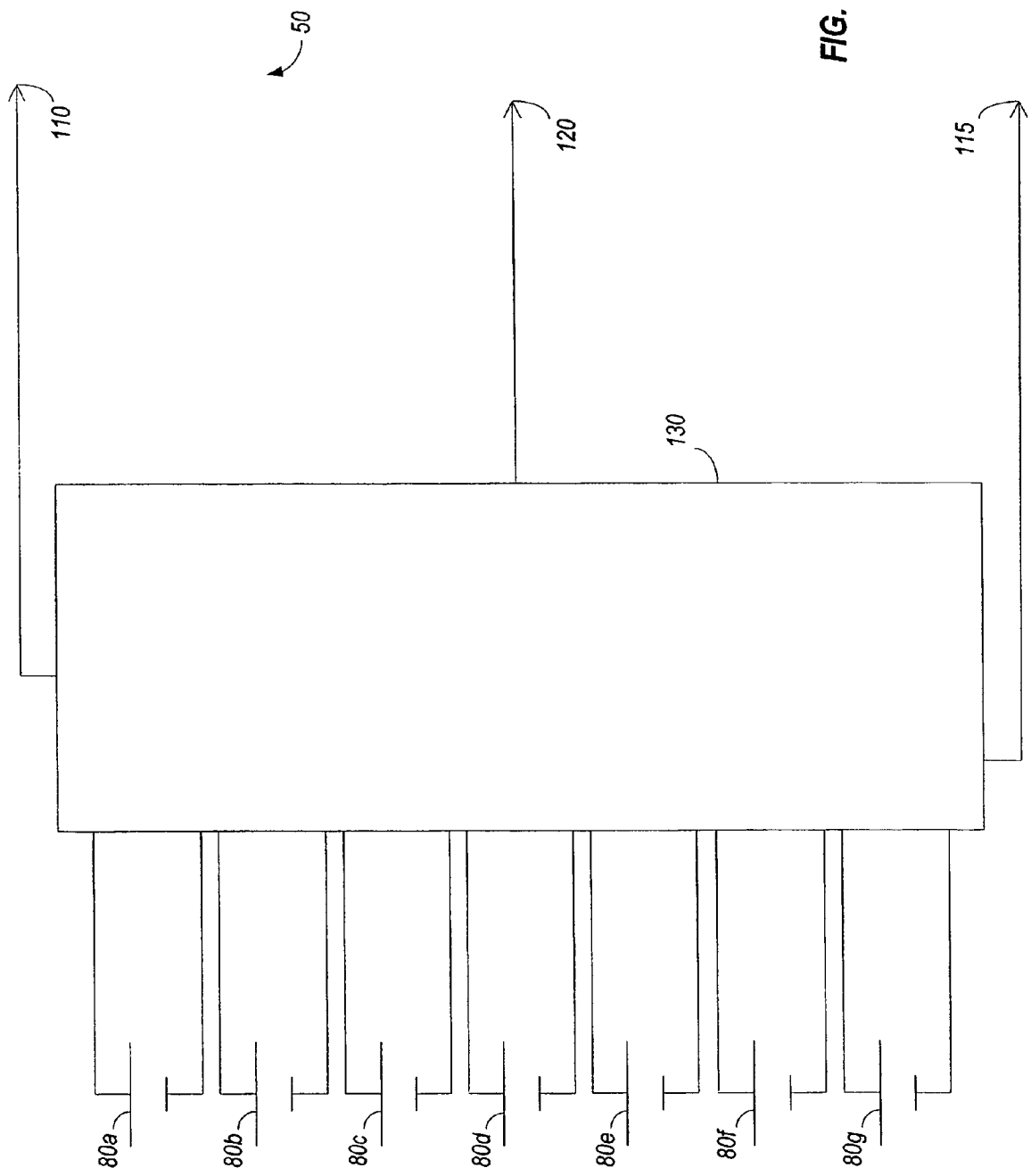

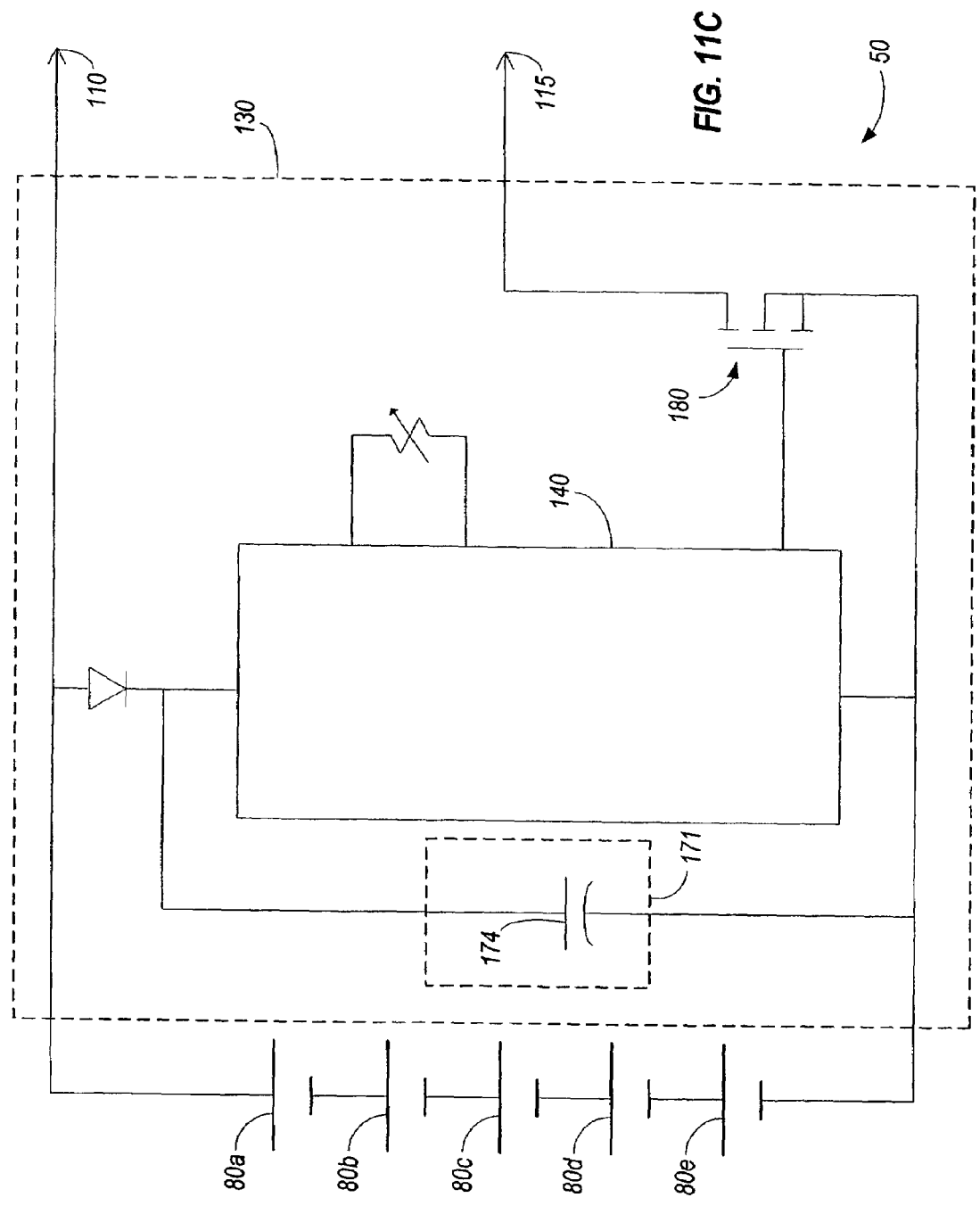

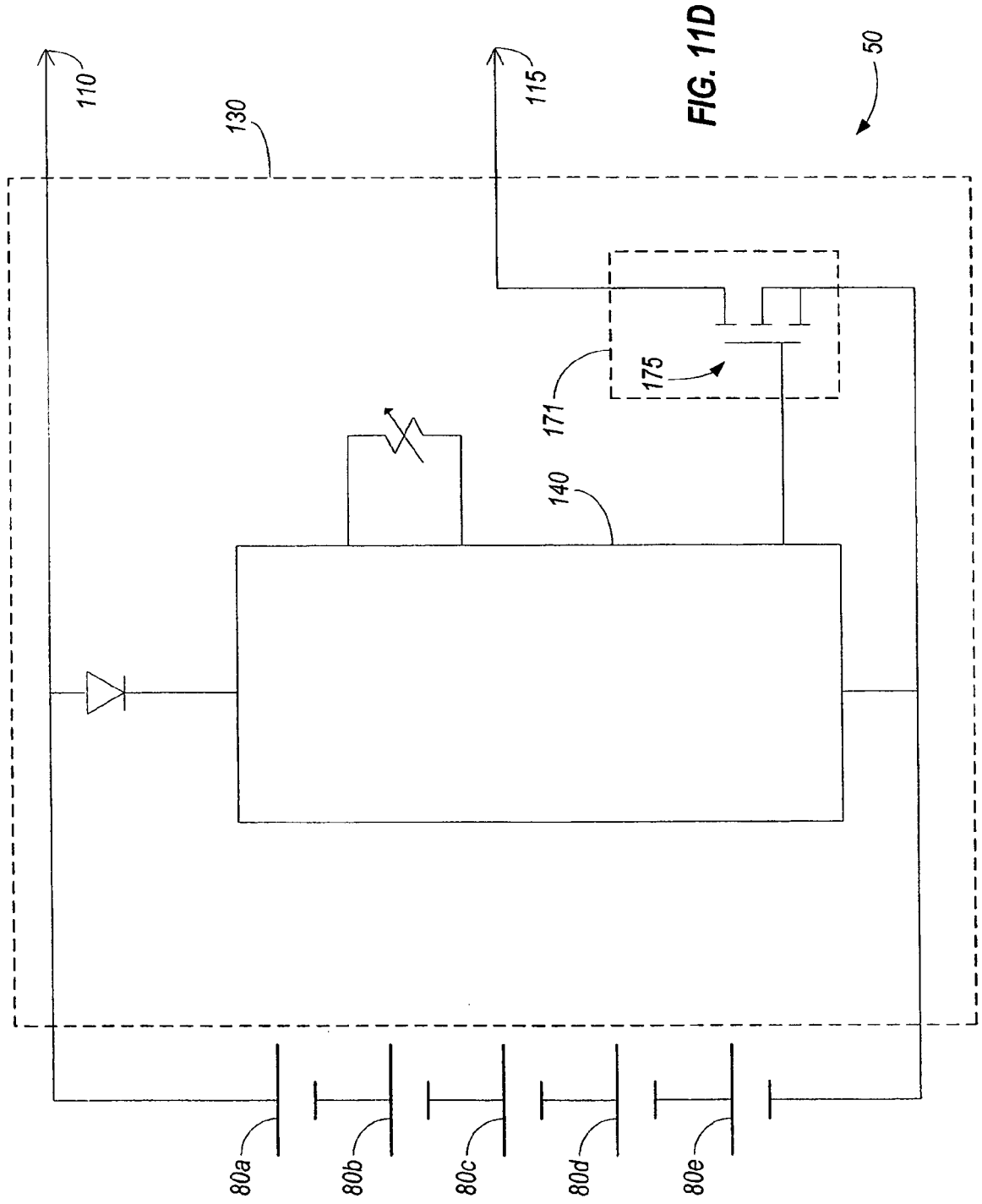

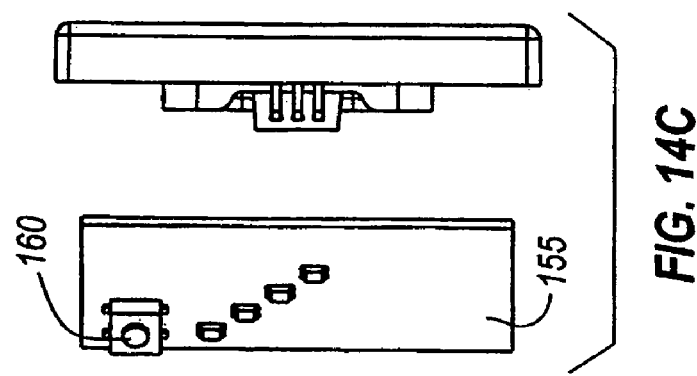
FIG. 14C
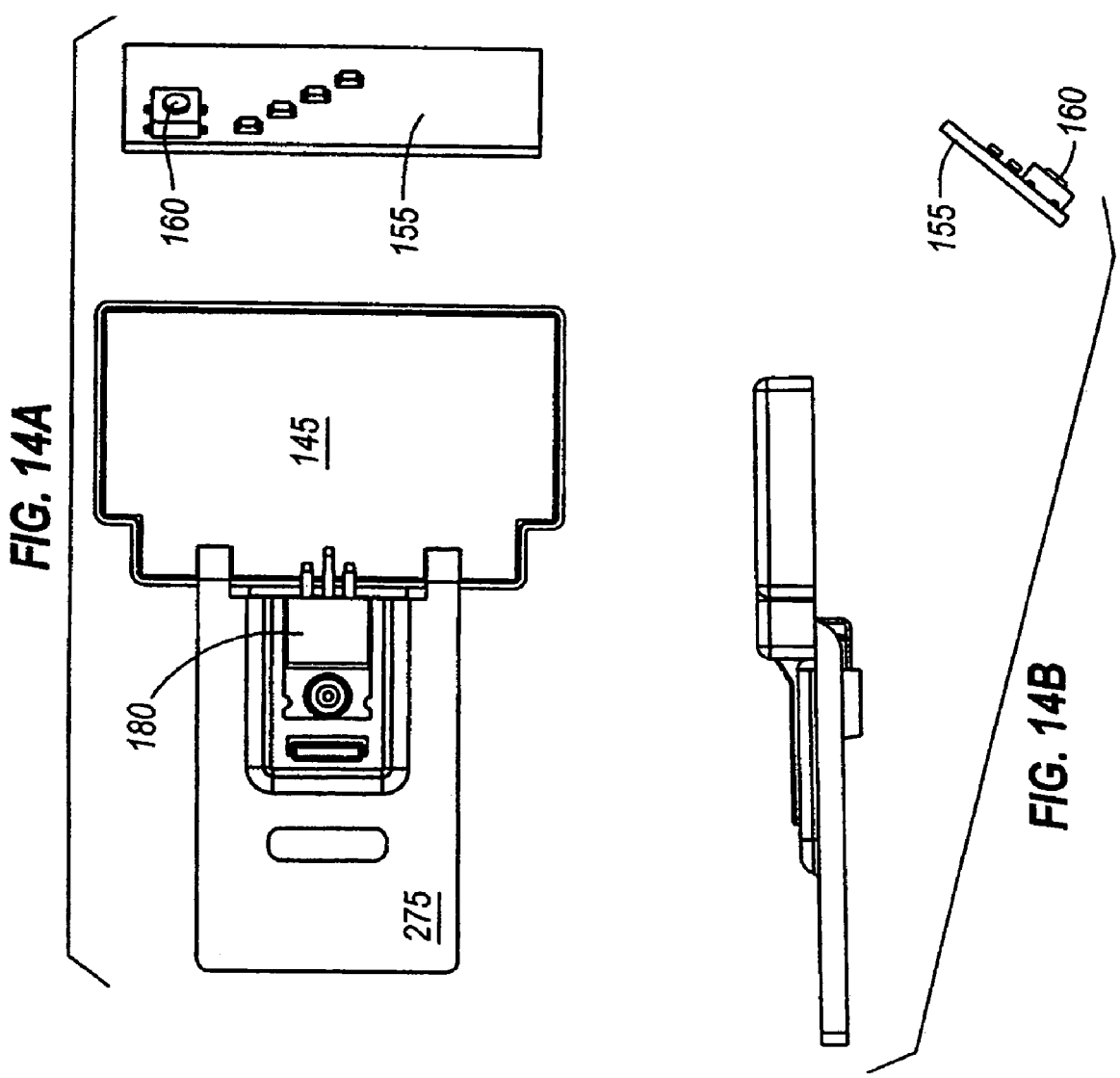
FIG. 14A
FIG. 14B

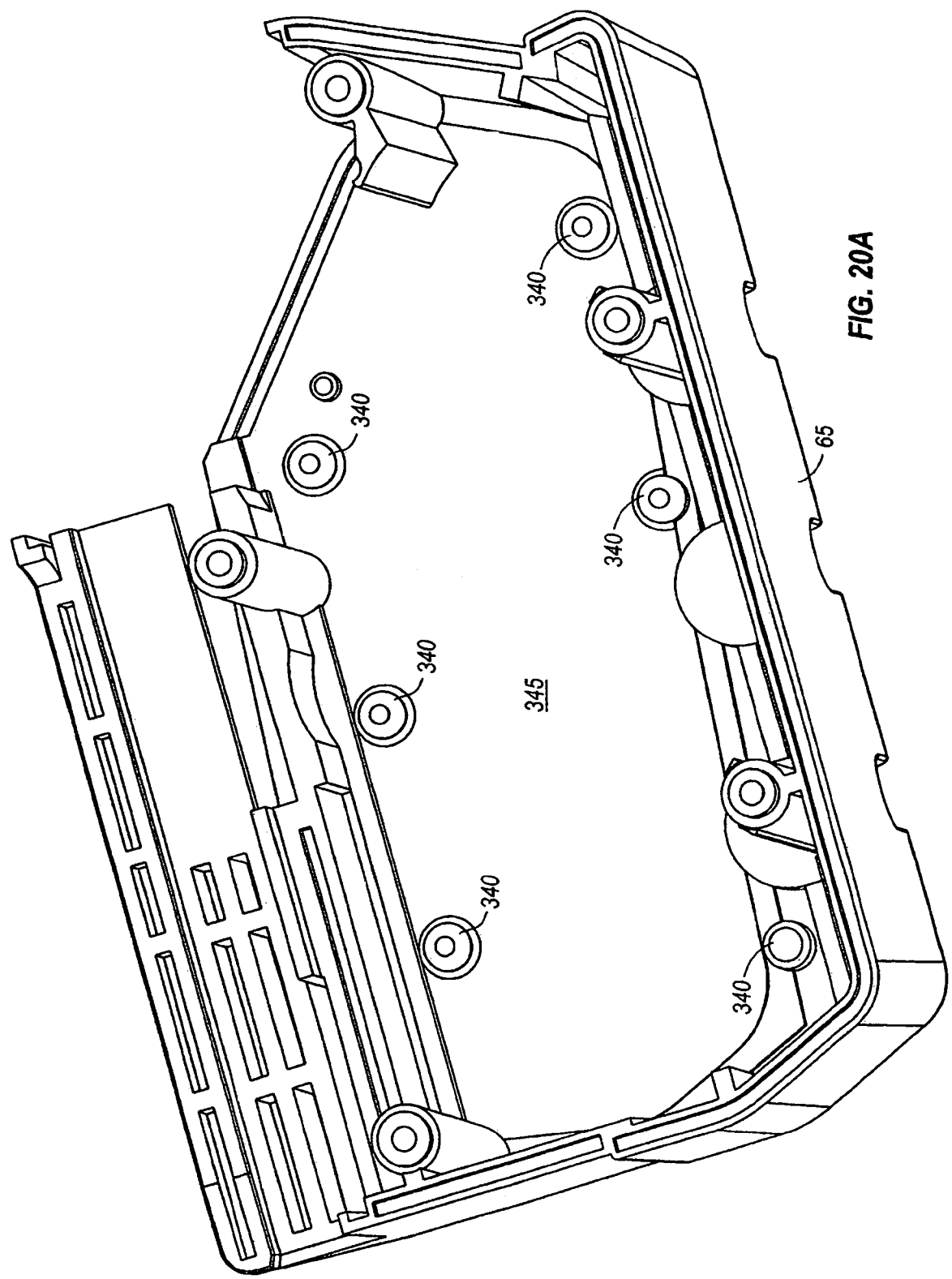

METHOD AND SYSTEM FOR PROTECTION OF A LITHIUM-BASED MULTICELL BATTERY PACK INCLUDING A HEAT SINK

RELATED APPLICATIONS

The present patent application is a divisional of prior filed co-pending U.S. patent application Ser. No. 10/720,027, filed on Nov. 20, 2003, which claims the benefit of prior filed co-pending U.S. provisional patent application Ser. No. 60/428,358, filed on Nov. 22, 2002; Ser. No. 60/428,450, filed on Nov. 22, 2002; Ser. No. 60/428,452, filed on Nov. 22, 2002; Ser. No. 60/440,692, filed Jan. 17, 2003; Ser. No. 60/440,693, filed on Jan. 17, 2003; Ser. No. 60/523,716, filed on Nov. 19, 2003; and Ser. No. 60/523,712, filed on Nov. 19, 2003, the entire contents of which are hereby incorporated by reference. The entire content of U.S. patent application Ser. No. 10/719,680 entitled "METHOD AND SYSTEM FOR BATTERY CHARGING" filed on Nov. 20, 2003 is also hereby incorporated by reference.

FIELD OF THE INVENTION

The present invention generally relates to a method and system for battery protection and, more particularly, to a method and system for power tool battery protection.

BACKGROUND OF THE INVENTION

Cordless power tools are typically powered by portable battery packs. These battery packs range in battery chemistry and nominal voltage and can be used to power numerous tools and electrical devices. Typically, the battery chemistry of a power tool battery is either Nickel-cadmium ("NiCd"), Nickel-Metal Hydride ("NiMH") or lead-acid. Such chemistries are known to be robust and durable.

SUMMARY OF THE INVENTION

Some battery chemistries (such as, for example, Lithium ("Li"), Lithium-ion ("Li-ion") and other Li-based chemistries) require precise charging schemes and charging operations with controlled discharge. Insufficient charging schemes and uncontrolled discharging schemes may produce excessive heat build-up, excessive overcharged conditions and/or excessive overdischarged conditions. These conditions and build-ups can cause irreversible damage to the batteries and can severely impact the battery's capacity. Various factors, such as, for example, excessive heat, can cause one or more cells within the battery pack to become imbalanced, that is, to have a present state of charge that is substantially lower than the remaining cells in the pack. Imbalanced cells can severely impact the performance of the battery pack (e.g., run-time and/or voltage output) and can shorten the life of the battery pack.

The present invention provides a system and method for battery protection. In one construction and in some aspects, the invention provides a system and method for monitoring the temperature of a battery. In another construction and in some aspects, the invention provides a system and method for transferring heat within a battery pack. In another construction and in some aspects, the invention provides a system and method for transferring heat within a battery pack via a phase change material. In a further construction and in some aspects, the invention provides a system and method for monitoring cell imbalance. In yet another construction and in some aspects, the invention provides a system and method for controlling the operation of an electrical device based on a battery's temperature and/or cell imbalance. In another construction and in some aspects, the invention provides a system and method for determining the present state of charge of the battery and indicating or displaying a battery's present state of charge. In yet another construction and in some aspects, the invention provides a system and method for interrupting discharge current based on battery temperature.

Independent features and independent advantages of the invention will become apparent to those skilled in the art upon review of the detailed description and drawings.

BRIEF DESCRIPTION OF THE DRAWINGS

FIG. 6B is another schematic view of a battery, such as one of the batteries shown in FIGS. 1–3.

FIG. 6D is yet another schematic view of a battery, such as one of the batteries shown in FIGS. 1–3.

FIG. 11C is still another schematic view of a battery, such as one of the batteries shown in FIGS. 1–3.

FIG. 11D is still another schematic view of a battery, such as one of the batteries shown in FIGS. 1–3.

FIGS. 14A–E includes views of portions of the battery shown in FIG. 13A.

FIGS. 20A–B are perspective cross-sectional views of a portion of a battery, such as one of the batteries shown in FIGS. 1–3, with portions removed.

Before any embodiments of the invention are explained in detail, it is to be understood that the invention is not limited in its application to the details of construction and the arrangement of components set forth in the following description or illustrated in the following drawings. The invention is capable of other constructions and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The terms "mounted," "connected," and "coupled" are used broadly and encompass both direct and indirect mounting, connecting and coupling. Further, "connected" and "coupled" are not restricted to physical or mechanical connections or couplings and can include electrical connections and couplings, whether direct or indirect.

DETAILED DESCRIPTION

Figure 1:
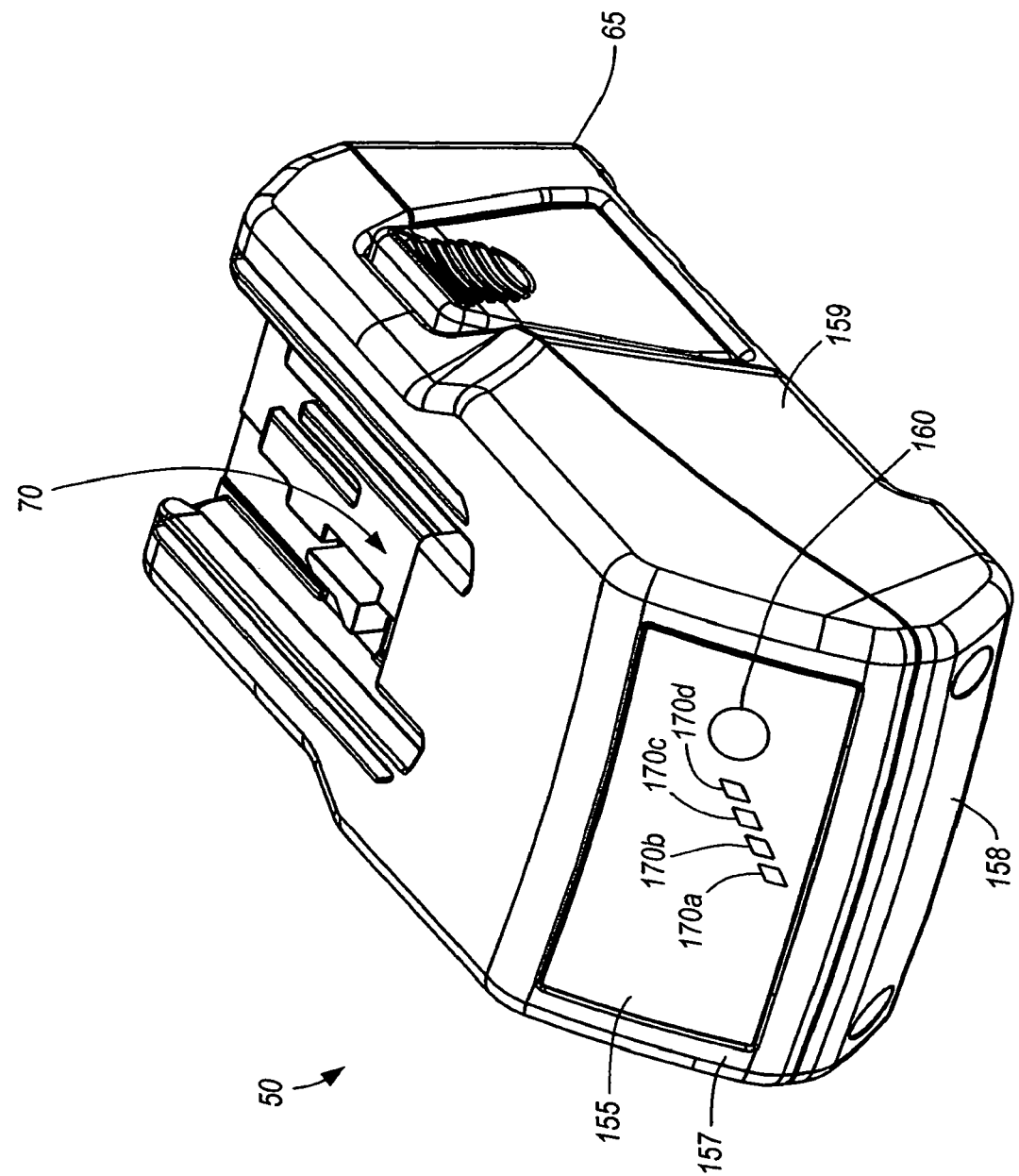
FIG. 1 is a perspective view of a battery.
Figure 2:
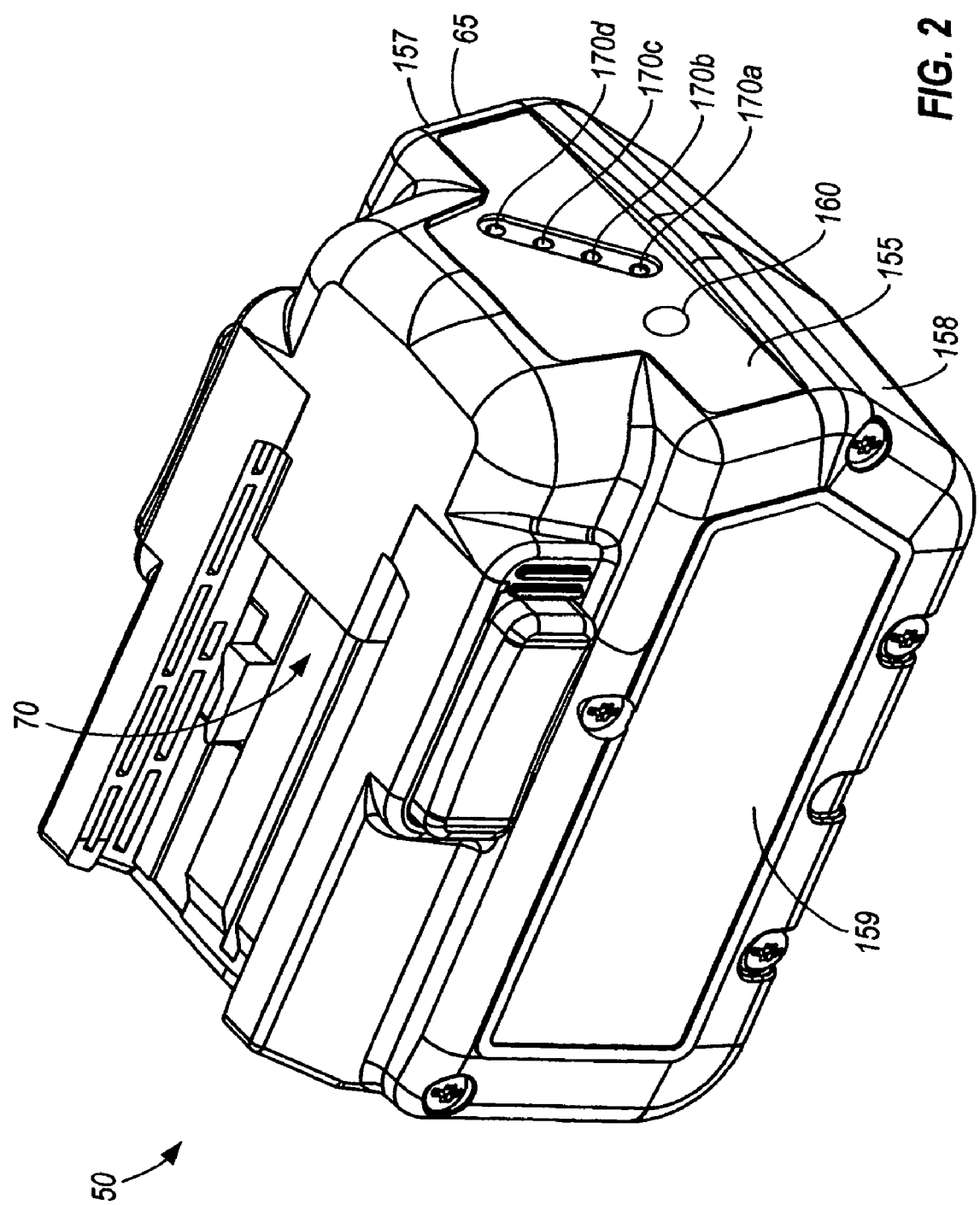
FIG. 2 is a perspective view of another battery.
Figure 3:
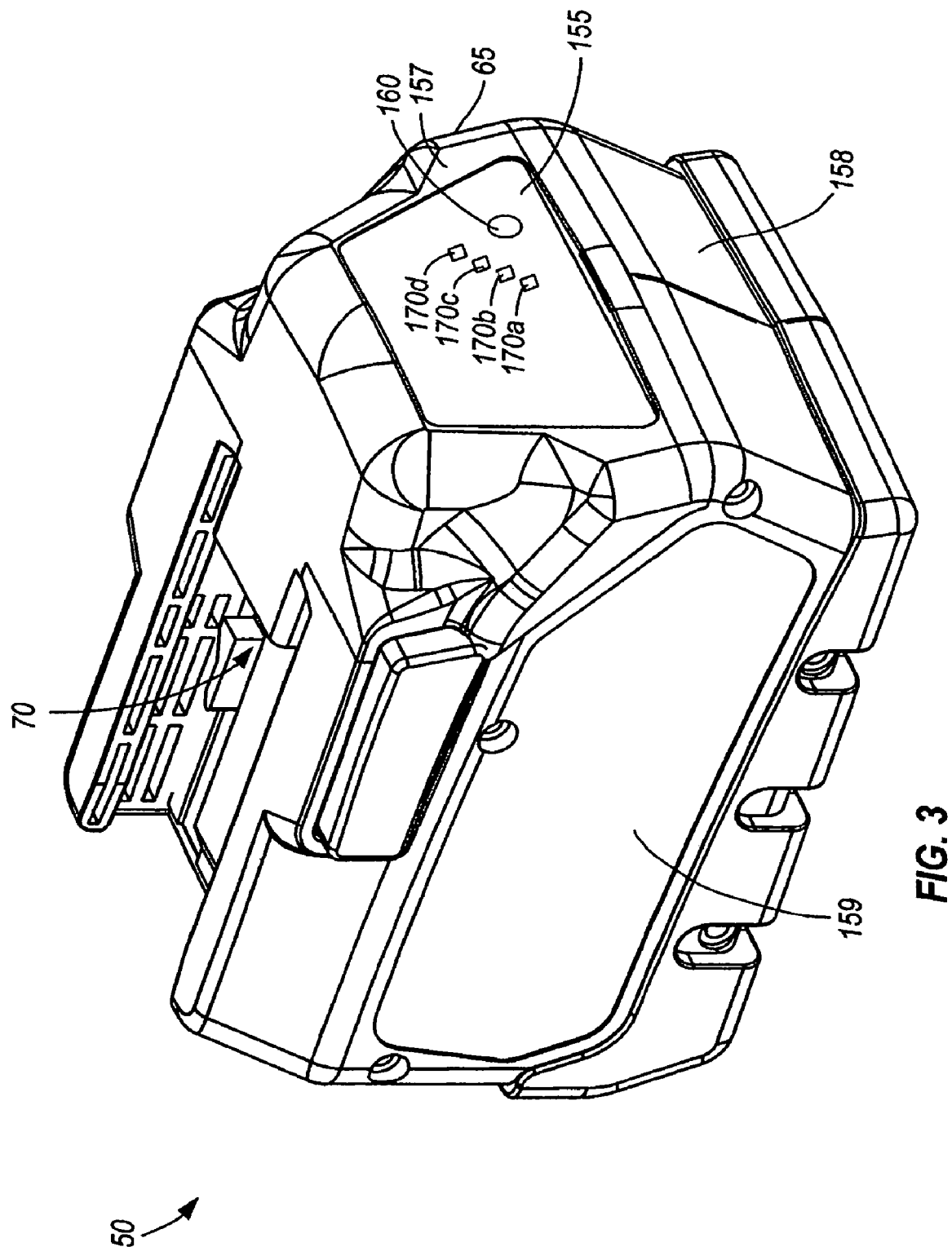
FIG. 3 is a perspective view of a further battery.
Figure 4:
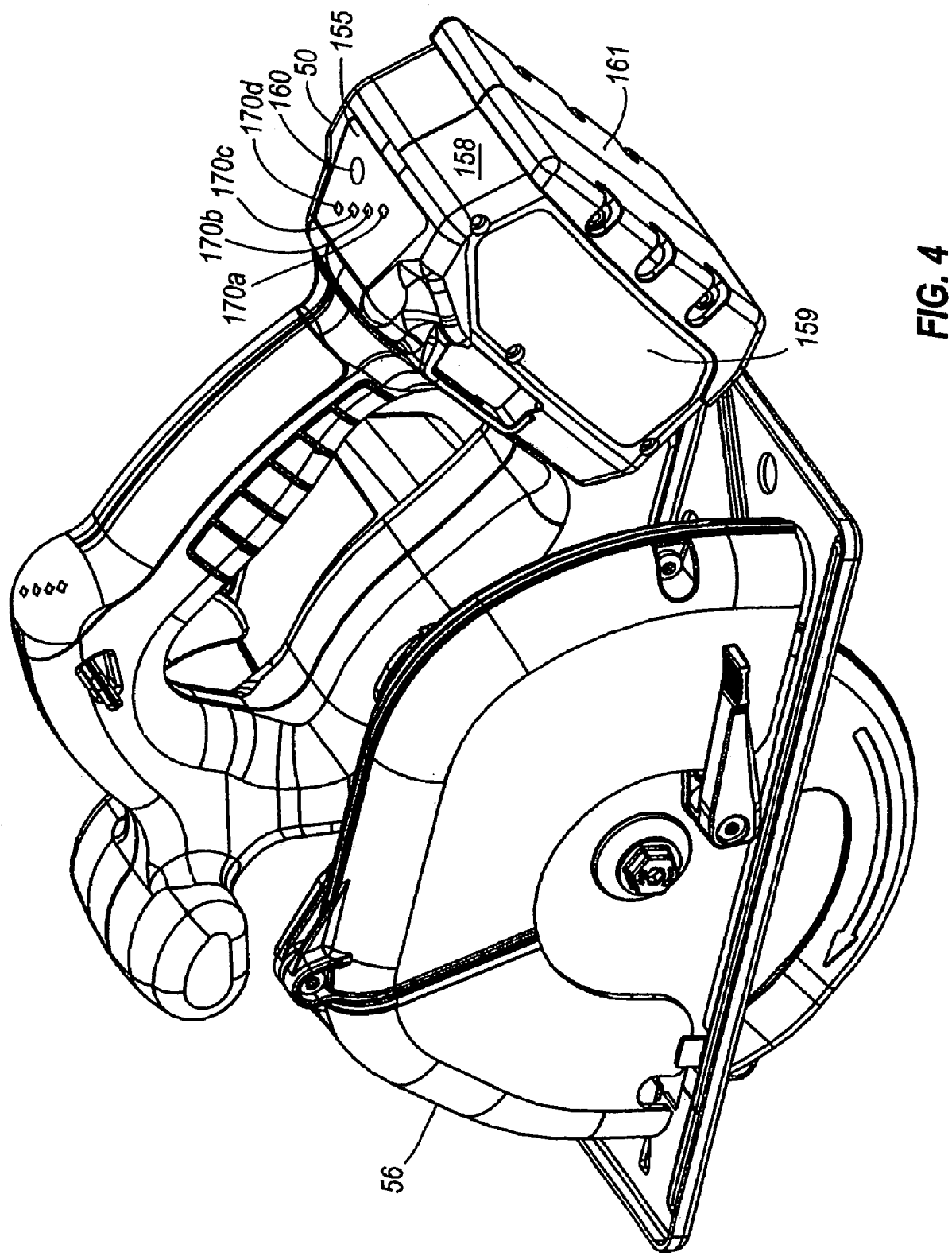
FIG. 4 is a perspective view of a battery, such as the battery shown in FIG. 3, in use with a first electrical device, such as a power tool.
Figure 5:
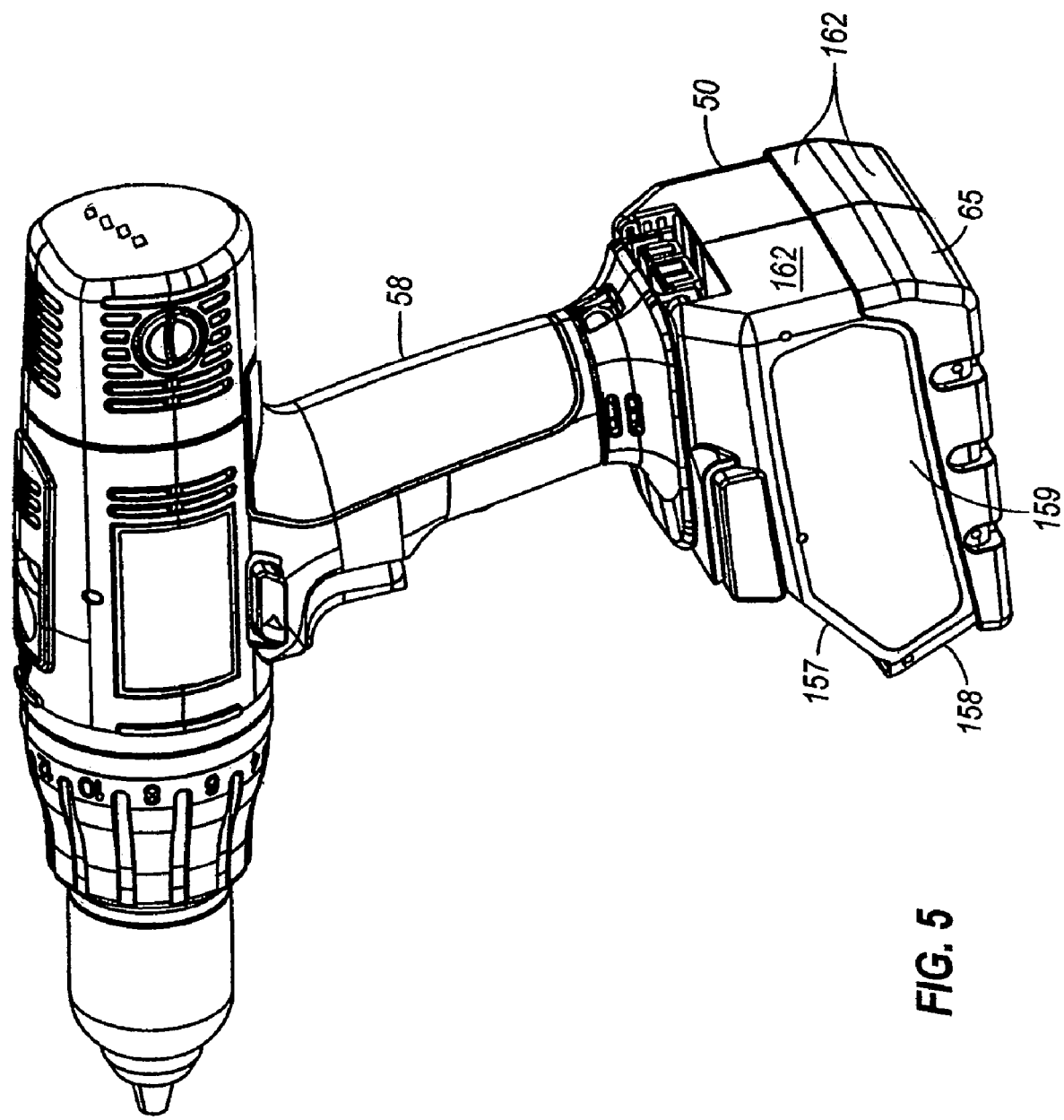
FIG. 5 is a perspective view of a battery, such as the battery shown in FIG. 3, in use with a second electrical device, such as a power tool.

A battery pack or battery 50 is illustrated in FIGS. 1–3. The battery 50 can be configured for transferring power to and receiving power from one or more electrical devices, such as, for example, a power tool 55 (shown in FIGS. 4–5), a battery charger 60 (shown in FIG. 24) and the like. As shown in the constructions illustrated in FIGS. 4 and 5, the battery 50 can transfer power to various power tools, such as a circular saw 56 and a driver drill 58, for example. In some constructions and in some aspects, the battery 50 can supply a high discharge current to electrical devices, such as, for example, a power tool 55, having high-current discharge rates. For example, the battery 50 can power a wide range of power tools 55 including a circular saw 56, a driver drill 58, and the like, as shown in FIGS. 4 and 5.

In some constructions and in some aspects, the battery 50 can have any battery chemistry such as, for example, lead-acid, Nickel-cadmium ("NiCd"), Nickel-Metal Hydride ("NiMH"), Lithium ("Li"), Lithium-ion ("Li-ion"), another Lithium-based chemistry or another rechargeable or non-rechargeable battery chemistry. In the illustrated constructions, the battery 50 can have a battery chemistry of Li, Li-ion or another Li-based chemistry and can supply an average discharge current that is equal to or greater than approximately 20 A. For example, in the illustrated construction, the battery 50 can have a chemistry of Lithium Cobalt ("Li—Co"), Lithium Manganese ("Li—Mn") Spinel, or Li—Mn Nickel.

In some constructions and in some aspects, the battery 50 can also have any nominal voltage. In some constructions, for example, the battery 50 can have a nominal voltage of approximately 9.6 V. In other constructions, for example, the battery 50 can have a nominal voltage up to approximately 50 V. In the some constructions, for example, the battery 50 can have a nominal voltage of approximately 21 V. In other constructions, for example, the battery 50 can have a nominal voltage of approximately 28 V.

The battery 50 also includes a housing 65 which can provide terminal supports 70. The battery 50 can further include one or more battery terminals (not shown in FIGS. 1–5) supported by the terminal supports 70 and connectable to an electrical device, such as the power tool 55, the battery charger 60, and the like.

In some constructions and in some aspects, the housing 65 can substantially enclose a supporting circuit electrically connected to one or more battery terminals. In some constructions, the circuit may include a microcontroller or microprocessor. In some constructions, the circuit can communicate with the electrical devices, such as a power tool 55 (e.g., a circular saw 56, a driver drill 58, and the like), a battery charger 60, and the like, and can provide information to the devices regarding one or more battery characteristics or conditions, such as, for example, the nominal voltage of the battery 50, the temperature of the battery 50, the chemistry of the battery 50 and similar characteristics, as discussed below.

The battery 50 is schematically illustrated in FIGS. 6A–D, 7–10, 11A–D and 12A–C and portions of the battery 50 are shown in FIGS. 13–16 and 20A–B. As illustrated, the battery 50 can include one or more battery cells 80 each having a chemistry and a nominal voltage. Also, each battery cell 80 can include a positive end 90 and a negative end 95. In some constructions such as, for example, the constructions illustrated in FIGS. 6A and C, the battery 50 can have a battery chemistry of Li-ion, a nominal voltage of approximately 18 V or approximately 21 V (depending on the type of battery cell, for example), and can include five battery cells 80a, 80b, 80c, 80d and 80e. In other constructions, such as for example the constructions illustrated in FIGS. 6B and D, the battery 50 can have a battery chemistry of Li-ion, a nominal voltage of approximately 24 V, approximately 25 V or approximately 28 V (depending on the type of battery cell, for example) and can include seven battery cells 80a, 80b, 80c, 80d, 80e, 80f and 80g. In further constructions, the battery 50 can have more or fewer battery cells 80 than shown and described. In an exemplary construction, each battery cell 80 has a chemistry of Li-ion, and each battery cell 80 has substantially the same nominal voltage, such as, for example, approximately 3.6 V, approximately 4 V or approximately 4.2 V.

Figure 6A:
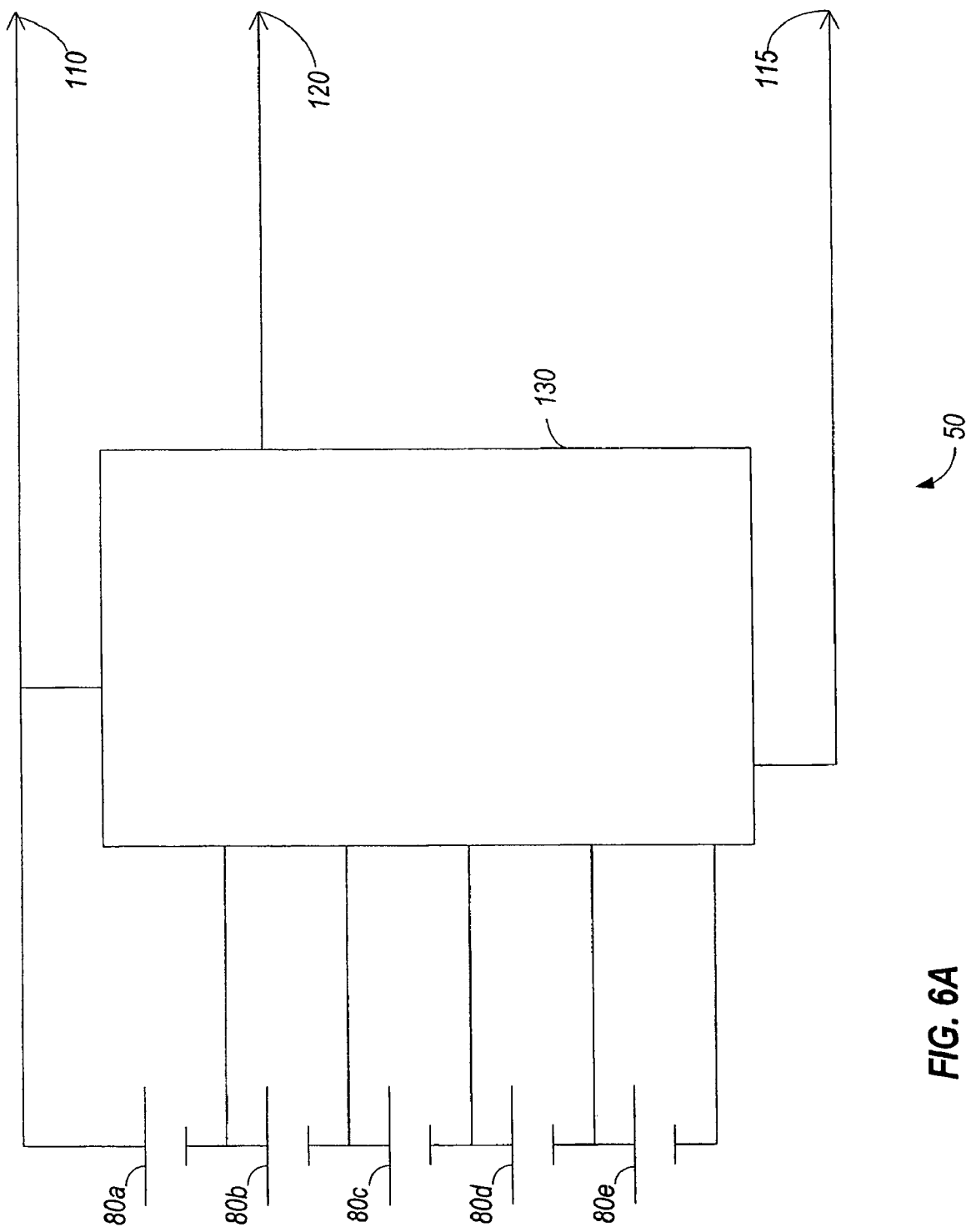
FIG. 6A is a schematic view of a battery, such as one of the batteries shown in FIGS. 1–3.
Figure 6C:
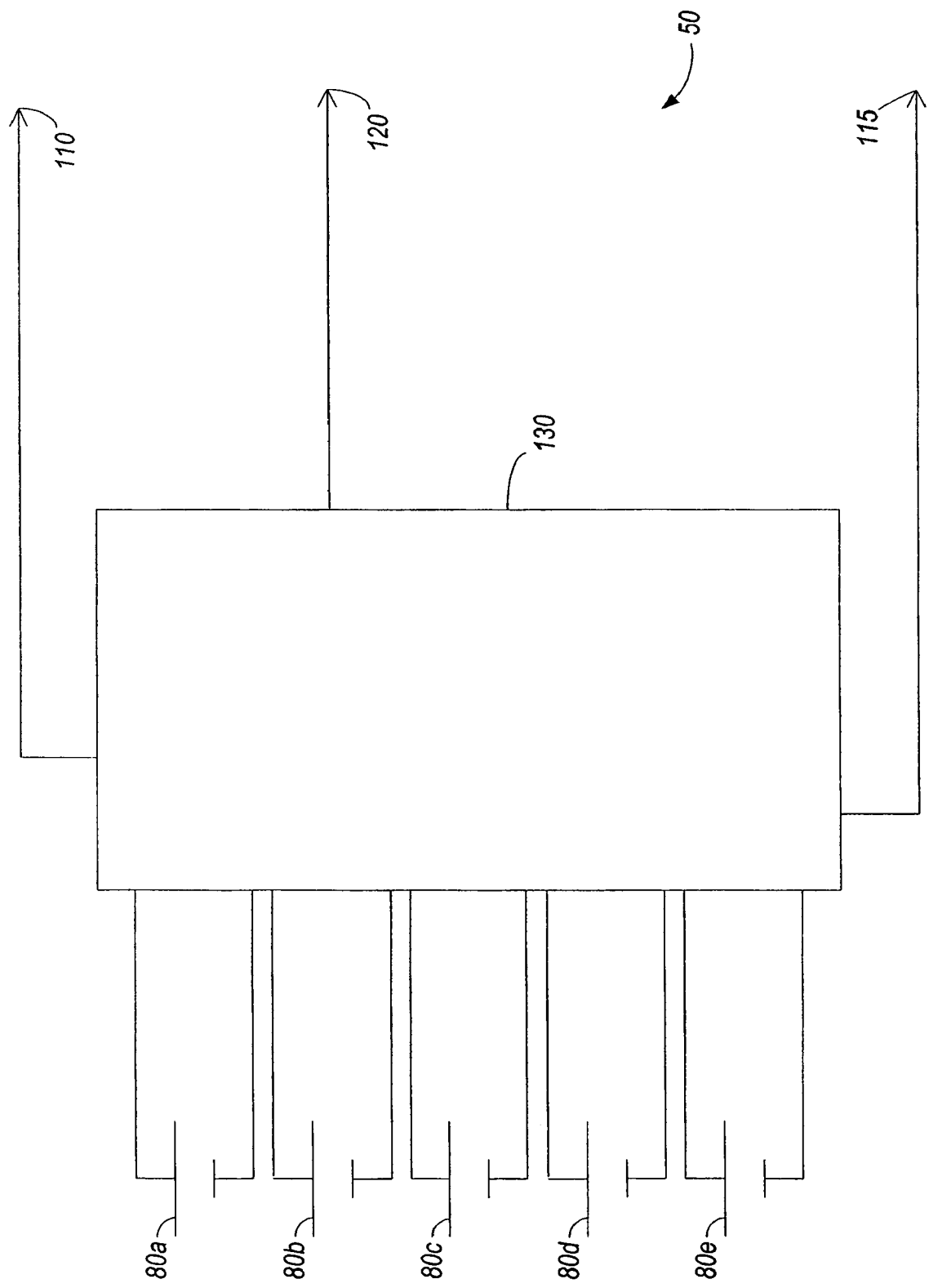
FIG. 6C is a further schematic view of a battery, such as one of the batteries shown in FIGS. 1–3.

In some constructions, two or more battery cells 80 can be arranged in series with the positive end 90 of one battery cell 80 electrically connected to the negative end 95 of another battery cell 80, as shown in FIGS. 6A and C. The battery cells 80 can be electrically connected by a conductive link or strap 100. In other constructions, the battery cells 80 can be arranged in another manner such as, for example, in parallel with the positive ends 90 of the battery cells 80a–e electrically connected to each other and the negative ends 95 of the battery cells 80a–e electrically connected to each other or in a combination of series and parallel. As shown in FIGS. 6B and D, the battery cells 80 can be individually coupled to a circuit 130. In some constructions, the circuit 130 can configure the battery cells 80 into various arrangements such as, for example, in a parallel arrangement, a serial arrangement (such as the series of battery cells 80 illustrated in FIGS. 6A and C), an individual arrangement (e.g., drawing current from or supplying current to a single battery cell 80), a partial parallel arrangement (e.g., arranging a few of the battery cells 80 into a serial arrangement), a partial serial arrangement (e.g., arranging a few of the battery cells into a parallel arrangement), or a combination of the serial, partial serial, parallel, and partial parallel arrangements. In some constructions, a circuit 130 included in the battery 50 can establish the arrangements permanently via software (e.g., a program executed by a processor, such as microprocessor 140 discussed below) or hardware. In some constructions, the circuit 130 can modify the arrangements via software or hardware (e.g., one or more switches, logic components, and the like)

The battery 50 can also include a terminal block 105 which may include the one or more battery terminals supported by the terminal supports 70 (shown in FIG. 1). In the illustrated construction, the terminal block 105 can include a positive terminal 110, a negative terminal 115, and a sense terminal 120. The positive terminal 110 can be electrically connected to the positive end 90 of a first battery cell 80a, and the negative terminal 115 can be electrically connected to the negative end 95 of a second battery cell 80e (or battery cell 80g). In the illustrated constructions, the first battery cell 80a is the first cell of the battery cells 80 to be serially linked, and the second battery cell 80e or 80g is the last cell of the battery cells 80a–e or 80a–g to be serially linked, respectively.

As mentioned previously, the battery 50 can include a circuit 130. The circuit 130 can be electrically connected to one or more battery cells 80, and can be electrically connected to one or more battery terminals of the terminal block 105. In some constructions, the circuit 130 can include components to enhance the performance of the battery 50. In some constructions, the circuit 130 can include components to monitor battery characteristics, to provide voltage detection, to store battery characteristics, to display battery characteristics, to inform a user of certain battery characteristics, to suspend current within the battery 50, to detect temperature of the battery 50, battery cells 80, and the like, to transfer heat from and/or within the battery 50. In some constructions and in some aspects, the circuit 130 includes a voltage detection circuit, a boosting circuit, a state of charge indicator, and the like, as discussed below. In some constructions, the circuit 130 can be coupled to a print circuit board 145, discussed below. In other constructions, the circuit 130 can be coupled to a flexible circuit 145. In some constructions, the flexible circuit 145 can wrap around one or more cells 80 or wrap around the interior of the housing 65.

In some constructions and in some aspects, the circuit 130 can also include a microprocessor 140. The microprocessor 140 can store battery characteristics or battery identification information, such as, for example, battery chemistry, nominal voltage, and the like. In other constructions and in other aspects, the microprocessor 140 can store additional battery characteristics, such as, for example, battery temperature, ambient temperature, number of times the battery 50 has been charged, the number of times the battery has been discharged, various monitoring thresholds, various discharging thresholds, various charging thresholds, and the like, and can store information about the microprocessor 140 itself and its operation, such as, for example, frequency and/or number of times battery characteristics have been calculated, number of times the microprocessor 140 disabled the battery 50, and the like. The microprocessor 140 can also control other electrical components of the circuit 130 included in the battery 50, as discussed below.

In the illustrated construction and in some aspects, the microprocessor 140 can be electrically connected to a printed circuit board ("PCB") 145. In the illustrate construction, the PCB 145 can provide the necessary electrical connections between the microprocessor 140 and the terminals 110, 115 and 120, the battery cells 80a–g and other electrical components included in the battery 50, as discussed below. In other constructions, the PCB 145 may include additional electrical circuitry and/or components, such as, for example, additional microprocessors, transistors, diodes, current-limiting components, capacitors, etc.

In some constructions and in some aspects, the circuit 130 also can include a temperature-sensing device, such as, for example, a thermistor 150 or a thermostat (not shown). The temperature-sensing device can sense the temperature of one or more battery cells 80a–g included in the battery 50, can sense the temperature of battery 50 as a whole, or can sense ambient temperature and the like. In some constructions, the resistance value of the thermistor 150 can be indicative of the temperature of the one or more battery cells 80a–g being sensed and can change as the temperature of the one or more battery cells 80a–g changes. In some constructions, the microprocessor 140 can determine the temperature of the one or more battery cells 80a–g based on the resistance value of the thermistor 150. The microprocessor 140 can also monitor the change in temperature verses time by monitoring the thermistor 150 over time. The microprocessor 140 can also send the temperature information to an electrical device, such as the power tool 55 and/or the battery charger 60, and/or use the temperature information to initiate certain functions or to control other components within the battery 50, as discussed below. As shown in the illustrated construction, the thermistor 150 is mounted on the PCB 145.

In some constructions and in some aspects, the circuit 130 can also include a present state of charge indicator, such as, for example, a fuel gauge 155 shown in the illustrated constructions. The fuel gauge 155 can include a light-emitting diode ("LED") display that indicates the present state of charge of the battery 50. In other constructions, the fuel gauge 155 can include a matrix display. As shown in FIGS. 1–3, the fuel gauge 155 can be located on an upper face 157 of the battery housing 65. In other constructions, the fuel gauge 155 can be located anywhere on the housing 65 such as, for example, on a lower face 158 of the housing 65, on one of the sides 159 of the housing 65, on the bottom face 161 of the housing, on the rear face 162 of the housing 65, on two or more of the faces or sides of the housing 65, and the like.

In some constructions, the gauge 155 can be enabled via a push-button switch 160 located on the housing 65 of the battery 50. In other constructions, the gauge can be activated automatically by a predefined time period as counted by a timer, by a predefined battery characteristic, and the like. In the illustrated construction, the gauge 155 can be electrically connected to the microprocessor 140 via a ribbon cable 165 and can include four LEDs 170a, 170b, 170c and 170d providing the LED display.

In some constructions, the microprocessor 140 can determine the present state of charge of the battery 50 (i.e., how much charge is left in the battery 50) when the push-button 160 is depressed and outputs the charge level to the fuel gauge 155. For example, if the present state of charge of the battery 50 is approximately 100%, all of the LEDs 170a, 170b, 170c and 170d will be turned on by the microprocessor 140. If the present state of charge of the battery 50 is approximately 50%, only two of the LEDs, such as, for example, LEDs 170a and 170b, will be turned on. If the present state of charge of the battery 50 is approximately 25%, only one of the LEDs, such as, for example, LED 170a, will be turned on.

In some constructions, the output can be displayed on the fuel gauge 155 for approximately a predefined time period (i.e., a "displaying time period") after the push-button 160 is initially depressed. In some constructions, the microprocessor 140 can disable the fuel gauge 155 or output a zero present state of charge output if the temperature of one or more battery cells 80a–g exceed a predetermined threshold. In some constructions, the microprocessor 140 can disable the fuel gauge 155 or output a zero present state of charge output when an abnormal battery characteristic such as, for example, a high battery temperature, is detected even if the battery 50 has a relatively high charge level remaining. In some constructions, the microprocessor 140 can disable the fuel gauge 155 or output a zero present state of charge output if the present state of charge of the battery 50 or the present state of charge of one or more cells 80a–g fall below a predetermined threshold. In some constructions, the microprocessor 140 can disable the fuel gauge 155 or output a zero present state of charge output approximately after a predefined time period (i.e., a "cut-off time period") regardless if the push-button 160 remains depressed or not. In some constructions, the cut-off time period can be substantially equal to the displaying time period, and, in other constructions, the cut-off time period can be greater than the displaying time period.

In some constructions, the microprocessor 140 does not enable the fuel gauge 155 when the push-button 160 is depressed during time periods when the battery 50 is active (e.g., during charging and/or discharging). Present battery state of charge information can be suppressed during these time periods to avoid erroneous state of charge readings. In these constructions, the microprocessor 140 may only provide present state of charge information in response to the depressed push-button 160 when the current through the battery 50 (e.g., charging current, discharging current, parasitic current, etc.) is below a predefined threshold.

In some constructions, the microprocessor 140 can enable the fuel gauge 155 whether or not the push-button 160 is depressed during time periods when the battery 50 is active (e.g., during charging and/or discharging). In one construction for example, the fuel gauge 155 can be operational during charging. In this construction, the microprocessor 140 can automatically enable the fuel gauge 155 to display the current state of charge of the battery 50 continuously, periodically (e.g., after certain predetermined time intervals or during periods of low current draw/supply), in response to certain battery characteristics (e.g., when the current state of charge reaches certain defined thresholds, such as, every 5% increase in state of charge), or in response to certain stages, modes, or changes in the charge cycle. In other constructions, the microprocessor 140 may enable the fuel gauge 155 in response to the depression of the push-button 160 when the battery 50 is active.

In some constructions and in some aspects, the fuel gauge 155 can be enabled via a touch pad, a switch, or the like. In other constructions, the battery 50 can include another push-button or switch (not shown) for enabling and disabling an automatic displaying mode. In these constructions, a user can select whether to have the circuit 130 operate in an automatic displaying mode or operate in a manual displaying mode. The automatic displaying mode can include the fuel gauge 155 displaying the current state of charge of the battery 50 without user activation. For example, in the automatic displaying mode, the fuel gauge 155 can display the current state of charge of the battery 50 periodically (e.g., after certain predetermined time intervals), in response to certain battery characteristics (e.g., when the current state of charge reaches certain defined thresholds, such as, every 5% increase or decrease in state of charge), or the like. The manual displaying mode can include the fuel gauge 155 displaying the current state of charge in response to user activation such as, for example, the depression of the push-button 160. In some constructions, the push-button 160 can be disabled when the circuit 130 is operating in the automatic displaying mode. In other constructions, the push-button 160 can still enable the fuel gauge 155 even when the circuit 130 is operating in the automatic displaying mode. In further constructions, the automatic displaying mode can be enabled and disabled via the push-button 160, a control signal from an electrical device such as, for example, a power tool 55 or battery charger 60, or the like.

In some constructions, the circuit 130 can include a boosting circuit 171. The boosting circuit 171 can providing additional power for components included in the circuit 130 during periods of low battery voltage, as discussed below. For example, the microprocessor 140 may need a voltage source of approximately 3 V or approximately 5 V in order to operate. If the present state of charge of the battery 50 falls below about 5 V or about 3 V, then the microprocessor 140 may not receive enough power to operate and control the remainder of the components included in the circuit 130. In other constructions, the boosting circuit 171 can "boost" a lower input voltage into a higher output voltage, as discussed below.

Various constructions of the boosting circuit 171 are illustrated in FIGS. 11A–F. In one construction such as, for example, the construction shown in FIG. 11A, the boosting circuit 171a can include a power source or power component such as, for example, another battery cell 172. In some constructions, the battery cell 172 can be different in chemistry, nominal voltage and the like than the battery cells 80 connected in series. For example, the battery cell 172 can be a 1.2 V cell of Li-ion.

In some constructions, the boosting circuit 171a may only supply power to the remainder of the circuit 130 (such as, for example, the microprocessor 140) when the combined present state of charge of the battery cells 80 drops below a threshold. In some constructions, the boosting circuit 171a may only supply power to the remainder of the circuit 130 when the temperature of the battery cells 80 drops below a low temperature threshold and when the combined present state of charge of the battery cells 80 drops below a low voltage threshold. In other constructions, the boosting circuit 171a may only supply power to the remainder of the circuit 130 during periods of operation in low temperature conditions (e.g., the pack temperature is below a low temperature threshold, or the ambient temperature is below a low temperature threshold). In these constructions, the boosting circuit 171a may only supply power in order to prevent the circuit 130 (e.g., the microprocessor 140) from experiencing a "brown-out" condition (e.g., an insufficient supply of voltage for a period of time). A brown-out condition may be caused by battery voltage fluctuations which can be more evident or pronounced during low operating temperatures (e.g., either pack temperature or ambient temperature).

Figure 11A:
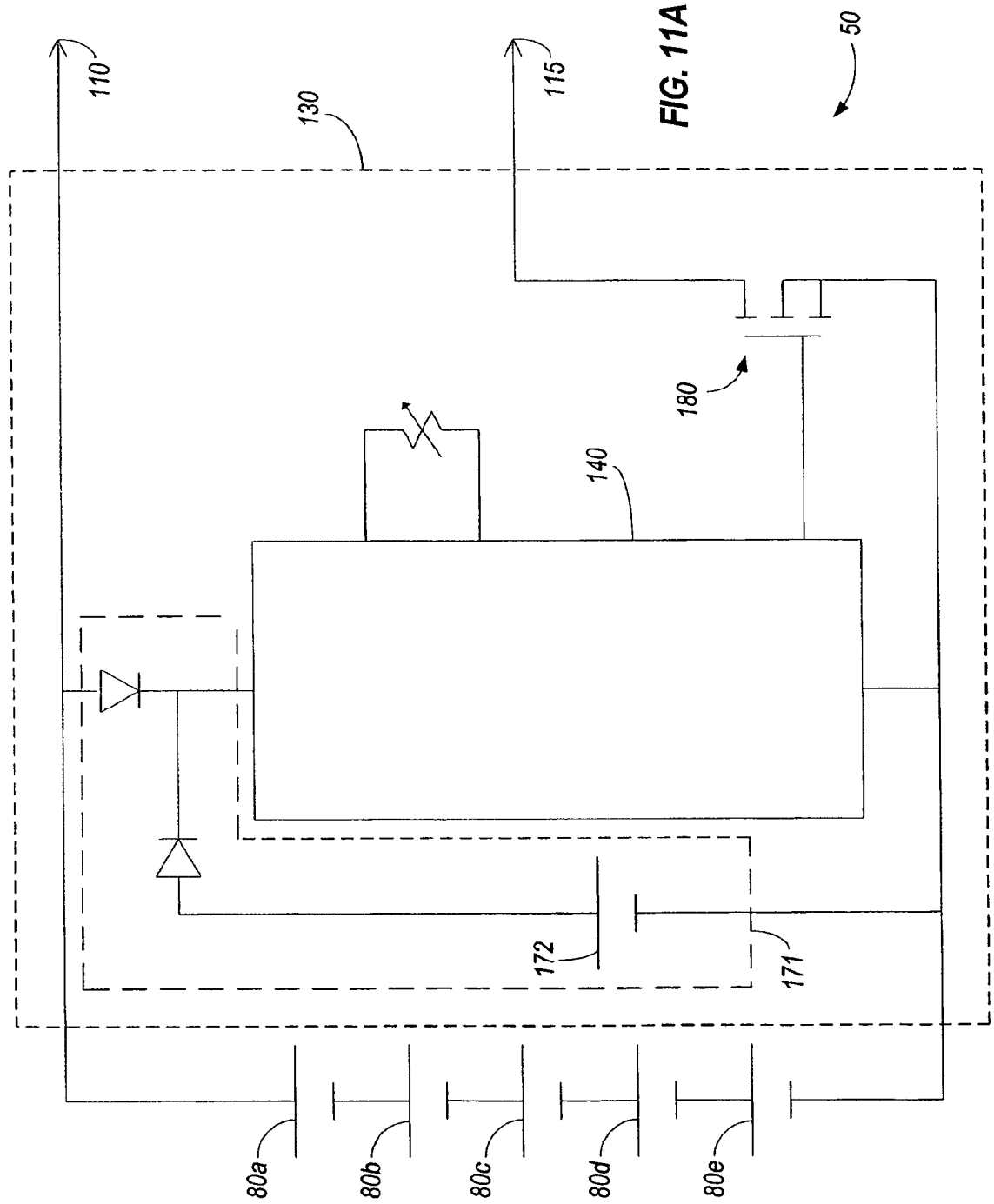
FIG. 11A is still another schematic view of a battery, such as one of the batteries shown in FIGS. 1–3.
Figure 11B:
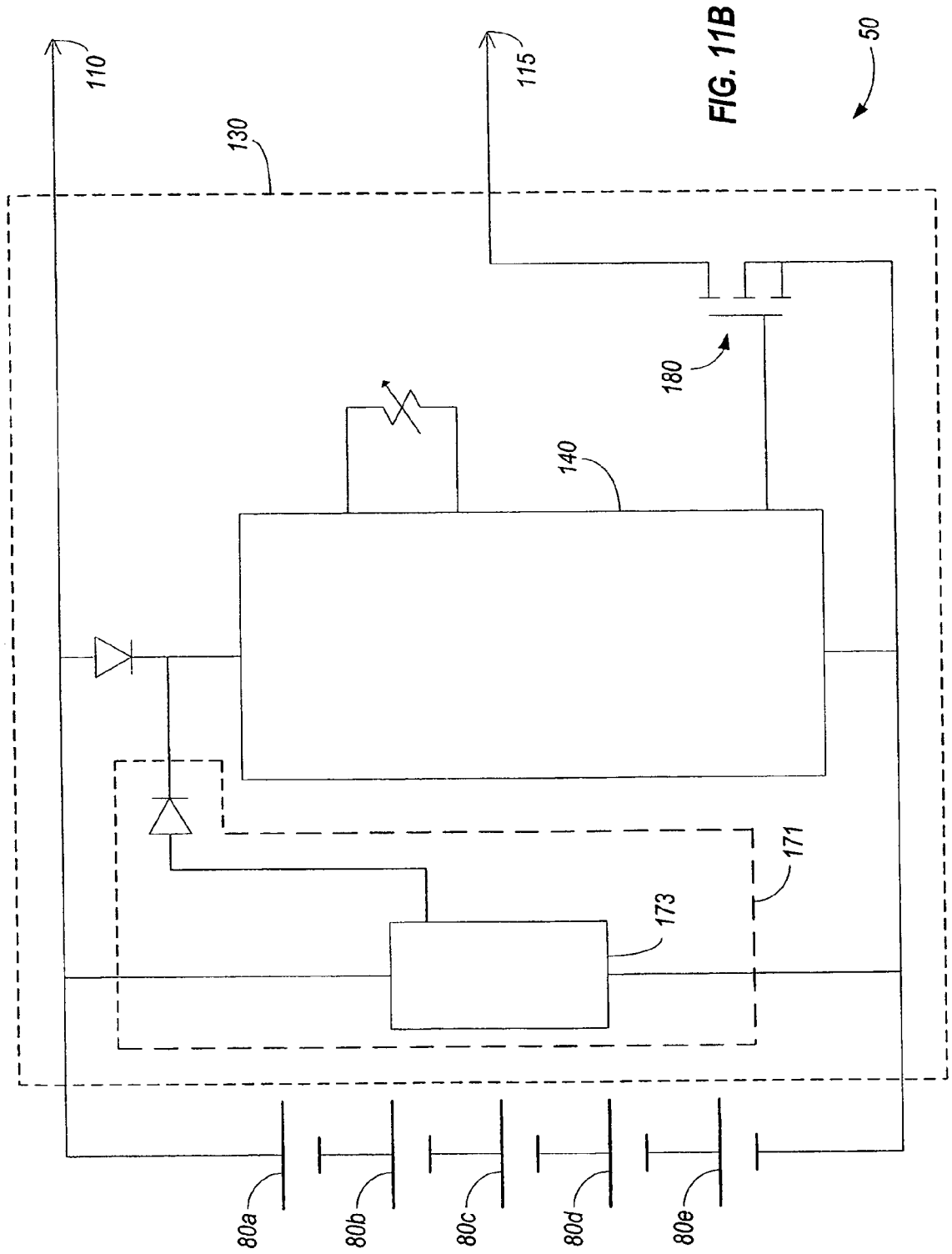
FIG. 11B is still another schematic view of a battery, such as one of the batteries shown in FIGS. 1–3.

In another construction such as, for example, the construction illustrated in FIG. 11B, the boosting circuit 171b can include a boost mechanism 173 such as, for example, an inductive "flyback" type converter, a switched capacitor converter, and the like. Similar to boosting circuit 171a, the boosting circuit 171b may supply power to the remainder of the circuit 130 in response to various battery conditions.

In yet another construction such as, for example, the construction illustrated in FIG. 11C, the boosting circuit 171 can be a capacitive boosting circuit 171c. As shown, the capacitive boosting circuit 171c can include a capacitor 174. During operation, the capacitor 174 can be charged either by the discharge circuit from the battery cells 80 or by a signal from the microprocessor 140 or additional circuitry. Similar to boosting circuit 171a, the boosting circuit 171c may supply power to the remainder of the circuit 130 in response to various battery conditions.

In a further construction such as, for example, the construction illustrated in FIG. 11D, the boosting circuit 171d can include a transistor or switch 175. In some constructions, the switch 175 can be a power field effect transistor ("FET") 180, as discussed below. In an exemplary implementation, the switch 175 is a FET. In some constructions, the boosting 171d can operate by interrupting the discharge current from a certain period of time to allow the present state of charge of the battery 50 to recover. For example, the battery cells 80 may experience large voltage fluctuations due to low cell temperature, low ambient temperature, high discharge current (e.g., large load), and the like. By interrupting the discharge current for a period of time, the large fluctuations in state of charge may reduce, and the voltage of the battery cells 80 may rise. Activating and deactivating the switch 175 may prevent the large fluctuations from creating a brown-out condition for the circuit 130. Similar to the boosting circuit 171a, the boosting circuit 171d may be activated in response to certain battery conditions such as, for example, low temperature, low battery state of charge, and the like. In some constructions, the switch 175 can be used in combination with the capacitor 174 of circuit 171c to recharge the capacitor 174.

In some constructions, the switch 175 can be activated (e.g., repetitively switched) at a set frequency or duty cycle. In other constructions, the switch 175 can be activated in a hysteretic manner. For example, the switch 175 may only be activated if the voltage of the battery 50 reaches or drops below a first threshold. The switch 175 may remain open (e.g., interrupting the current flow) until the present state of charge of the battery 50 recovers to or exceeds a second threshold, typically greater than the first threshold. In some constructions, the second threshold can equal the first threshold. In some constructions, the more the battery state of charge is depleted, the time period that the state of charge takes to recover or reach the second threshold can be longer. In these instances, the circuit 130 can also include a timer (not shown). When a first time kept by the timer expires and the state of charge has not recovered to the second threshold, then the circuit 130 can infer that the battery 50 is fully discharged, and can continue to have the switch 175 remain open to prevent the battery 50 from entering an over-discharged state.

Figure 11F:
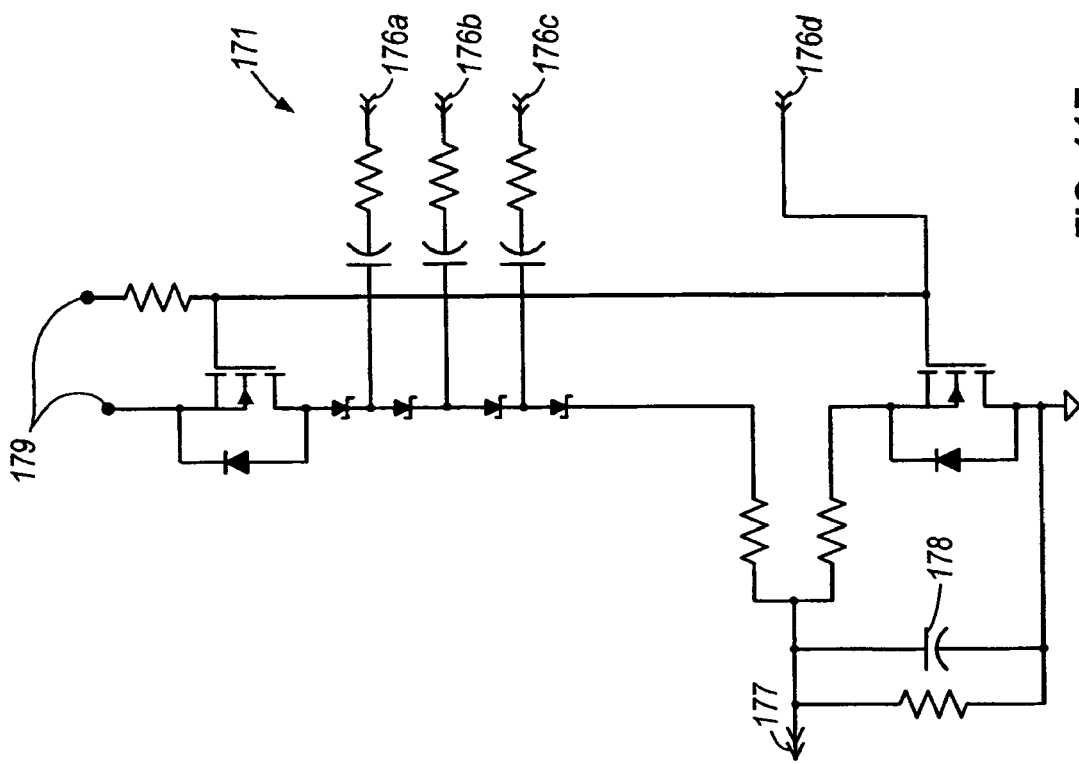
FIG. 11F is still another schematic view of a battery, such as one of the batteries shown in FIGS. 1–3.
Figure 11E:
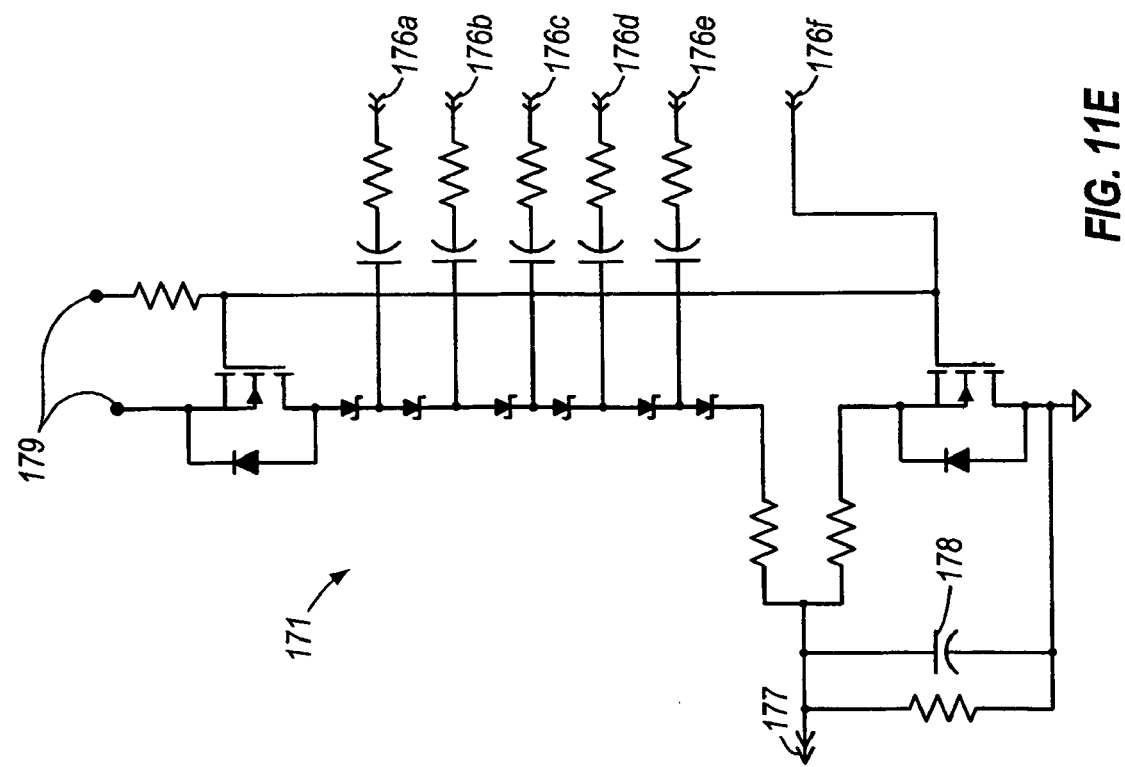
FIG. 11E is still another schematic view of a battery, such as one of the batteries shown in FIGS. 1–3.
Figure 12A:
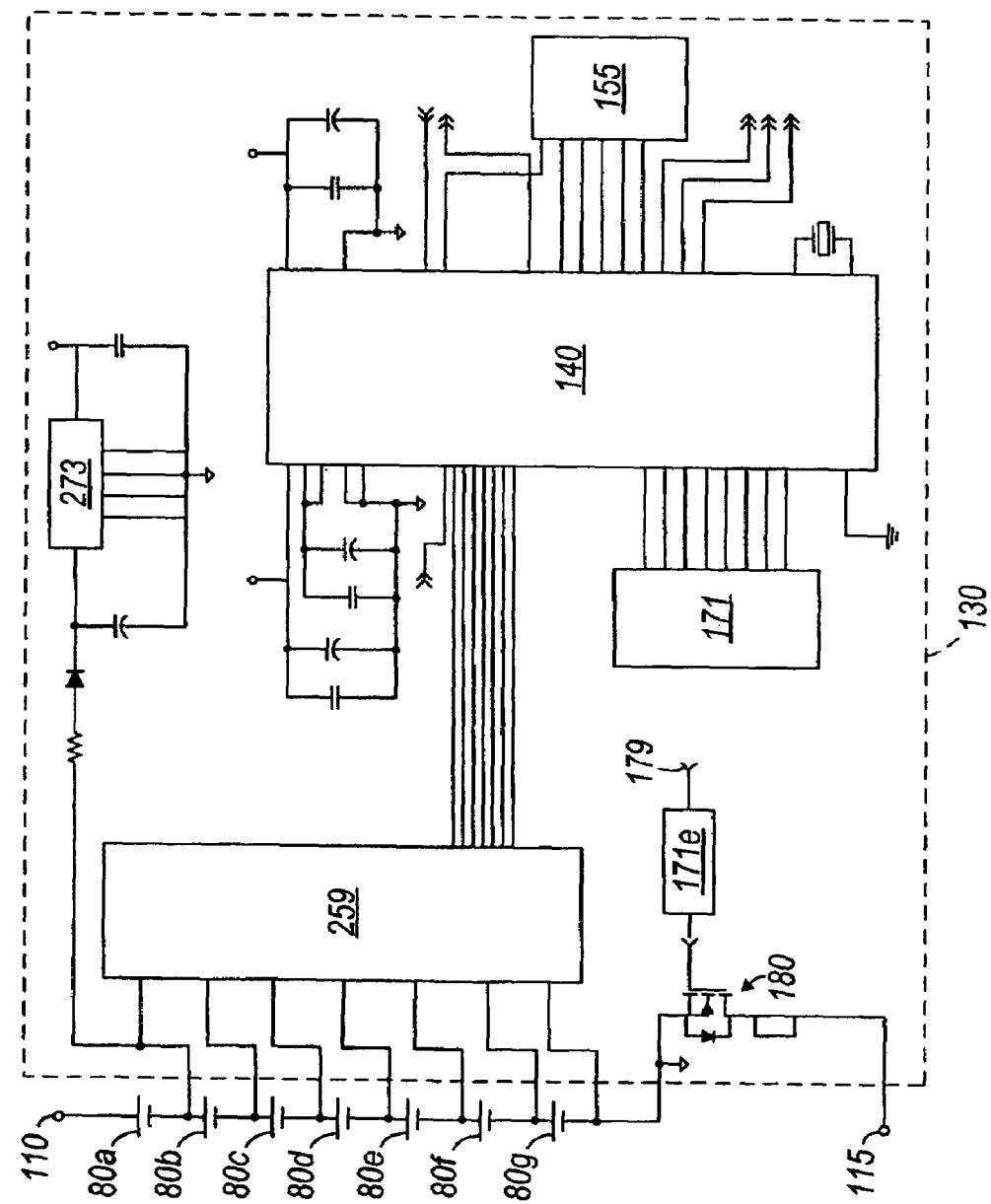
FIGS. 12A–C are still other schematic views of a battery, such as one of the batteries shown in FIGS. 1–3.
Figure 12B:
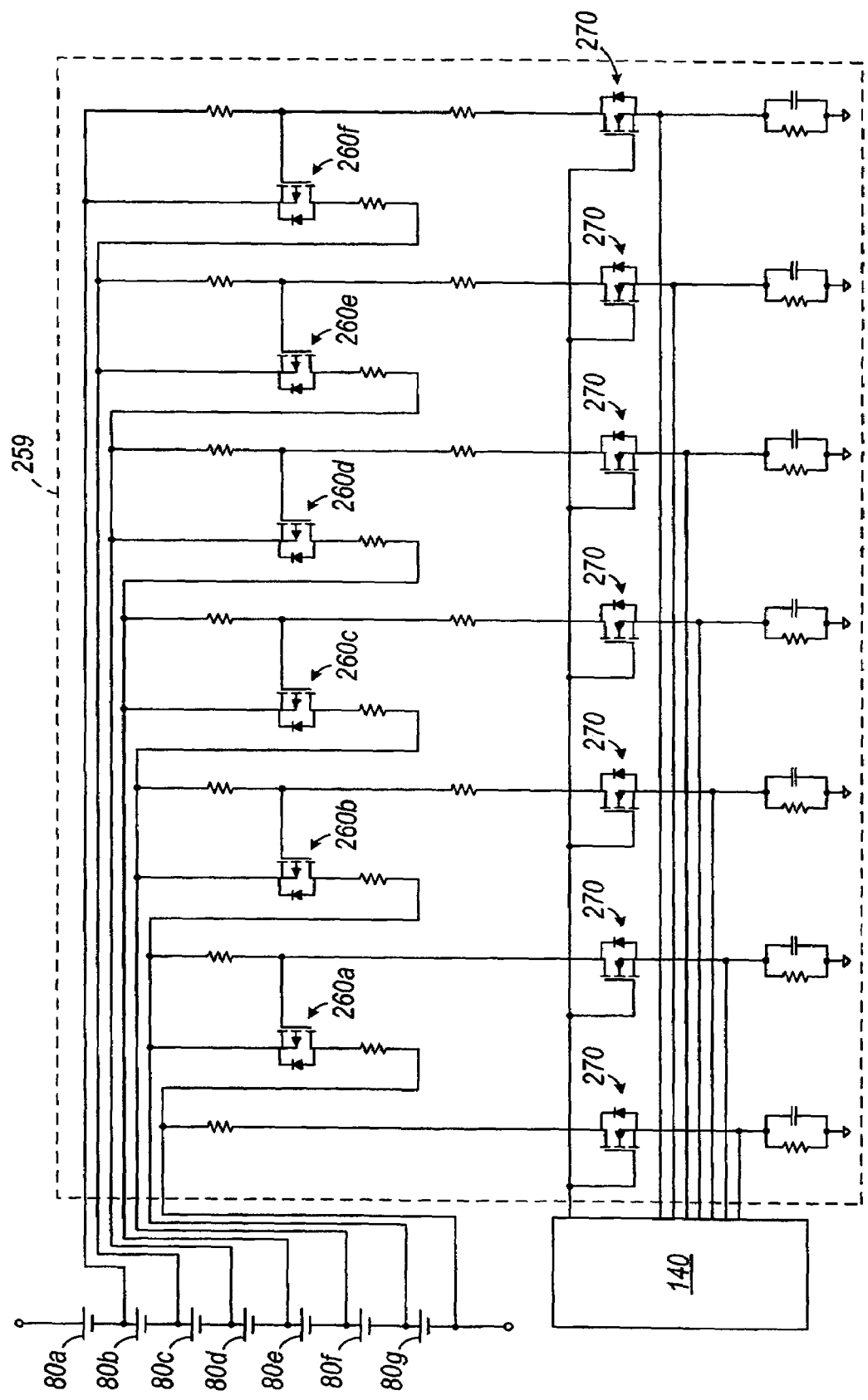
Figure 12C:
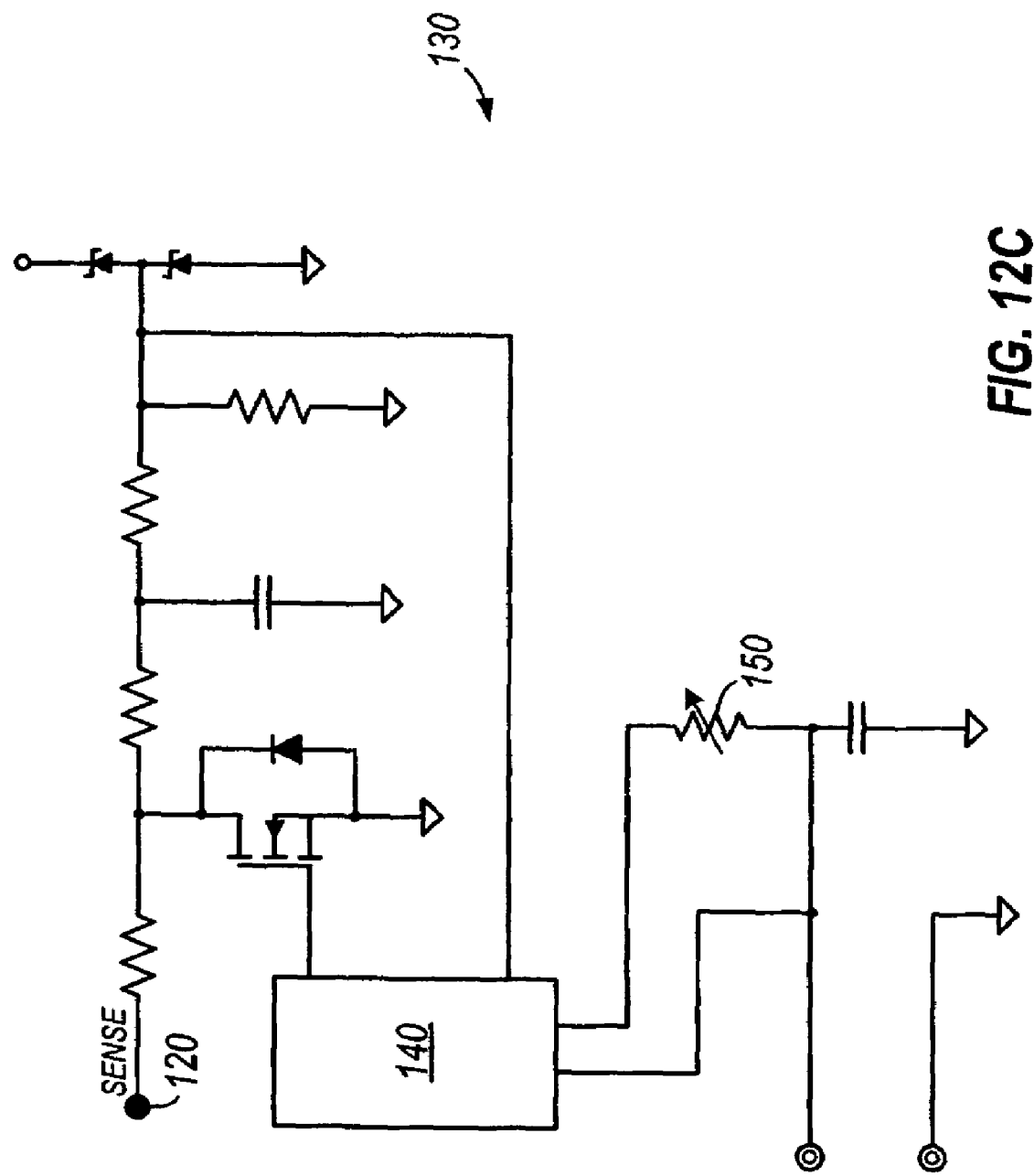
Figure 13A:
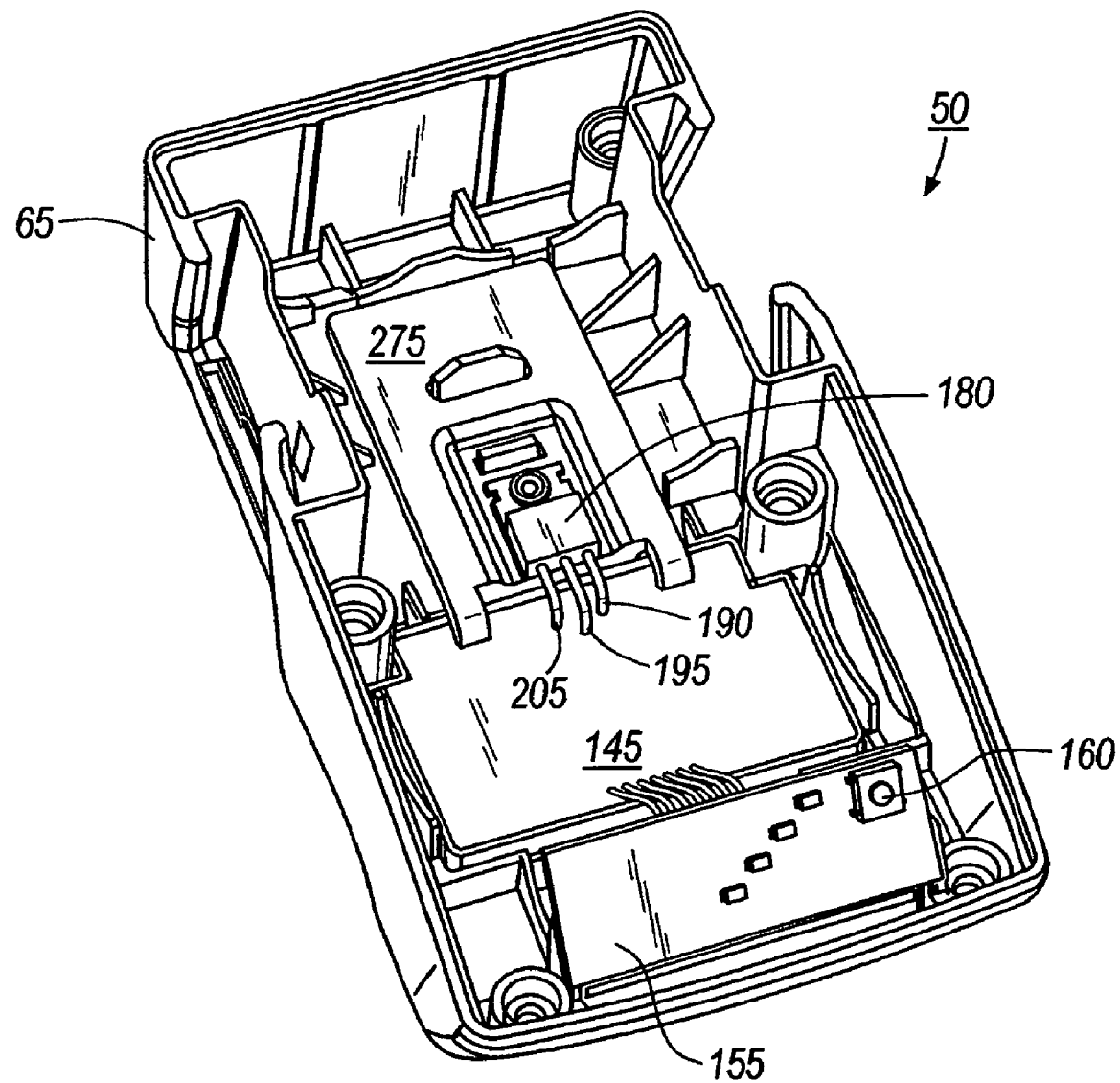
FIG. 13A is a perspective view of a portion of a battery, such as one of the batteries shown in FIGS. 1–3, with portions removed and illustrates the FET and the heat sink.
Figure 13B:
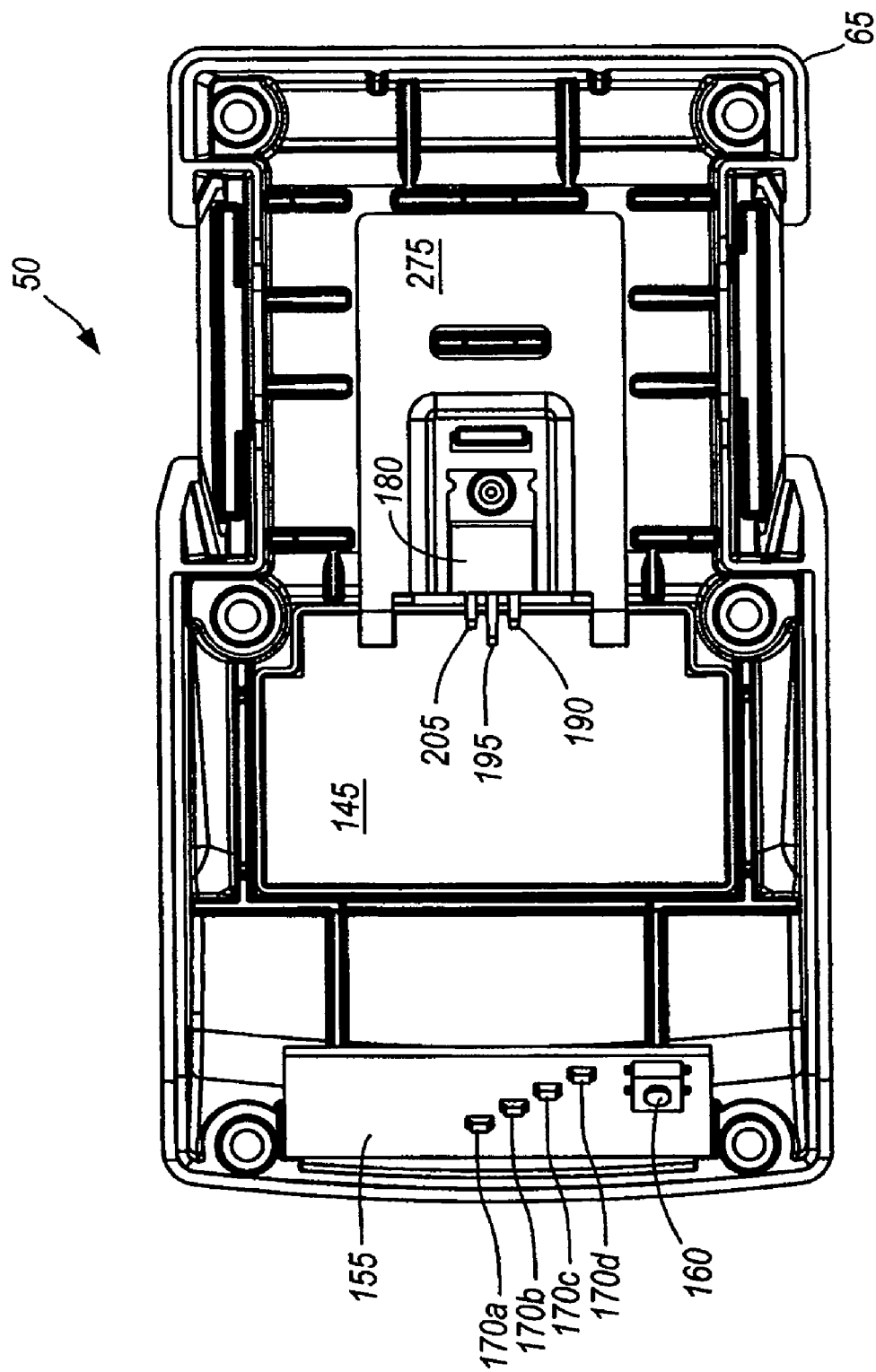
FIG. 13B is a plan view of the portion of the battery shown in FIG. 13A.
Figure 13C:
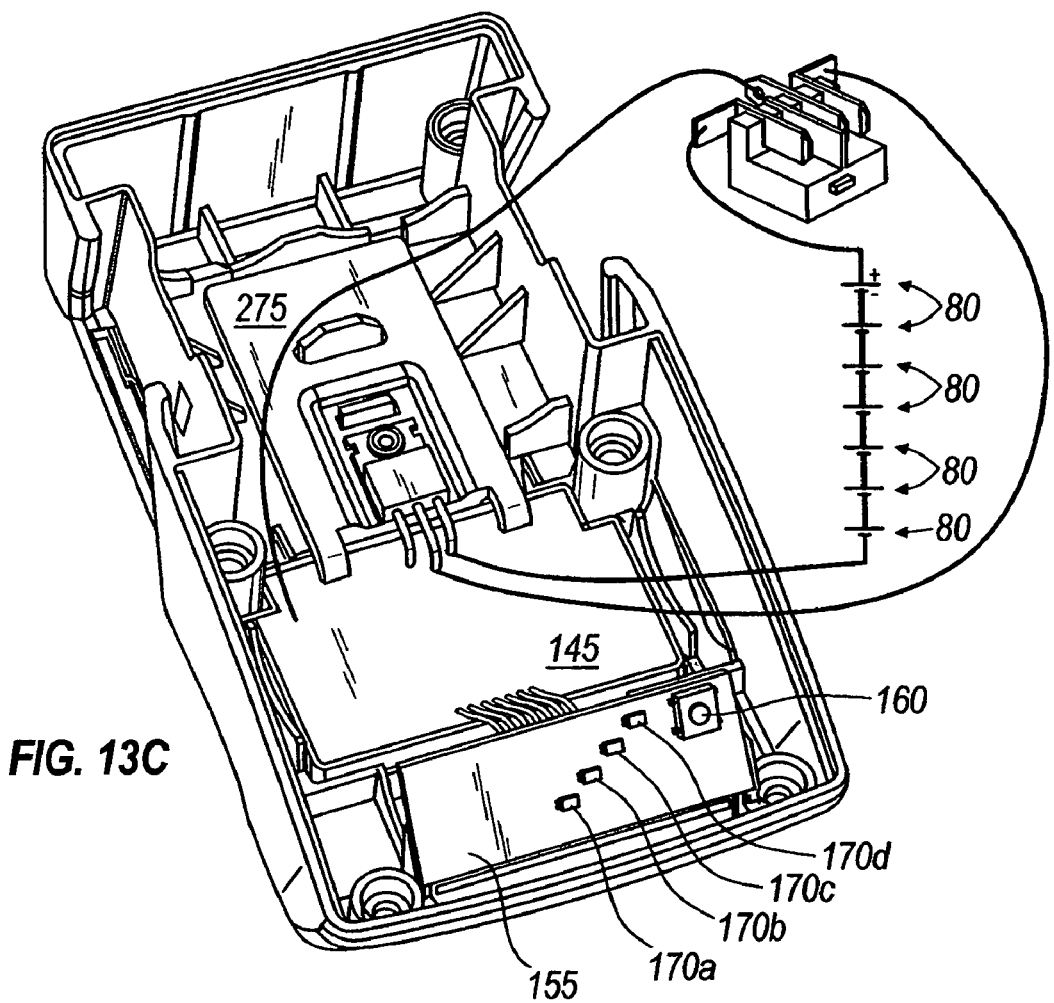
FIG. 13C is a perspective view of a portion of a battery, such as one of the batteries shown in FIGS. 1–3, with portions removed and illustrates the FET, the heat sink and electrical connections within the battery.

In a further construction such as, for example, the constructions illustrated in FIGS. 11E and 11F, the boosting circuit 171 can be a capacitive charge pump boost circuit such as the boosting circuits 171e and 171f. In these constructions, the boosting circuits 171e and 171f can "boost" one or more lower voltage signals into a higher output voltage signal. As shown in FIG. 11e, the boosting circuit 171e can include one or more inputs 176a–f for receiving AC signals, controls signal, and the like, and one or more low voltage inputs 179 for receiving one or more low voltage signals. The signals (e.g., the AC signals and/or the control signals) can be used to increase the low voltage signals and the charge stored on (or the voltage across) a capacitor 178, and generate a higher voltage output signal at output 177. Similar to the boosting circuit 171e, boosting circuit 171f can also include one or more inputs 176a–d for receiving low voltage AC power signals, control signals, and the like, and one or more low voltage inputs 179 for receiving one or more low voltage signals. In an exemplary implementation, the boosting circuit 171e can boost an approximately 3 V input signal to an approximately 10 V output signal, and the boosting circuit 171f can boost an approximately 3 V input signal to an approximately 5 V output signal.

In some constructions, the boosting circuits 171e and 171f can provide higher voltage signals to components within the circuit 130 at any time and during any battery condition. For example, the boosting circuit 171e can provide an output signal to power a power FET or switch, as discussed below, and the boosting circuit 171f can provide an output signal to power one or more transistors, as discussed below.

In some constructions and in some aspects, the circuit 130 can include a semiconducting switch 180 that interrupts the discharging current when the circuit 130 (e.g., the microprocessor 140) determines or senses a condition above or below a predetermined threshold (i.e., an "abnormal battery condition"). In some constructions, an abnormal battery condition can include, for example, high or low battery cell temperature, high or low battery state of charge, high or low battery cell state of charge, high or low discharge current, high or low charge current, and the like. In the illustrated constructions, the switch 180 includes a power FET or a metal-oxide semiconductor FET ("MOSFET"). In other constructions, the circuit 130 can include two switches 180. In these constructions, the switches 180 can be arranged in parallel. Parallel switches 180 can be included in battery packs supplying a high average discharge current (such as, for example, the battery 50 supplying power to a circular saw 56, a driver drill 58, and the like).

Figure 7:
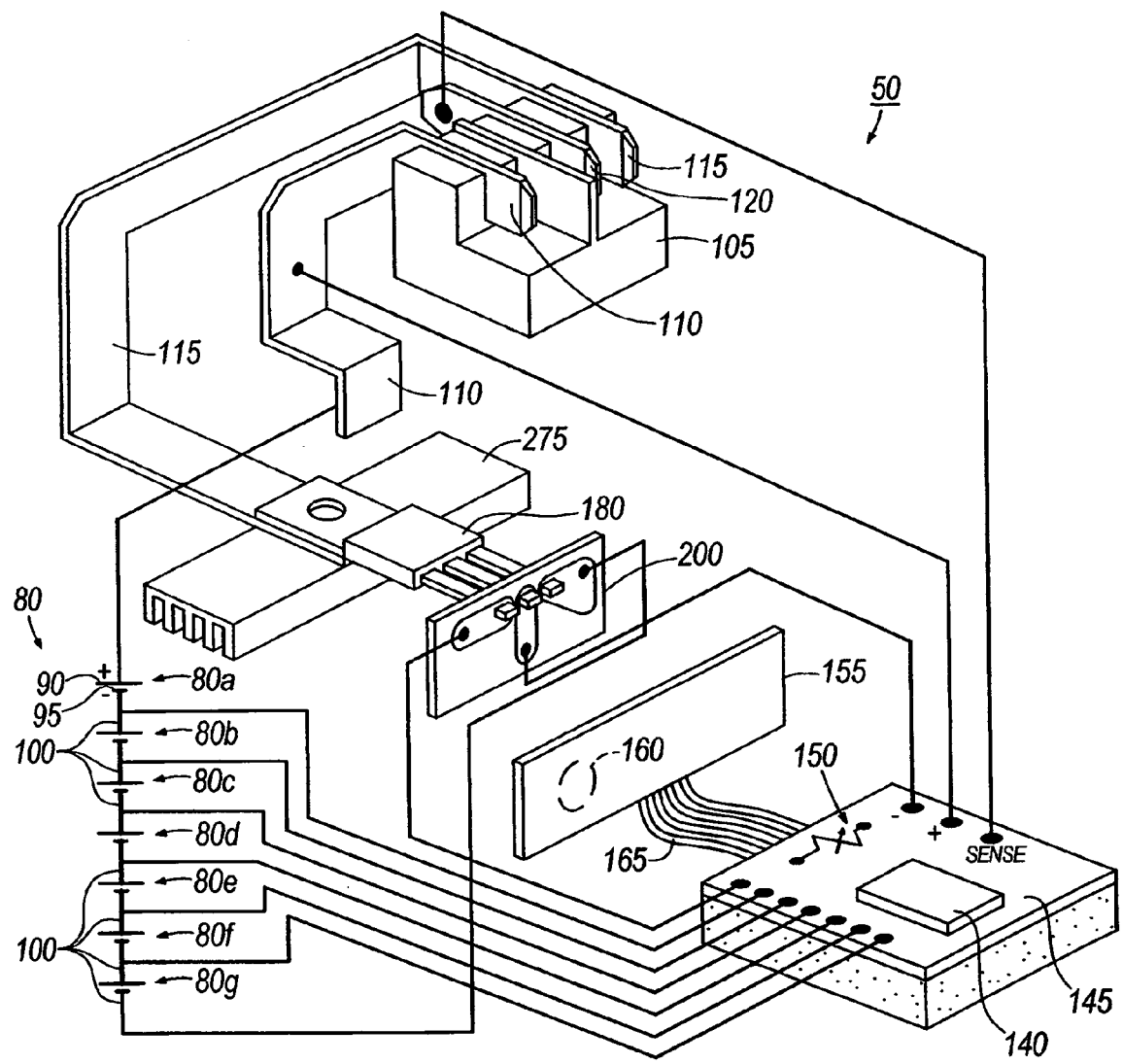
FIG. 7 is still another schematic view of a battery, such as one of the batteries shown in FIGS. 1–3.
Figure 8:
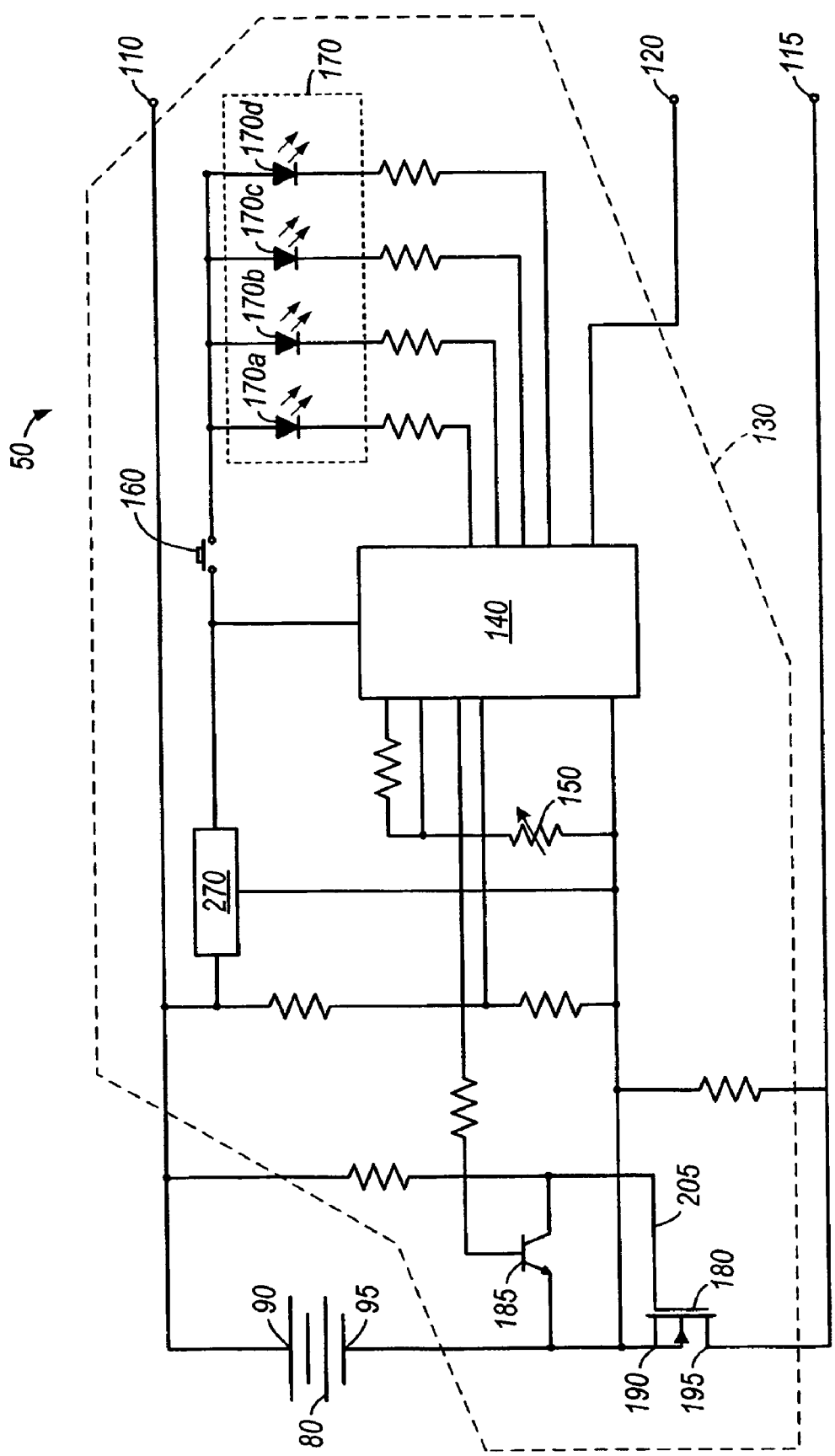
FIG. 8 is still another schematic view of a battery, such as one of the batteries shown in FIGS. 1–3.
Figure 9:
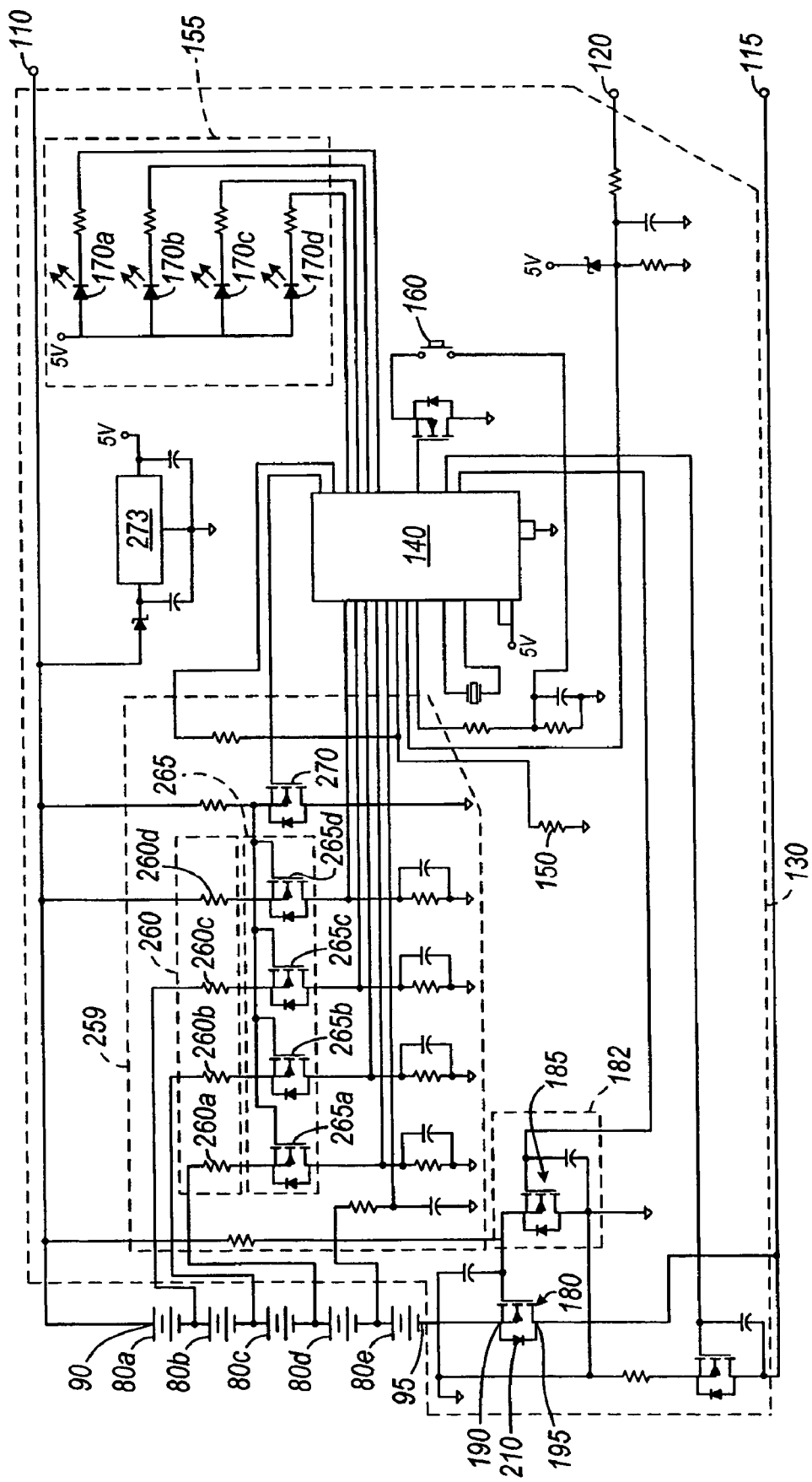
FIG. 9 is still another schematic view of a battery, such as one of the batteries shown in FIGS. 1–3.

In some constructions, the circuit 130 can further include a switch control circuit 182 to control the state of the switch 180 (or switches 180 if applicable). In some constructions, the switch control circuit 182 can include a transistor 185 such as, for example, a npn-bipolar junction transistor or a field-effect transistor ("FET"). In these constructions, the circuit 130 (e.g., the microprocessor 140) can control the switch 180 by changing the state of the transistor 185. As shown in FIGS. 7–9, the source 190 of the FET 180 can be electrically connected to the negative end 95 of the battery cell 80a–e, and the drain 195 of the FET 180 can be electrically connected to the negative terminal 115. The switch 180 can be mounted to a second PCB 200 (shown in FIG. 7). In some constructions and in some aspects, such as, for example, the constructions illustrated in FIGS. 14A–E, the switch 180 can be mounted on the PCB 145. In other constructions, the switch 180 can be mounted in another suitable position or location.

In an exemplary implementation, current will flow through the switch 180 from the drain 195 to the source 190 during discharging, and current will flow through the switch 180 from the source 190 to the drain 195 during charging. In the event an abnormal battery condition is detected by the circuit 130 (e.g., the microprocessor 140), the microprocessor 140, for example, can turn on the transistor 185, that is, bias the transistor 185 into a conducting state. When the transistor 185 is in a conducting state, there is not enough voltage across the gate 205 and the source 190 of the FET 180 for the switch 180 to be in a conducting state. Thus, the FET 180 becomes non-conducting, and current flow is interrupted.

In some constructions, once the switch 180 becomes non-conducting, the switch 180 may not reset even if the abnormal condition is no longer detected. In some constructions, the circuit 130 (e.g., the microprocessor 140) may reset the switch 180 only if an electrical device, such as, for example, a battery charger 60, instructs the microprocessor 140 to do so. In some constructions, the microprocessor 140 may reset the switch 180 after a predefined time period. In some constructions, if the microprocessor 140 detects an abnormal battery condition during discharge, the microprocessor 140 may not change the state of the switch 180 to non-conducting until the microprocessor 140 also detects a discharge current below a predetermined threshold (i.e., a low discharge current).

In some constructions, the switch 180 can be configured to only interrupt current flow when the battery 50 is discharging. That is, the battery 50 can be charged even when the switch 180 is in the non-conducting state. As shown in FIGS. 4 and 5, the switch 180 can include a body diode 210, which, in some constructions, is integral with a MOSFET and other transistors. In other constructions, the diode 210 can be electrically connected in parallel with the switch 180.

In another exemplary implementation, when the battery 50 is being discharged (i.e., represented in FIG. 5 as a switch 215 being in a first position 220 to allow current to flow through a load 225, such as, for example, a power tool 55), current flows through the battery 50 in direction 230, that is, through the drain 190 of the FET 180 to the source 190 of the FET 180. When the battery 50 is being charged (i.e., represented in FIG. 5 as the switch 215 being positioned in a second position 235 to allow current to flow from an electric device, such as, for example, a battery charger 60), current flows through the battery 50 in direction 240, that is, through the source 190 of the FET 180 to the drain 195 of the FET 180.

In this implementation, current flow in the direction 230 may be interrupted when the switch 180 is in the non-conducting state. Therefore, the battery 50 no longer supplies a discharge current to the load 225. In some constructions, the circuit 130 including, for example, the microprocessor 140 or additional circuitry 250 (which may or may not include the microprocessor 140), may change the state of the switch 180 from non-conducting to conducting when the microprocessor 140 receives an instruction or command to do so. In some constructions, the microprocessor 140 and/or additional circuitry 250 may not receive a command or an instruction and, therefore, may not change the state of the switch 180 from non-conducting to conducting. For example, the battery 50 may become deeply discharged that the battery 50 does not have enough power in the battery cells 80 to power the circuit 130. If the battery 50 does not have enough power to power the circuit 130, communication (as performed by the circuit 130) between the battery 50 and an electrical device (e.g., battery charger 60) may not be able to take place and then the electrical device may not be able to send a control signal to the battery 50 to re-set the switch 180. In these instances, the body diode 210 included in the switch 180 may conduct current in the direction 240 (i.e., a charging current) supplied by an electrical device such as, for example, the battery charger 60. This can allow the battery 50 to be charged even if the switch 180 is not conducting, or at least receive enough charge to power the circuit 130, re-set the switch 180, and commence communication or charging.

In some constructions and in some aspects, the circuit 130 (e.g., microprocessor 140) can monitor battery cell voltage for an abnormal condition (e.g., low battery cell voltage) and can activate the switch 180 to interrupt the discharge current if an abnormal condition is detected. In some constructions, battery cell damage can occur if the cell voltage drops to or below a certain voltage, such as, for example, a cell "reversal" voltage. In some constructions, cell reversal occurs at approximately 0 V. In some constructions, the microprocessor 140 or the circuit 130 can establish a cell reversal threshold as a preventative precaution. In some constructions, the cell reversal threshold can be set at the cell reversal voltage. In other constructions, the cell reversal threshold can be set higher than the cell reversal voltage. For example, the cell reversal threshold can be set for approximately 1 V.

In some instances, the battery 20 can experience a voltage "depression" (e.g., large temporary drop in voltage) during the start of discharge. The voltage depression can typically be temporary and most evident at low battery temperatures. In some constructions, a voltage depression can drop to or below the cell reversal threshold.

In some constructions and in some aspects, the circuit 130, such as the microprocessor 140, can include variable response times for responding or reacting to monitored battery characteristics. In some constructions, the variable response time can include multiple monitoring modes for the circuit 130. That is, the circuit 130 (e.g., the microprocessor 140) can operate in multiple modes when detecting and/or monitoring battery characteristics such as, for example, cell state of charge, battery state of charge, and other similar battery characteristics. For example, the microprocessor 140 can include a first mode with a first sampling rate and a second mode with a second sampling rate. In some constructions, the first sampling rate can be set and can differ from the second sampling rate, which can also be set. In other constructions, the first sampling rate can be dependent on a first parameter, which may include, for example, one or more battery characteristics, one or more control signals from an electrical device (e.g., the power tool 55 or the battery charger 60), or the like, and may vary according to that first parameter. Similarly, the second sampling rate can also be dependent on the first parameter or can be dependent on a second parameter (similar to the first parameter, for example), and may vary according to that second parameter. In other constructions, the microprocessor 140 can include additional sampling rates and additional modes, as will be discussed below.

In some constructions, for example, the microprocessor 140 can operate in a first mode or "slow" mode. In these constructions, operation in the slow mode can reduce activation of the switch 180 due to voltage depressions by prolonging the response time. In some constructions, the microprocessor 140 may operate in the slow mode when the load on the battery 20 is not high enough to require a fast response time (e.g., the current draw is relatively low). In some constructions, the microprocessor 140 may operate in the slow mode until the present battery state of charge remaining drops below a predefined threshold, such as, for example, approximately 10% state of charge remaining.

In an exemplary implementation, the microprocessor 140 can sample the cell voltages at a slow rate, such as, for example, once per second, when operating in the slow mode. Since the microprocessor 140 is sampling at a slow rate, the microprocessor 140 experiences a slower response time. In some constructions, the slow mode may be adequate for most monitoring conditions and can reduce the quiescent current drawn by the circuit 130 (e.g., the microprocessor 140 and additional circuitry). In some constructions, the microprocessor 140 can operate in the slow mode as long as the cell voltages are above a predefined threshold or "mode switch" threshold, such as, for example, 3.73 V.

In some constructions, the microprocessor 140 can operate in a second mode or "fast" mode. In these constructions, operation in the fast mode can quicken the response time for detecting an abnormal condition. In some constructions, the microprocessor 140 can operate in the fast mode when the one or more cell voltages drop to the predefined threshold or "mode switch" threshold, such as, for example, 3.73 V. In some constructions, the microprocessor 140 can operate in the fast mode when the present battery state of charge remaining drops to a predefined threshold, such as, for example, approximately 10% state of charge remaining.

In another exemplary implementation, the microprocessor 140 samples the cell voltages at a fast rate, such as, for example, 100 samples per second when operating in the fast mode. In some constructions, the cell voltages sampled by the microprocessor 140 may be averaged over a certain number of samples before activation of the switch 180 occurs. In some constructions, for example, the switch 180 may not be activated by the microprocessor 140 unless the average of thirty samples is equal to or less than the cell reversal threshold. Averaging the samples can have an effect of digitally "filtering" the voltage information that is read by the microprocessor 140 and can provide some delay for the microprocessor 140 to ignore the "inrush" current and/or voltage depressions. Averaging the samples can also have an effect of filtering the voltage information from electrical noise due to external speed control circuits. In some constructions, the number of samples for averaging can vary depending on the operating mode of the microprocessor 140, the type of battery characteristic being monitored, and the like.

In some constructions, the microprocessor 140 may also activate the switch 180 when operating in the fast mode if the cell voltages drop below a predefined threshold, such as a cut-off threshold, for a certain amount of time such as, for example, several seconds. In some constructions, the cut-off threshold can be greater than the cell reversal threshold. For example, the cut-off threshold may be approximately 2 V, and the cell reversal threshold may be approximately 1 V. In cases where voltage drops below 1 V, response time my be much faster (on the order of 300 ms). The variable response times can reduce the amount of nuisance shut-downs while still protecting the cells adequately.

In some constructions, the voltage thresholds (the cut-off threshold and the cell reversal threshold) can be adjusted up or down by the microprocessor 140 in accordance with the battery temperature. This can allow for the optimization based on battery temperature characteristics.

In a further exemplary implementation, the microprocessor 140 can varying the response times by varying the number of samples to be averaged. For example, the microprocessor 140 can sample a battery characteristic such as, for example, battery temperature. According to a first mode, the microprocessor 140 can have a "slow" response time by averaging the battery temperature measurements over 50 samples. According to a second mode, the microprocessor 140 can have a "fast" response time by averaging the battery temperature measurements over 30 samples. In some constructions, the measurements can be sampled at the same rate. In other constructions, the measurements can be sampled at different rates. For example, the first mode can sample the measurements at a rate of approximately 1 sample per second, and the second mode can sample the measurements at a rate of approximately 10 samples per second.

In some constructions, the microprocessor 140 can control and limit the current draw without the need for current-sensing devices, because the microprocessor 140 is capable of sensing a high discharge current by monitoring cell voltages. For example, when a high current load causes the cell voltages to drop to a low level, such as, for example, the cut-off threshold and/or the cell reversal threshold, the microprocessor 140 may activate the switch 180 and disable the battery 20. The microprocessor 140 can indirectly limit the current draw by monitoring the cell voltages and disable the battery 20 when the cell voltages drop to certain levels (e.g., the cut-off threshold and/or the cell reversal threshold).

In some constructions and in some aspects, the circuit 130 (e.g., in some constructions, the microprocessor 140) can monitor battery conditions (e.g., battery cell voltage/present state of charge, battery cell temperature, battery pack voltage/present state of charge, battery pack temperature, etc.) periodically to reduce the parasitic current draw from the battery 50. In these constructions, the microprocessor 140 can operate in a "sleep" mode for a first predefined time period (i.e., a "sleep time period"). During the sleep mode, the microprocessor 140 may draw a low quiescent current from the battery 50. After the sleep time period expires, the microprocessor 140 can "wake up" or, in other words, can operate in an active mode for a second predefined time period (i.e., an "active time period"). During the active mode, the microprocessor 140 can monitor one or more battery conditions.

In some constructions, the sleep time period can be greater than the active time period. In some constructions, the ratio of the active time period to the sleep time period can be low such that the average parasitic current draw is low. In some constructions, the ratio can be adjusted (e.g., increased) during time periods of known battery activity, such as, for example, when the microprocessor 140 senses a discharge current or a charge current approximately equal to a predetermined threshold. In some constructions, when the microprocessor 140 detects certain voltage and/or temperature characteristics, the sleep time period can be decreased and/or the active time period can be increased.

In some constructions and in some aspects, the circuit 130 can include a voltage detection circuit 259. In some constructions, the voltage detection circuit 259 can include a plurality of resistors 260 forming resistor divider networks. As shown in the illustrated construction, the plurality of resistors 260 can include resistors 260*a–d*. The plurality of resistors 260 can be electrically connected to one or more battery cells 80*a–g* and to a plurality of transistors 265. In the illustrated construction, the plurality of transistors 265 can include transistors 265*a–d* or 265*a–f*. In some constructions, the number of resistors included in the plurality of resistors 260 can equal the number of transistors included in the plurality of transistors 265.

In some constructions, voltage characteristics of the battery 50 and/or of the battery cells 80 can be read by the microprocessor 140 through the plurality of resistors 260 when the microprocessor 140 is in the active mode. In some constructions, the microprocessor 140 can initiate a voltage-read event by turning off transistor(s) 270 (i.e., transistor 270 becomes non-conducting). When the transistor(s) 270 is non-conducting, the transistors 265*a–d* become conducting and voltage measurements regarding the battery 50 and/or battery cells 80 can be made by the microprocessor 140. Including the plurality of transistors 265 in the battery 50 can reduce the parasitic current draw from the battery 50, because the transistors 265 are only conducting periodically.

In some constructions and in some aspects, the microprocessor 140 communicates battery pack characteristics and/or conditions to electrical devices, such as, for example, a power tool 55 and/or a battery charger 60, when the battery 50 and the electrical device are electrically connected. In some constructions, the microprocessor 140 digitally communicates to the electrical device in a serial manner. The sense terminal 120 of the battery 50 provides a serial communication link between the microprocessor 140 and the electrical device. The information regarding the battery 50 that can be exchanged between the microprocessor 140 and the electrical device includes, but is not limited to, battery pack chemistry, battery pack nominal voltage, battery pack temperature, battery pack present state of charge, battery cell(s) nominal voltage, battery cell(s) temperature, battery cell(s) present state of charge, calibration techniques/information, charging instructions, number of charge cycles, estimated remaining life expectancy, discharging information, etc.

In some constructions, an electrical device, such as, for example, a battery charger 60, can calibrate the microprocessor 140 when electrical connection is established. In some constructions, the measuring circuitry included in the battery charger 60 will be more precise than the circuitry included in the battery 50. Therefore, the battery charger 60 calibrates the microprocessor 140 and/or the circuit 130 included in the battery 50 to improve battery measurements made by the microprocessor 140 and/or by the circuit 130.

In some constructions, the circuit 130 can also include a voltage regulator 273. The voltage regulator 273 can supply an appropriate voltage to the microprocessor 140, the LEDs 170*a–d* of the fuel gauge 155 and any other additional electrical component that requires a constant voltage input. In the illustrated construction, the voltage regulator 273 can output approximately 5 V.

In some constructions and in some aspects, the battery 50 may include a heat sink 275. The heat sink 275 can be in thermal communication with the power FET or switch 180. The heat sink 275 can serve to remove heat generated by the switch 180 away from the switch 180.

In some constructions and in some aspects, the battery 50 may also include a heat pipe (not shown) or a fan (not shown) to increase the amount of heat being transferred from the heat sink 275. Such a heat pipe can be in thermal communication with the heat sink 275 in order to remove heat collected by the heat sink 275. Such a fan or blower can be in a position to create a flow of cooling air to pass over the heat sink 275. Vents (not shown) can be positioned in the housing 65 of the battery 50 to allow cool air to enter the battery pack 50 and the heated air to leave the battery pack 50. In some constructions, the heat pipe and/or fan can be positioned to collect and/or remove heat generated by the battery cells 80*a–e* in addition to or as a substitute for the heat generated by the heat sink 275.

Figure 21A:
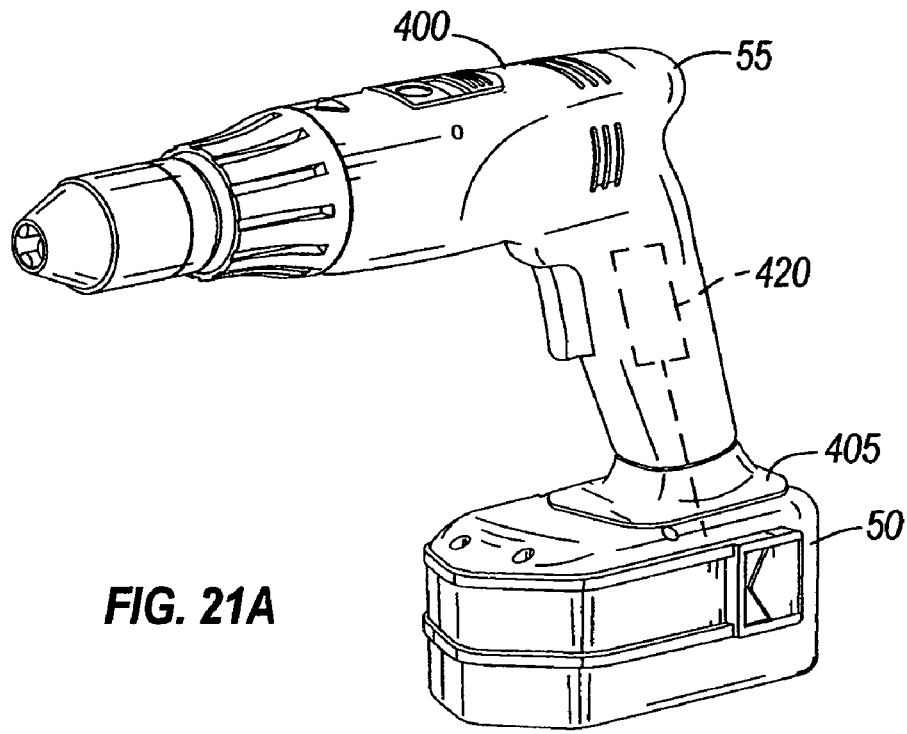
FIGS. 21A–C are a schematic views of a battery, such as one of the batteries shown in FIGS. 1–3, in use with an electrical device, such as a power tool.
Figure 21B:
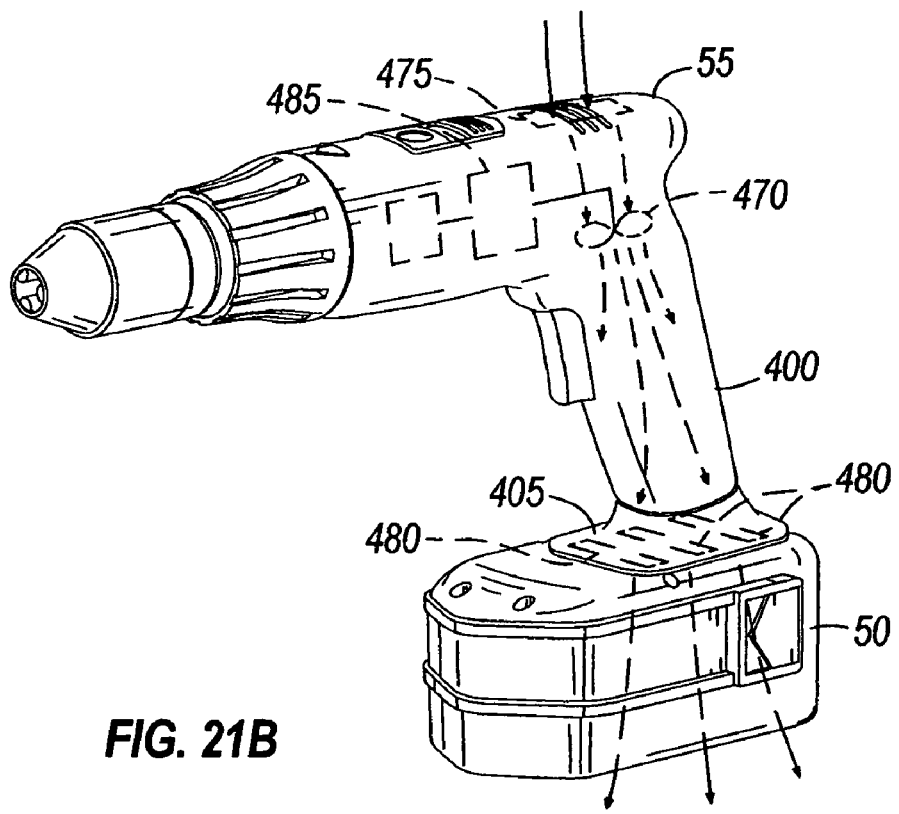
Figure 21C:
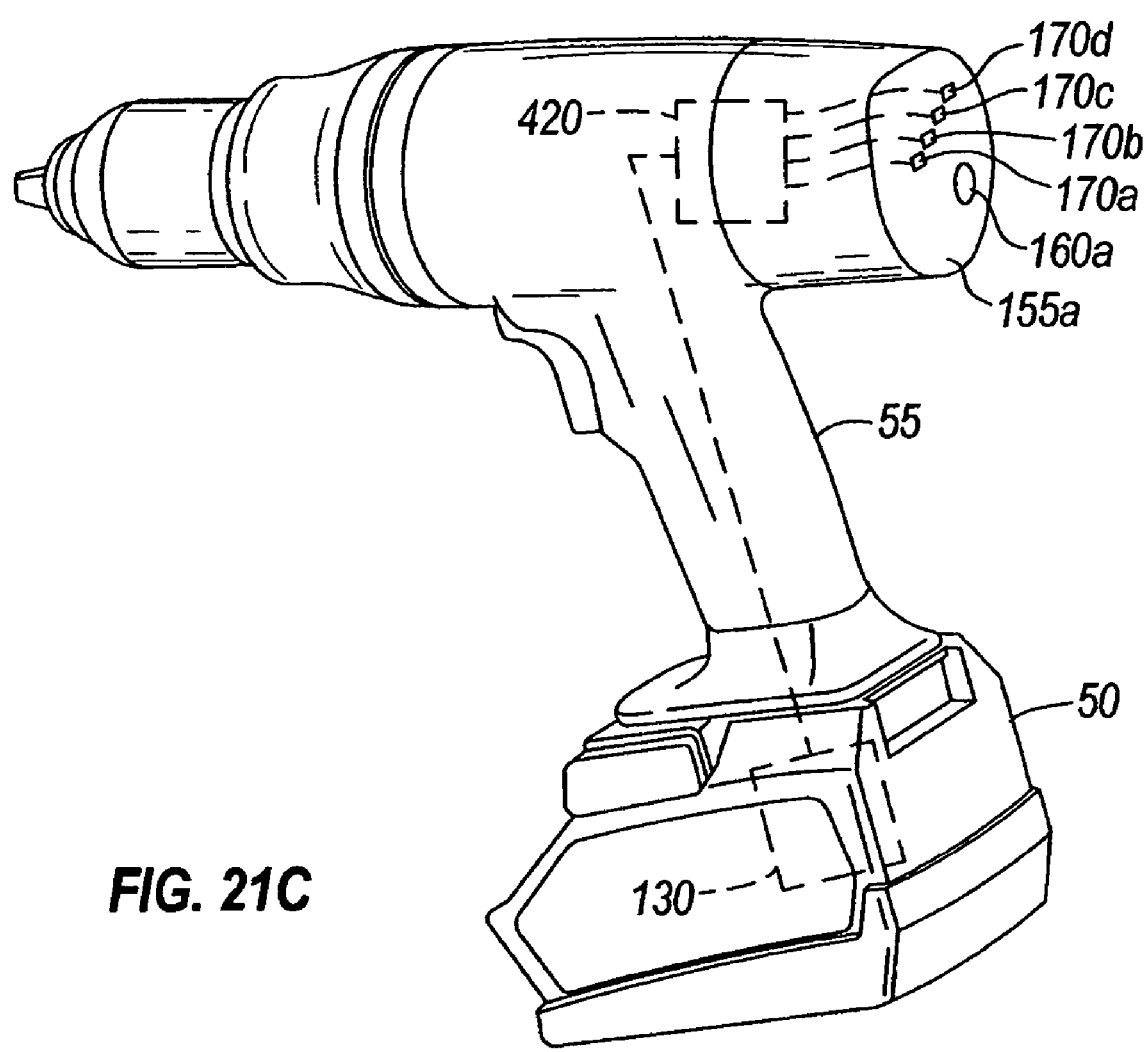
Figure 22:
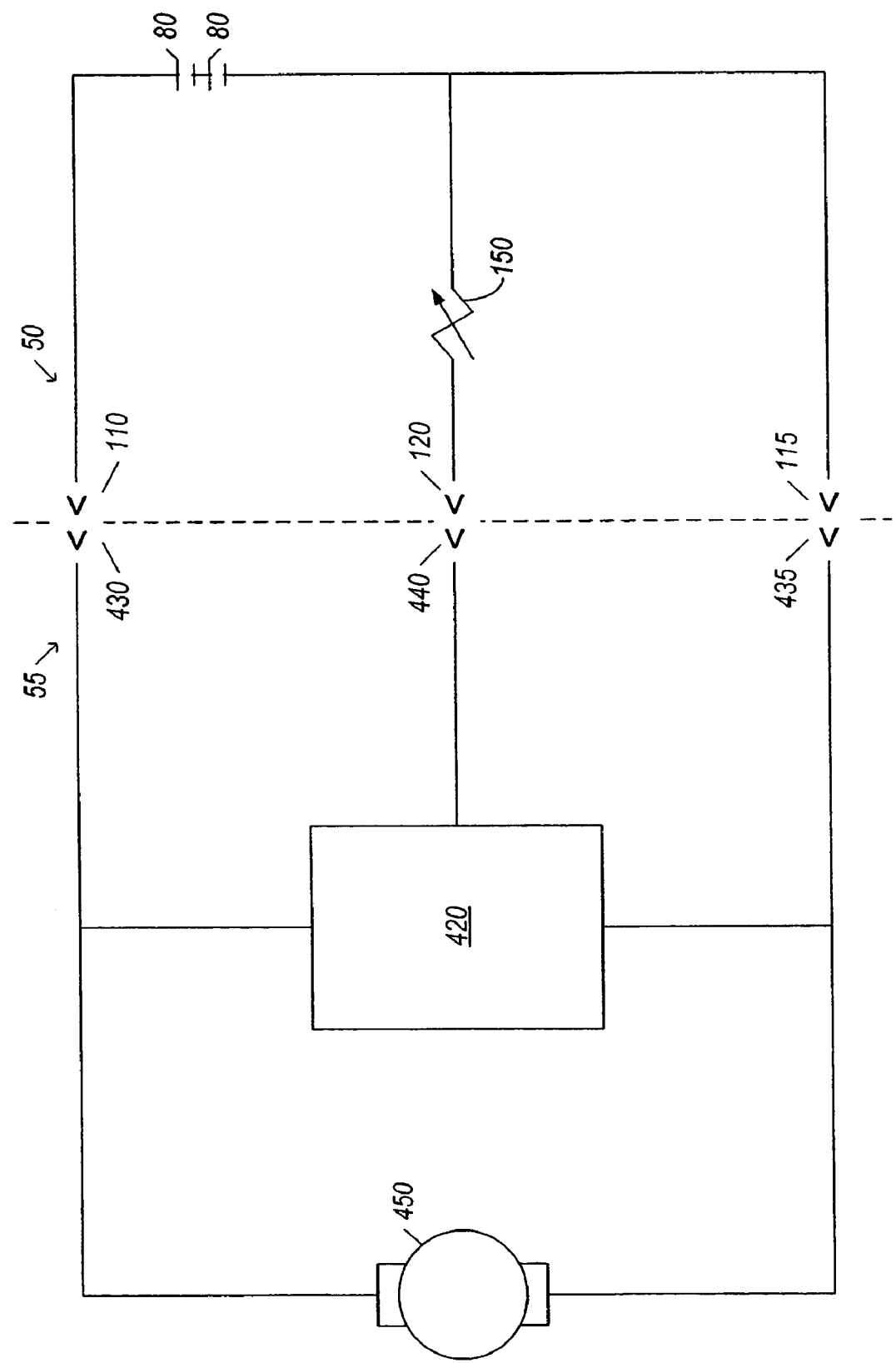
FIG. 22 is another schematic view of a battery, such as one of the batteries shown in FIGS. 1–3, in use with an electrical device, such as a power tool.

In some constructions and in some aspects, the battery 50 can also include a phase change material 300 (see FIGS. 20–22). In such constructions, the phase change material 300 can be positioned to absorb and/or to remove heat generated by the battery cells 80*a–g* and conductive links 100 (not shown in FIGS. 20–22). As the phase change material 300 undergoes phase transformation (e.g., from solid to liquid, from liquid to gas, from liquid to solid, from gas to liquid, etc.) at a phase change temperature, a large amount of energy is absorbed or released (i.e., latent heat of fusion, latent heat of vaporization, etc.). During such a phase transformation, the phase change material 300 can have a relatively constant temperature.

In an exemplary implementation, the temperature of the battery cells 80 may increase as a load is applied to the battery cells 80. In some constructions, as illustrated in FIG. 20, the phase change material 300 can surround each of the battery cells 80. In such constructions, heat generated by the battery cells 80 may be first conducted to an exterior surface 305 of the battery cells 80, and then to the surrounding phase change material 300. As the phase change material 300 continues to absorb heat from the battery cells 80 and conductive links 100, the temperature of the phase change material 300 can increase. As the temperature of the phase change material 300 reaches the phase change temperature, the phase change material 300 can begin to undergo a phase transformation from a first phase to a second phase, while the temperature of the phase change material 300 remains relatively constant and approximately equal to the phase change temperature. In some constructions, the phase change material 300 may continue to undergo phase transformation until the phase change material 300 has completely transformed into the second phase and/or the load has been removed from the battery cells 80 (i.e., the battery cells 80 are no longer generating heat).

In some constructions and in some aspects, the phase change material 300 can have a phase change temperature greater than an expected ambient temperature and less than a maximum allowable battery cell temperature. In some constructions and in some aspects, the phase change material 300 can have a phase change temperature between −34° C. and 116° C. In some constructions and in some aspects, the phase change material 300 can have a phase change temperature in between 40° C. and 80° C. In some constructions and in some aspects, the phase change material 300 can have a phase change temperature between 50° C. and 65° C.

The phase change material 300 can be any suitable phase change material, can have a high latent heat per unit mass, can be thermally cyclable, inert, non-corrosive, non-contaminating, and can comprise paraffin waxes (such as those available from Rubitherm® headquartered in Hamburg, Germany), eutectic mixtures of salts (such as those available from Climator based in Skovde, Sweden), halogenated hydrocarbons and mixtures thereof, salt hydrate solutions, polyethylene glycol, stearic acid, and combinations thereof.

An alternate construction of a battery 50A is illustrated in FIGS. 21 and 22. Common elements have the same reference number "A".

In the illustrated construction, the battery 50A can further include a heat sink 275A to spread heat from the battery cell 80A over a greater area of the phase change material 300A. The heat sink 275A may also be employed to provide additional heat storage capacity to absorb and/or remove heat generated by the battery cells 80A.

In some constructions, the heat sink 275A may comprise one element (not shown) that wraps each and all of the battery cells 80*a–e*. In other constructions, the heat sink 275A may comprise multiple pieces such that each battery cell 80A is substantially wrapped by a heat sink 275A, as shown in FIGS. 21 and 22. In still other constructions, as shown in FIG. 21, the heat sink 275A may include an inner cylindrical portion 320 adjacent the exterior surface 305A of the battery cell 80A, an outer cylindrical portion 325 disposed a radial distance from the inner cylindrical portion 320 and radial ribs 330 spaced a circumferential distance from one another that connect the inner cylindrical portion 320 and the outer cylindrical portion 325 and define a space 335 therebetween. The space 335 may be filled with phase change material 300A. A similar configuration as that shown in FIG. 21 may also be employed to encapsulate multiple battery cells (not shown). In yet other constructions, the heat sink 275A may comprise radial ribs 330, as described above, without employing either or both of the inner cylindrical portion 320 and the outer cylindrical portion 325.

In another alternate construction, as shown in FIG. 22, the heat sink 275B can include an inner cylinder portion 320B and radial ribs 330B as described above, and the phase change material 300B may be offset from the battery cell 80B and the heat sink 275B. It should be understood that other heat sink and phase change material configurations are possible. The heat sink 275 may be formed of a metal (e.g., aluminum), a polymer (e.g., nylon), and/or any other material with high thermal conductivity and specific heat.

In some constructions and in some aspects, the battery 50 can include cushion members or "bumpers" 340. As shown in FIGS. 20A and B, the interior face 345 of the battery housing 65 can include one or more cushion members 340. In some constructions, the cushion members 340 can be integral with the housing 65. In other constructions, the cushion members 340 can be attached or secured to the interior face 345 of the housing 65. In further constructions, the cushion member 340 can be connected to one or more battery cells 80 or to an endcap 350 (partially shown in FIG. 16) surrounding one of the ends of the battery cells 80. In some constructions, the cushion members 345 can absorb energy during impact and protect the battery cells 80 during impact by limiting the amount of energy transferred to the cells 80. The cushion members 345 can include any thermoplastic rubber such as, for example, polypropylene RPT 100 FRHI (e.g., flame retardant-high impact).

As illustrated in FIGS. 21A–C, 22 and 23, the battery 50 can be configured to connect with an electrical device, such as the power tool 55. The power tool 55 includes a housing 400. The housing can provide a connection portion 405 to which the battery 50 can be connected. The connecting portion 405 can include one or more electrical device terminals (shown schematically in FIG. 22) to electrically connect the battery 50 to the power tool 55. The terminals included in the power tool 55 are configured to mate with the terminals 110, 115 and/or 120 included in the battery 50 and to receive power and/or information from the battery 50.

In some constructions, such as the constructions shown schematically in FIGS. 21A–C, the power tool 55 can include a microcontroller or microprocessor 420 to communicate with the battery 50, receive information from the battery 50, control operation of the power tool 55, and/or control the discharging process of the battery 50. In the illustrated construction, the power tool 55 can include a positive terminal 430 to connect to the positive terminal 110 of the battery 50, a negative terminal 435 to connect to the negative terminal 115 of the battery 50 and a sense terminal 440 to connect to the sense terminal 120 of the battery 50. The microprocessor 420 can be electrically connected to each of the terminals 430, 435 and 440.

The microprocessor 420 can communicate with the battery 50 or receive information from the battery 50 through the sense terminal 440 regardless whether the battery 50 includes a microprocessor, such as microprocessor 140, or not. In constructions in which the battery 50 includes a microprocessor, such as microprocessor 140, two-way communication can occur across the sense terminals 120 and 440. The microprocessors 140 and 420 can exchange information back and forth, such as battery characteristics, power tool operating time and power tool requirements (e.g., current and/or voltage ratings).

In constructions in which the battery 50 does not include a microprocessor, the microprocessor 420 periodically measures or detects one or more elements or components within the battery 50 to determine battery characteristics and/or battery operating information, such as, for example, battery chemistry, nominal voltage, present battery state of charge, cell voltages, temperature, etc. The microprocessor 420 can control the operation of the power tool 55 based on these and other battery characteristics and operating information.

For example, in some constructions, the microprocessor 420 can be programmed to detect the battery temperature and disable the power tool 55 if the battery temperature is above a threshold temperature. In this example, the microprocessor 420 periodically detects the resistance of a thermistor 150 located in the battery 50 and determines the temperature of the pack 50 during tool operation (i.e., when a motor 450 within the tool 55 is running). The microprocessor 420 then determines if the temperature of the battery 50 is within an appropriate operating range. This can be accomplished by storing one or more temperature ranges within the microprocessor 420, allowing the microprocessor 420 to compare the detected temperature of the battery 50 to the one or more ranges. If the temperature of the battery 50 is not within the appropriate operating range, the microprocessor 420 interrupts the current flow from the battery 50 and/or shuts down the motor 450. In some constructions, the microprocessor 420 continues to disable the motor 450 and/or interrupt the current flow from the battery 50 until the temperature of the battery 50 falls within the appropriate operating range. In some constructions in which the microprocessor 420 determines that the temperature of the battery 50 is not within an appropriate operating range, the microprocessor 420 will not disable the motor 450 until the microprocessor 420 detects a low discharge current being supplied to the motor 450 by the battery 50. In some constructions, the motor 450 is re-enabled (i.e., power tool 55 is operable) when the microprocessor 420 detects that the battery 50 is removed from the power tool 55.

In some constructions and in some aspects, the power tool 55 can also include a fan or blower 470 to force cooling air through the tool 55 and battery pack 50, as shown in FIG. 21B. The battery cells 80a, heat sinks 275, heat pipes (not shown) and/or power FET or switch 180, if included in the battery 50, can then be cooled by the passing air. In such a construction, the battery 50 and the power tool 55 include one or more vents to allow cooling air in and to allow heated air out. The power tool 55 includes one or more inlet vents 475 which, in the illustrated construction, are positioned substantially on top of the power tool housing 400. The power tool 55 also includes one or more outlet vents 480 which are positioned substantially on the bottom of the connecting portion 405 of the power tool 55. The outlet vents 480 included in the power tool 55 are also positioned such that the inlet vents (not shown) of the battery 50 are substantially beneath the outlet vents 480. In the illustrated construction, a motor 485 included in the power tool 55 powers the fan 470. In some constructions, a microprocessor 490 included in the power tool 55 controls the operation of the fan 470. The microprocessor 490 can activate the fan 470 during predetermined time intervals and/or if a high battery temperature is detected.

As sown in FIG. 21C, the circuit 130 included in the battery 50 can communicate state of charge information to the microcontroller 420 included in the power tool 55. In this construction, the microcontroller 420 in the power tool 55 can display the battery state of charge information on a fuel gauge 115a included on or in the housing of the tool 55. In this construction, the fuel gauge 155a can be similar to the fuel gauge 155 included in the battery 50 and can be operated in a similar fashion (e.g., in an automatic displaying mode, in a manual displaying mode, and the like). In some constructions, the fuel gauge 155a can include a push-button 160 and can include more or fewer LEDs (e.g., LEDS 170a–d) than shown and described.

Figure 23:
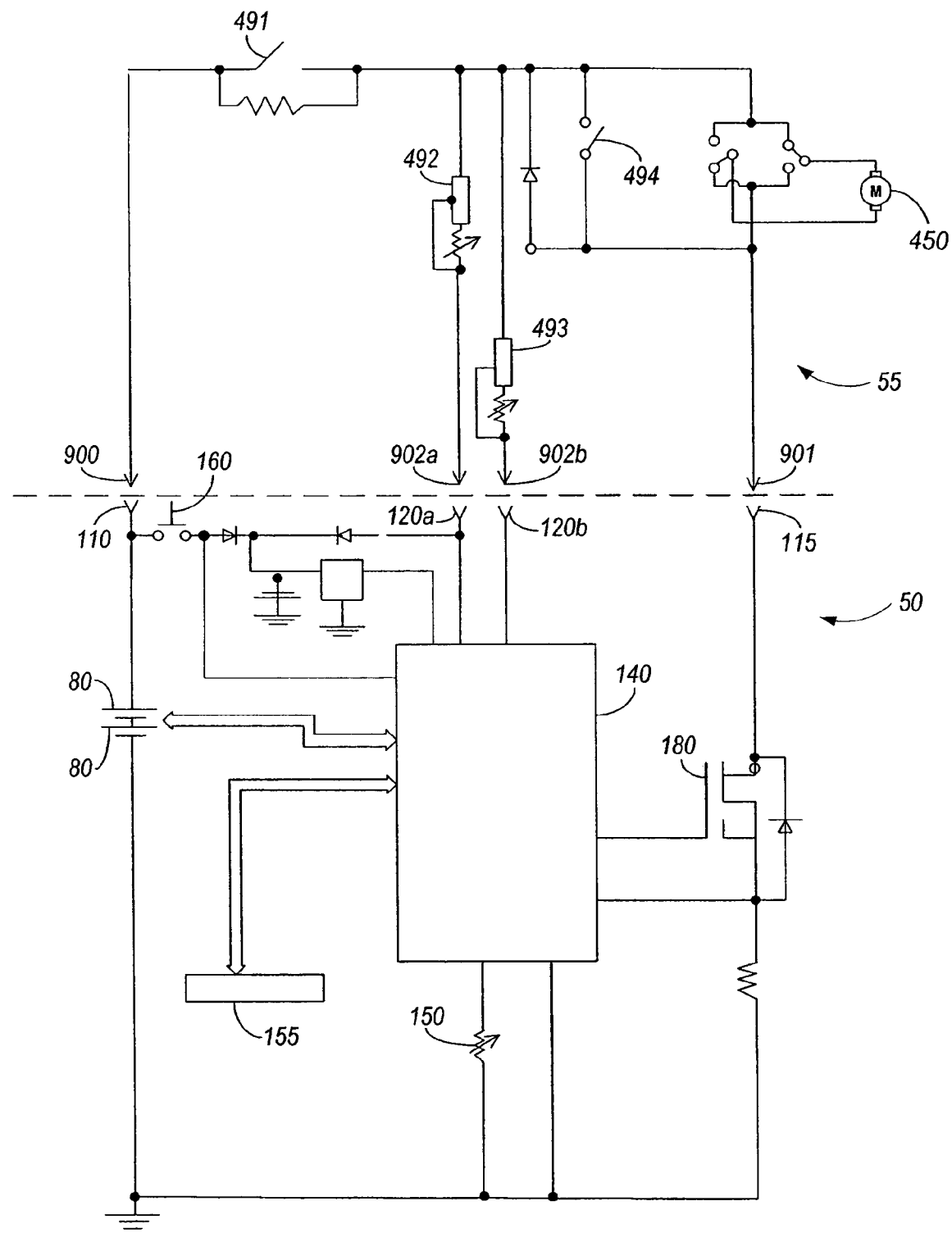
FIG. 23 is yet another schematic diagram of a battery, such as one of the batteries shown in FIGS. 1–3, in use with an electrical device, such as a power tool.

As shown in FIG. 23, the circuit 130 included in the battery 50 can also be used to control operation of an electrical device, such as a power tool 55. In the construction shown, the power tool 55 include a motor 450, a trigger switch 491 activated by a user, a speed control circuit 492, an electric clutch 493, and a brake 494. The tool 55 also includes a positive terminal 900 to connect to the positive terminal 105 of the battery 50, a negative terminal 901 to connect to the negative terminal 110 of the battery 50, and two sense terminals 902a and 902b to connect to two sense terminals 120a and 120b of the battery 50, respectfully. In other constructions, the power tool 55 and battery 50 can have more or fewer terminals than shown and described.

In this construction, the circuit 130 can provide tool speed control as well as monitor battery pack parameters or characteristics. The power MOSFET or switch 180 can control the switching function of the speed control circuit of the tool 55. In this construction, the power MOSFET used for the speed control circuit 492 can be included in the battery 50 rather than the power tool 55.

Figure 24:
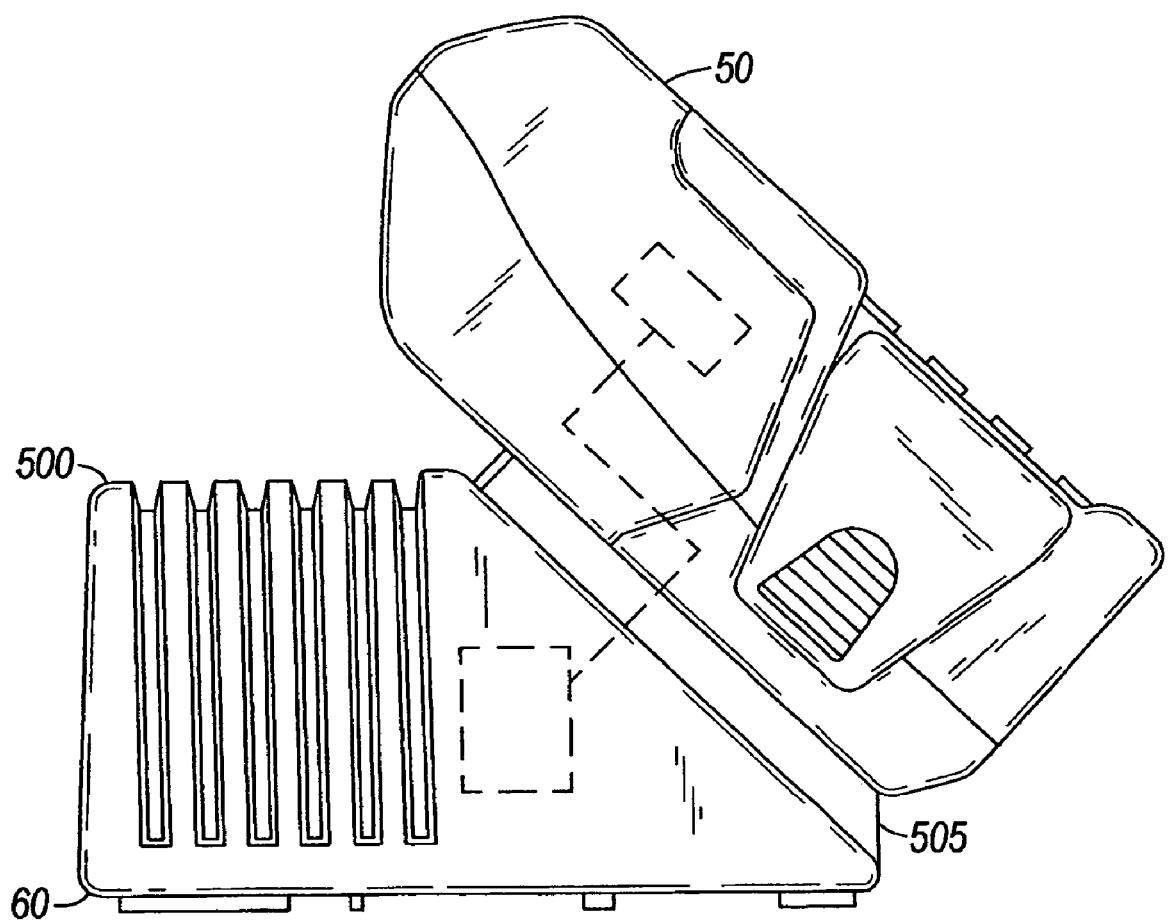
FIG. 24 is a side view of a battery, such as one of the batteries shown in FIGS. 1–3, in use with another electrical device, such as a battery charger.

As shown in FIG. 24, the battery 50 is also configured to connect with an electrical device, such as the battery charger 60. The battery charger 60 includes a housing 500. The housing 500 provides a connection portion 505 to which the battery 50 is connected. The connecting portion 505 includes one or more electrical device terminals (not shown) to electrically connect the battery 50 to the battery charger 60. The terminals included in the battery charger 60 are configured to mate with the terminals included in the battery 50 and to transfer and receive power and information from the battery 50.

In some constructions and in some aspects, the battery charger 60 also includes a microprocessor or microcontroller 510. The microcontroller 510 controls the transfer of power between the battery 50 and the battery charger 60. In some constructions, the microcontroller 510 controls the transfer of information between the battery 50 and the battery charger 60. In some constructions, the microcontroller 510 identifies and/or determines one or more characteristics or conditions of the battery 50 based on signals received from the battery 50. Also, the microcontroller 510 can control operation of the charger 60 based on identification characteristics of the battery 50.

In some constructions and in some aspects, the battery charger 60 bases the charging scheme or method for charging the battery 50 on the temperature of the battery 50. In one construction, the battery charger 60 supplies a charging current to the battery 50 while periodically detecting or monitoring the temperature of the battery 50. If the battery 50 does not include a microprocessor, the battery charger 60 periodically measures the resistance of a thermistor, such as thermistor 150, after predefined periods of time. If the battery 50 includes a microprocessor, such as microprocessor 140, then the battery charger 60 either: 1) interrogates the microprocessor 140 periodically to determine the battery temperature and/or if the battery temperature is outside an appropriate operating range(s); or 2) waits to receive a signal from the microprocessor 140 indicating that the battery temperature is not within an appropriate operating range.

In some constructions, once the battery temperature exceeds a predefined threshold or does not fall within an appropriate operating range, the battery charger 60 interrupts the charging current. The battery charger 60 continues to periodically detect or monitor the battery temperature or waits to receive a signal from the microprocessor 140 indicating that the battery temperature is within an appropriate operating range. When the battery temperature is within an appropriate operating range, the battery charger 60 may resume the charging current supplied to the battery 50. The battery charger 60 continues to monitor the battery temperature and continues to interrupt and resume the charging current based on the detected battery temperature. In some constructions, the battery charger 60 terminates charging after a predefined time period or when the present battery state of charge reaches a predefined threshold.

In some constructions and in some aspects, the battery 50 and/or the electrical devices, such as the power tool 55 and battery charger 60, are capable of detecting imbalanced battery cells within the battery 50. In some constructions, rather than monitoring each battery cell 80a–e individually, a microprocessor, such as, for example, the microprocessor 140, 420, 490 and/or 510 (the "monitoring microprocessor"), monitors only two groups of battery cells 80 and determines cell imbalance using a ratio of voltages of the two cell groups.

Figure 25:
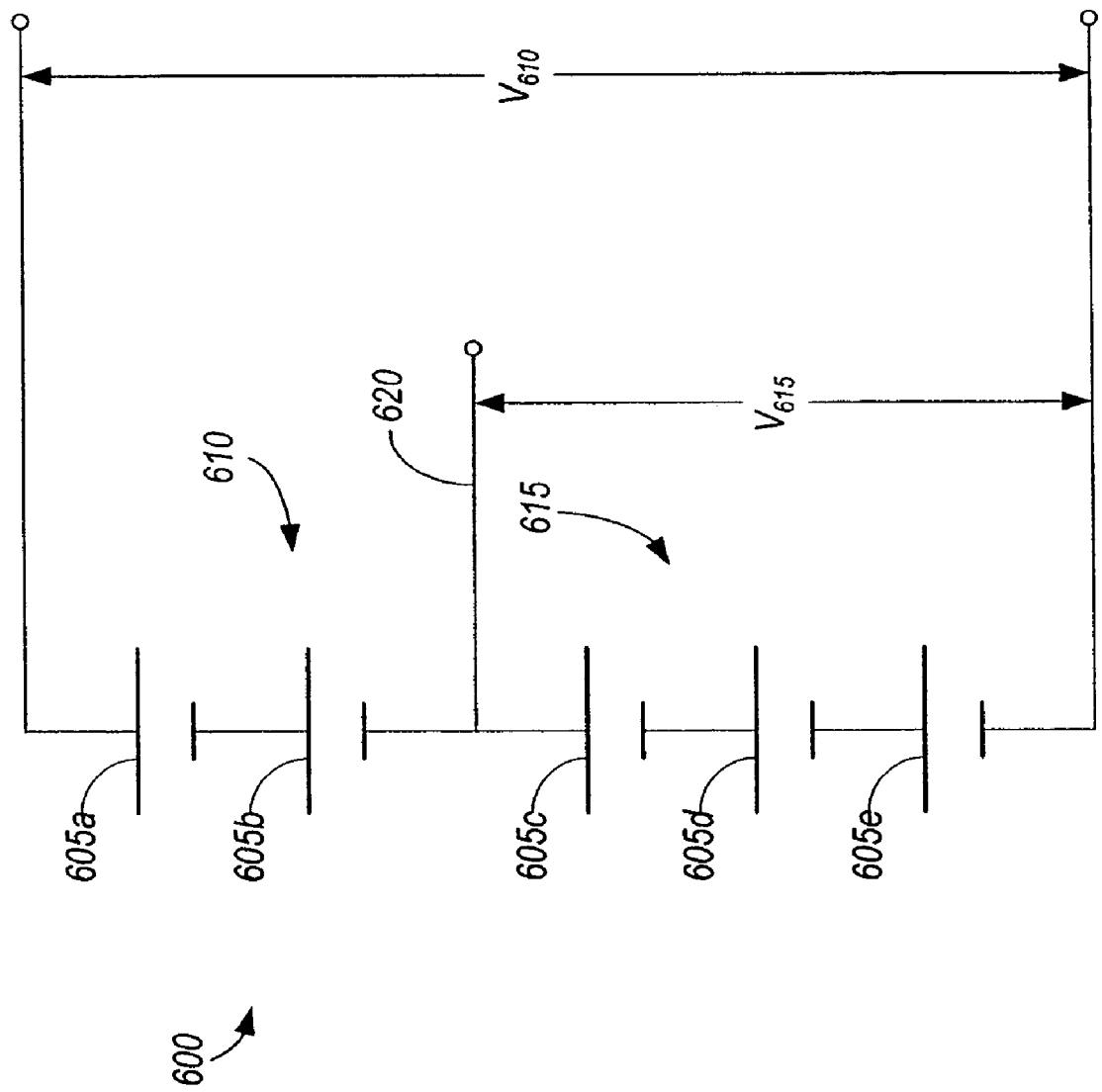
FIG. 25 is a partial schematic view of a battery, such as one of the batteries shown in FIGS. 1–3.

For example, a battery 600 is partially shown in FIG. 25. In some constructions, the battery 600 is similar to battery 50 and includes a microprocessor 140. In other constructions, the battery 600 does not include a microprocessor. In the illustrated construction, the battery 600 includes five battery cells 605a, 605b, 605c, 605d and 605e, each having substantially the same nominal voltage, such as, for example, approximately 4 V.

The battery cells 605a–e are arranged into two groups, group 610 and group 615. Group 610 includes battery cells 605a and 605b, and group 615 includes battery cells 605c, 605d and 605e.

The battery 600 also includes a lead or tap 620 which provides a voltage $V_{615}$ across group 615 (i.e., the total voltage of battery cells 605c, 605d and 605e). When the battery cells 605a–e are approximately fully charged, the voltage $V_{615}$ of group 615 equals approximately 12 V. The voltage $V_T$ is the voltage across all of the battery cells 605a–e. When the battery cells 605a–e are substantially fully charged, the voltage $V_T$ equals approximately 20 V.

The monitoring microprocessor is programmed to monitor voltages $V_{615}$ and $V_T$. In some constructions, the monitoring microprocessor monitors the voltages $V_{615}$ and $V_T$ either continuously or periodically and calculates a ratio R between the measured voltages $V_{695}$ and $V_T$. The ratio R is determined by the equation:

$$R = V_{615}/V_T$$

When the cells 605a–e are substantially balanced, the ratio R equals approximately 0.6. If one or more cells from the first group 610 are imbalanced (i.e., has a present cell state of charge or cell voltage lower than the other cells) during charging or discharging, the ratio R will be higher than 0.6. If one or more cells from the second group 615 are imbalanced during charging or discharging, the ratio R will be lower than 0.6. If two cells, one from the first group 610 and one from the second group 615 (e.g., cell 605a and cell 605e) are imbalanced during charging or discharging, the ratio R will be higher than 0.6. In other words, if an imbalanced cell occurs, the ratio R will deviate plus or minus from the balanced ratio of 0.6. If the monitoring microprocessor detects a cell imbalance, that is, calculates a ratio R substantially higher or lower than the balance ratio of 0.6, operation of the battery 600 (i.e., charging and/or discharging) is interrupted or changed. In some constructions and in some aspects, operation of the battery 600 is interrupted or changed when the ratio R is not included within the range of approximately 0.55 to approximately 0.65.

Figure 26:
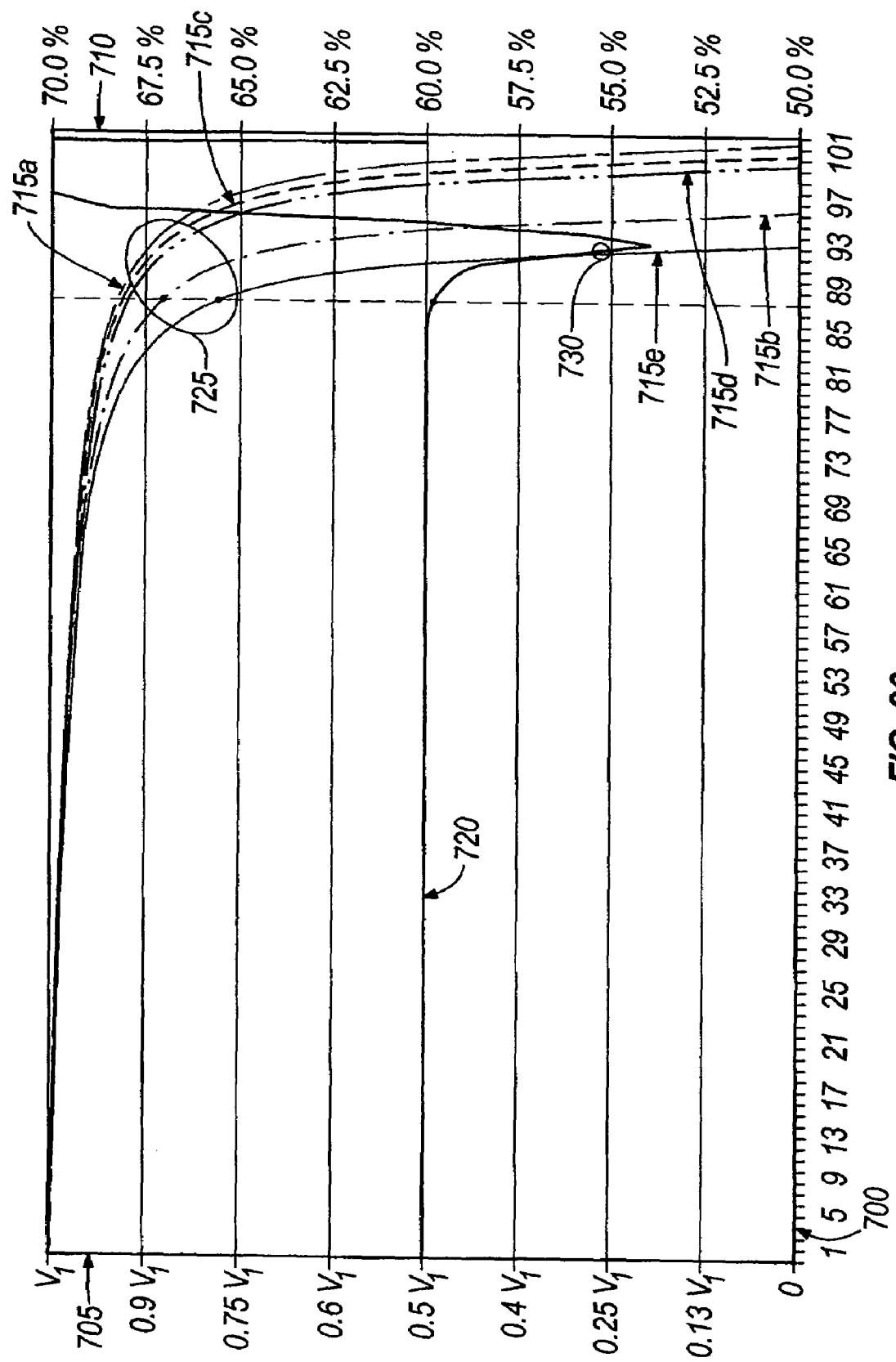
FIGS. 26–27 are graphs illustrating cell voltage and a ratio of cell voltages over time.
Figure 27:
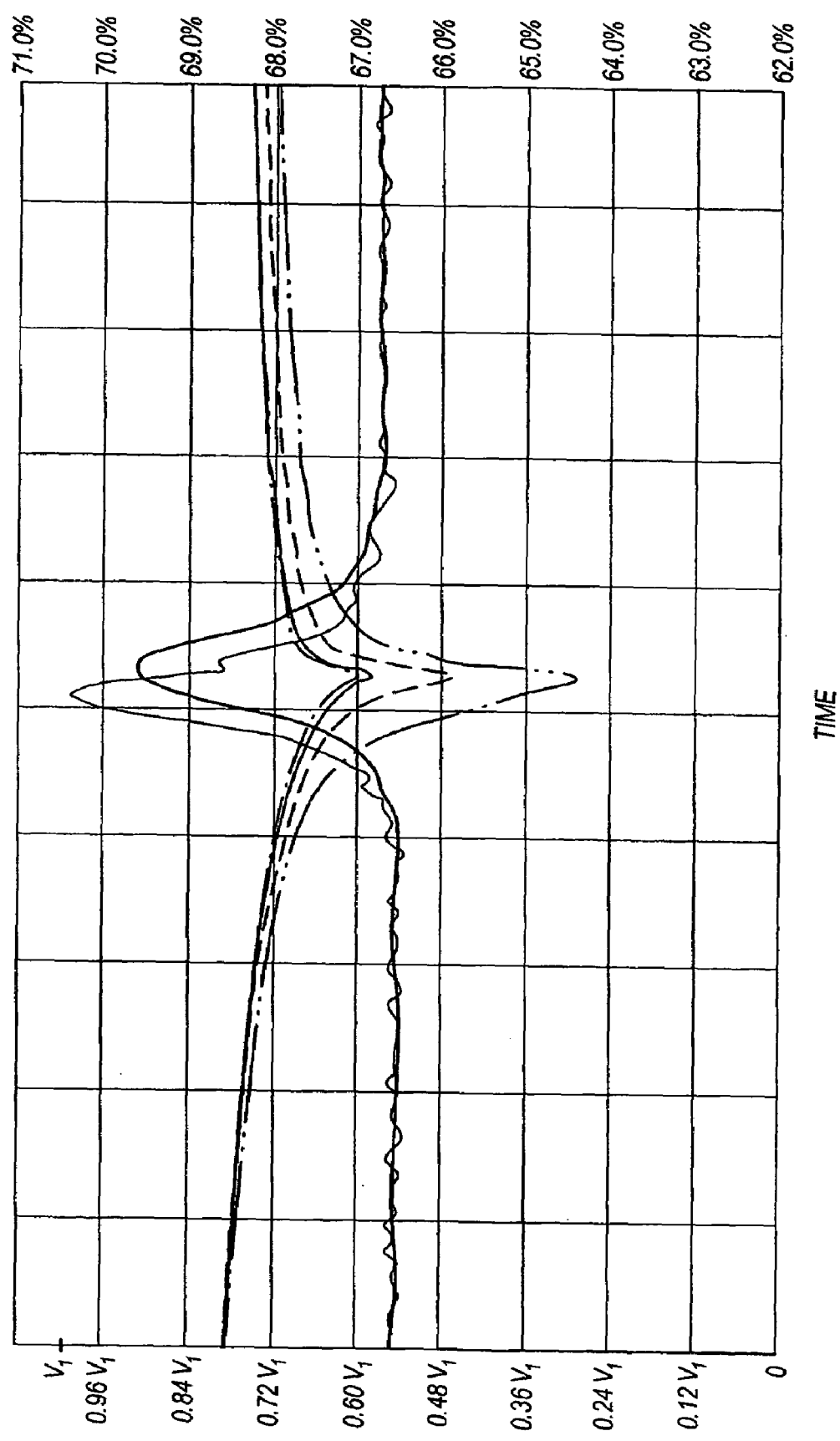

FIGS. 26 and 27 are a graphs which illustrates an example of approximately when an imbalance occurs within the battery 600 and how the ratio R deviates from its balanced ratio during this occurrence. In this example, each cell 605a–e has a nominal voltage of approximately 4 V, and the balanced ratio for ratio R is approximately 0.6 or 60.0%.

In the illustrated construction, axis 700 represents time in seconds, axis 705 represents voltage in volts, and axis 710 represents a ratio or a percentage in volts/volts. Line 715a represents the voltage of cell 605a over time, line 715b represents the voltage of cell 605b over time, and line 715c represents the voltage of cell 605c over time. Line 715d represents the voltage of cell 605d over time, line 715e represents the voltage of cell 605e over time, and line 720 represents the ratio R over time.

In the illustrated example, an imbalance (represented on the graph by numeral 725) occurs approximately at 86 seconds. The imbalance 725 is caused by cell 605e, which is included with group 615. At this time (t=86 s), the ratio 720 begins to decrease or deviate from the balanced ratio of 0.6 (i.e., 60%). Since the ratio 720 is decreasing, it can be determined that the imbalanced cell is within group 615. When the ratio R approaches 55.0% at approximately 91 seconds (indicated in FIG. 28 by the numeral 730), the voltage of cell 605e is approximately 1 V. In some constructions, the monitoring microprocessor detects that the ratio R has fallen to approximately 55.0% and then terminates operation of the battery 600 in order to avoid further discharge of cell 605e.

In some constructions, the monitoring microprocessor monitors the voltage of each battery cell instead of using a ratiometric method of monitoring, such as, for example, the microprocessor 140. As previously discussed, the battery 50 includes the plurality of resistors 260 for providing voltage measurements of the battery cells 80. The plurality of resistors 260 are arranged such that the microprocessor 140 can measure the voltage of each battery cells 80a–g approximately at the same time. In some constructions, the microprocessor 140 detects an imbalance within the battery 50 when one or more cells 80 reach approximately 1 V.

In some constructions and in some aspects, the battery 50 or 600 may re-balance the cells 80a–g or 605a–e when an imbalance has been detected. In some constructions, the monitoring microprocessor disables the battery 50 or 600 (e.g. interrupts battery operation, prevents battery operation, etc.) when the balanced ratio R is no longer included within an acceptable range. After the battery 50 or 600 is disabled, the monitoring microprocessor determines which cell(s) 80a–e or 605a–e is imbalanced (the "low voltage cell").

In some construction, the monitoring microprocessor activates or turns on the respective transistors, such as, for example, transistors 265a–f, that are electrically connected to those cells 80a–g or 605-a–e that are not low in present state of charge (i.e., cells having a higher present state of charge than the low voltage cell). The monitoring microprocessor begins a controlled discharge of the high present state of charge cells 80a–g or 605a–e. For example, the monitoring microprocessor will control the small discharge current that will flow from the balanced cells 80a–e or 605a–e through the respective transistors. The monitoring microprocessor will continue to make voltage measurements of the cells 80a–g or 605a–e throughout the controlled discharging process. The monitoring microprocessor will end the controlled discharge process when the present state of charge of the higher state of charge cells 80a–g or 605a–e is reduced to be approximately equal to the previously low voltage cell.

In some constructions, the monitoring microprocessor uses the controlled discharge process to power an indicator, such as, for example, blinking all of the LEDs 170a–d on the fuel gauge 155. In this construction, for example, the blinking LEDs 170a–d indicate to an operator or user that the battery 50 or 600 is disabled and/or is currently in the process of re-balancing the cells 80a–g or 605a–e.

Figure 28:
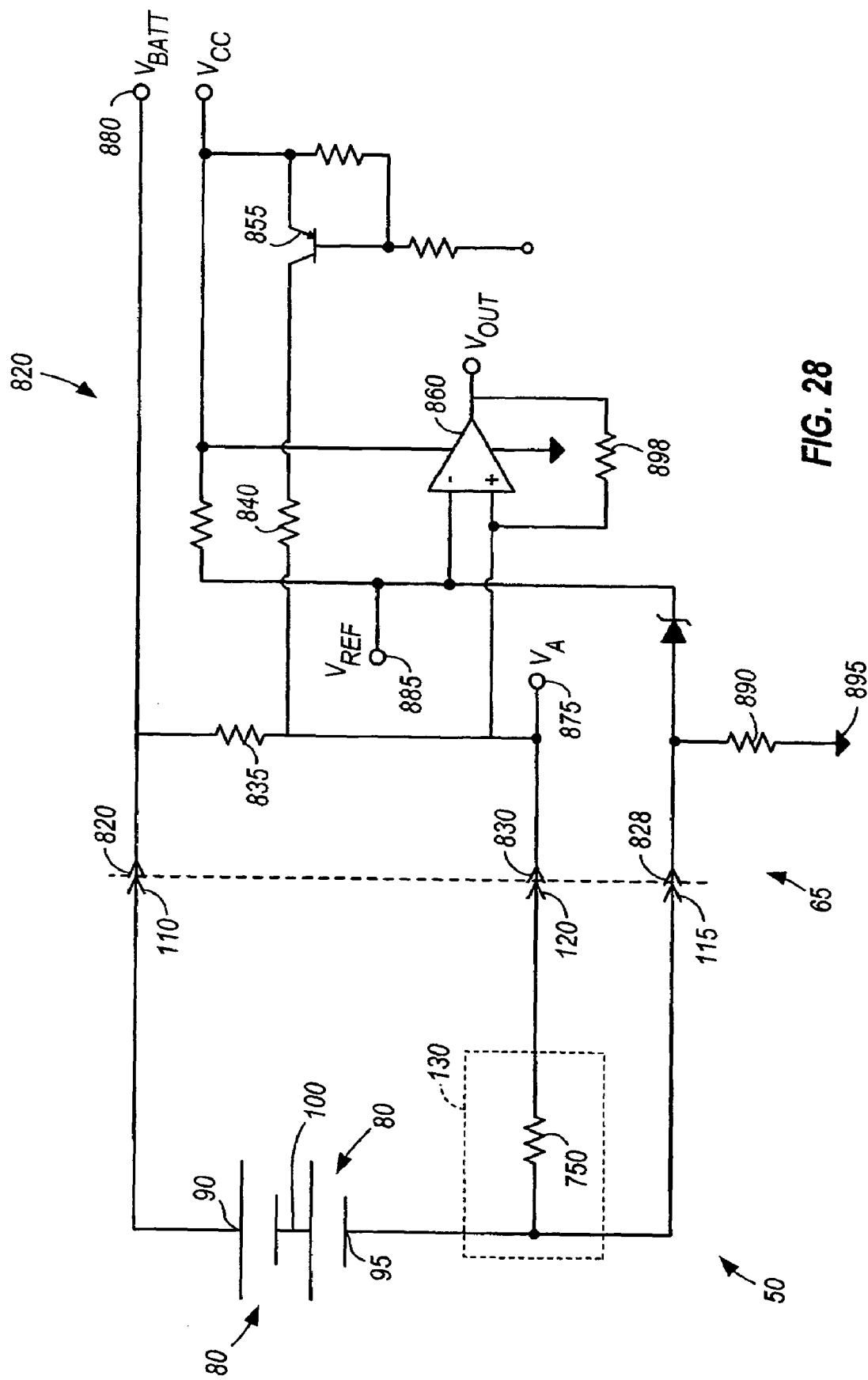
FIG. 28 is a schematic diagram of an construction of a battery charging system.

A further schematic diagram of the battery 50 is schematically illustrated in FIG. 28. In some constructions, the circuit 130 includes an electrical component such as, for example, an identification resistor 750, and the identification resistor 750 can have a set resistance. In other constructions, the electrical component may be a capacitor, an inductor, a transistor, a semiconducting element, an electrical circuit or another component having a resistance or capable of sending an electrical signal such as, for example, a microprocessor, a digital logic component and the like. In the illustrated construction, the resistance value of the identification resistor 750 can be chosen based on characteristics of the battery 50, such as the nominal voltage and the chemistry of the battery cells 80. A sense terminal 120 can electrically connect to the identification resistor 750.

The battery 50, shown schematically in FIG. 28, can electrically connect to an electrical device, such as a battery charger 820 (also shown schematically) to receive or transfer power. The battery charger 820 can include a positive terminal 825, a negative terminal 828 and a sense terminal 830. Each terminal 820, 828, 830 of the battery charger 820 can electrically connect to the corresponding terminal 110, 115, 120 (respectively), of the battery 50. The battery charger 820 also can include a circuit having electrical components, such as, for example, a first resistor 835, a second resistor 840, a solid-state electronic device or semiconductor 855, a comparator 860 and a processor or microcontroller (not shown). In some constructions, the semiconductor 855 can include a transistor capable of operating in saturation or an "ON" state and capable of operating in cut-off or an "OFF" state. In some constructions, the comparator 860 can be a dedicated voltage monitoring device, a microprocessor or a processing unit. In other constructions, the comparator 860 can be included in the microcontroller (not shown).

In some constructions, the microcontroller (not shown) can be programmed to identify the resistance value of the electrical component in the battery 50, such as the identification resistor 750. The microcontroller can also be programmed to determine one or more characteristics of the battery 50, such as, for example, the battery chemistry and the nominal voltage of the battery 50. As previously mentioned, the resistance value of the identification resistor 750 may correspond to a dedicated value associated with one or more certain battery characteristics. For example, the resistance value of the identification resistor 750 can be included in a range of resistance values corresponding to the chemistry and to the nominal voltage of the battery 50.

In some constructions, the microcontroller can be programmed to recognize a plurality of resistance ranges of the identification resistor 750. In these constructions, each range corresponds to one battery chemistry, such as, for example, NiCd, NiMH, Li-ion, and the like. In some constructions, the microcontroller can recognize additional resistance ranges, each corresponding to another battery chemistry or another battery characteristic.

In some constructions, the microcontroller can be programmed to recognize a plurality of voltage ranges. The voltages included in the voltage ranges can be dependent on or correspond to the resistance value of the identification resistor 750, such that the microcontroller can determine the value of the resistor 750 based on the measured voltage.

In some constructions, the resistance value of the identification resistor 750 can be further chosen to be unique for each possible nominal voltage value of the battery 50. For example, in one range of resistance values, a first dedicated resistance value can correspond to a nominal voltage of 21 V, a second dedicated resistance value can correspond to a nominal voltage of 16.8 V, and a third dedicated resistance value can correspond to a nominal voltage of 12.6 V. In some constructions, there can be more or fewer dedicated resistance values, each corresponding to a possible nominal voltage of the battery 50 associated with the resistance range.

In an exemplary implementation, the battery 50 electrically connects to the battery charger 820. To identify a first battery characteristic, the semiconductor 855 switches to the "ON" state under the control of additional circuitry (not shown). When the semiconductor 855 is in the "ON" state, the identification resistor 750 and resistors 835 and 840 create a voltage divider network. The network establishes a voltage $V_A$ at a first reference point 875. If the resistance value of the resistor 840 is significantly lower than the resistance value of the resistor 835, then the voltage $V_A$ will be dependent upon the resistance values of the identification resistor 750 and the resistor 840. In this implementation, the voltage $V_A$ is in a range determined by the resistance value of the identification resistor 750. The microcontroller (not shown) measures the voltage $V_A$ at the first reference point 875 and determines the resistance value of the identification resistor 750 based on the voltage $V_A$. In some constructions, the microcontroller compares the voltage $V_A$ to a plurality of voltage ranges to determine the battery characteristic.

In some constructions, the first battery characteristic to be identified can include the battery chemistry. For example, any resistance value below 150 k ohms may indicate that the battery 50 has a chemistry of NiCd or NiMH, and any resistance value approximately 150 k ohms or above may indicate that the battery 50 has a chemistry of Li or Li-ion. Once the microcontroller determines and identifies the chemistry of the battery 50, an appropriate charging algorithm or method may be selected. In other constructions, there are more resistance ranges which each correspond to another battery chemistry than in the above example.

Continuing with the exemplary implementation, to identify a second battery characteristic, the semiconductor 855 switches to the "OFF" state under the control of the additional circuitry. When the semiconductor 855 switches to the "OFF" state, the identification resistor 750 and the resistor 835 create a voltage divider network. The voltage $V_A$ at the first reference point 875 is now determined by the resistance values of the identification resistor 750 and the resistor 835. The resistance value of the identification resistor 750 is chosen such that, when the voltage $V_{BATT}$ at a second reference point 880 substantially equals the nominal voltage of the battery 50, the voltage $V_A$ at the first reference point 875 substantially equals a voltage $V_{REF}$ at a third reference point 885. If the voltage $V_A$ at the first reference point 875 exceeds the fixed voltage $V_{REF}$ at the third reference point 885, an output $V_{OUT}$ of the comparator 860 changes state. In some constructions, the output $V_{OUT}$ can be used to terminate charging or to serve as an indicator to commence additional functions, such as a maintenance routine, an equalization routine, a discharging function, additional charging schemes, and the like. In some constructions, voltage $V_{REF}$ can be a fixed reference voltage.

In some constructions, the second battery characteristic to be identified can include a nominal voltage of the battery 50. For example, a general equation for calculating the resistance value for the identification resistor 750 can be:

$$R_{100} = \frac{V_{REF} \cdot R_{135}}{V_{BATT} - V_{REF}}$$

wherein $R_{100}$ is the resistance value of the identification resistor 750, $R_{135}$ is the resistance value of the resistor 835, $V_{BATT}$ is the nominal voltage of the battery 50 and $V_{REF}$ is a fixed voltage, such as, for example, approximately 2.5 V. For example, in the range of resistance values for the Li-ion chemistry (set forth above), a resistance value of approximately 150 k ohms for the identification resistor 750 can correspond to a nominal voltage of approximately 21 V, a resistance value of approximately 194 k ohms can correspond to a nominal voltage of approximately 16.8 V, and a resistance value of approximately 274.7 k ohms can correspond to a nominal voltage of approximately 12.6 V. In other constructions, more or fewer dedicated resistance values may correspond to additional or different battery pack nominal voltage values.

In the illustrated construction, both the identification resistor 750 and the third reference point 885 may be situated on the "high" side of a current sense resistor 890. Positioning the identification resistor 750 and the third reference point 885 in this manner can reduce any relative voltage fluctuations between $V_A$ and $V_{REF}$ when a charging current is present. Voltage fluctuations may appear in voltage $V_A$ if the identification resistor 750 and the third reference point 885 were referenced to ground 895 and a charging current was applied to the battery 50.

In some constructions, the battery charger 820 can also include a charger control function. As previously discussed, when the voltage $V_A$ substantially equals the voltage $V_{REF}$ (indicative of voltage $V_{BATT}$ equaling the nominal voltage of battery 50), the output $V_{OUT}$ of the comparator 860 changes state. In some constructions, the charging current is no longer supplied to the battery 50 when the output $V_{OUT}$ of the comparator 860 changes state. Once the charging current is interrupted, the battery voltage $V_{BATT}$ begins to decrease. When voltage $V_{BATT}$ reaches a low threshold, the output $V_{OUT}$ of the comparator 860 changes state again. In some constructions, the low threshold of voltage $V_{BATT}$ is determined by a resistance value of a hysteresis resistor 898. The charging current is reestablished once the output $V_{OUT}$ of the comparator 860 changes state again. In some constructions, this cycle repeats for a predefined amount of time as determined by the microcontroller or repeats for a certain amount of state changes made by the comparator 860. In some constructions, this cycle repeats until the battery 50 is removed from the battery charger 820.

In some constructions and in some aspects, the circuit 130 of the battery 50 can also indicate one or more battery characteristics. In some constructions, the battery characteristics include, for example, a nominal voltage and a temperature of the battery 50. The circuit 130 includes an electrical identification component or identification resistor 910, a temperature-sensing device or thermistor 914, a first current-limiting device or protection diode 918, a second current-limiting device or protection diode 922 and a capacitor 926. The identification resistor 910 has a set resistance value which corresponds to one or more certain battery characteristics. In some constructions, the resistance value of the identification resistor 910 corresponds with the nominal voltage of the battery 50 or the battery cell 80. In some constructions, the resistance value corresponds with the chemistry of the battery 50. In some constructions, the resistance value corresponds with two or more battery characteristics or corresponds with different battery characteristic(s). The resistance value of the thermistor 914 is indicative of the temperature of the battery cell 80 and changes as the temperature of the battery cell 80 changes. A sense terminal 930 electrically connects to the circuit 130.

Figure 29:
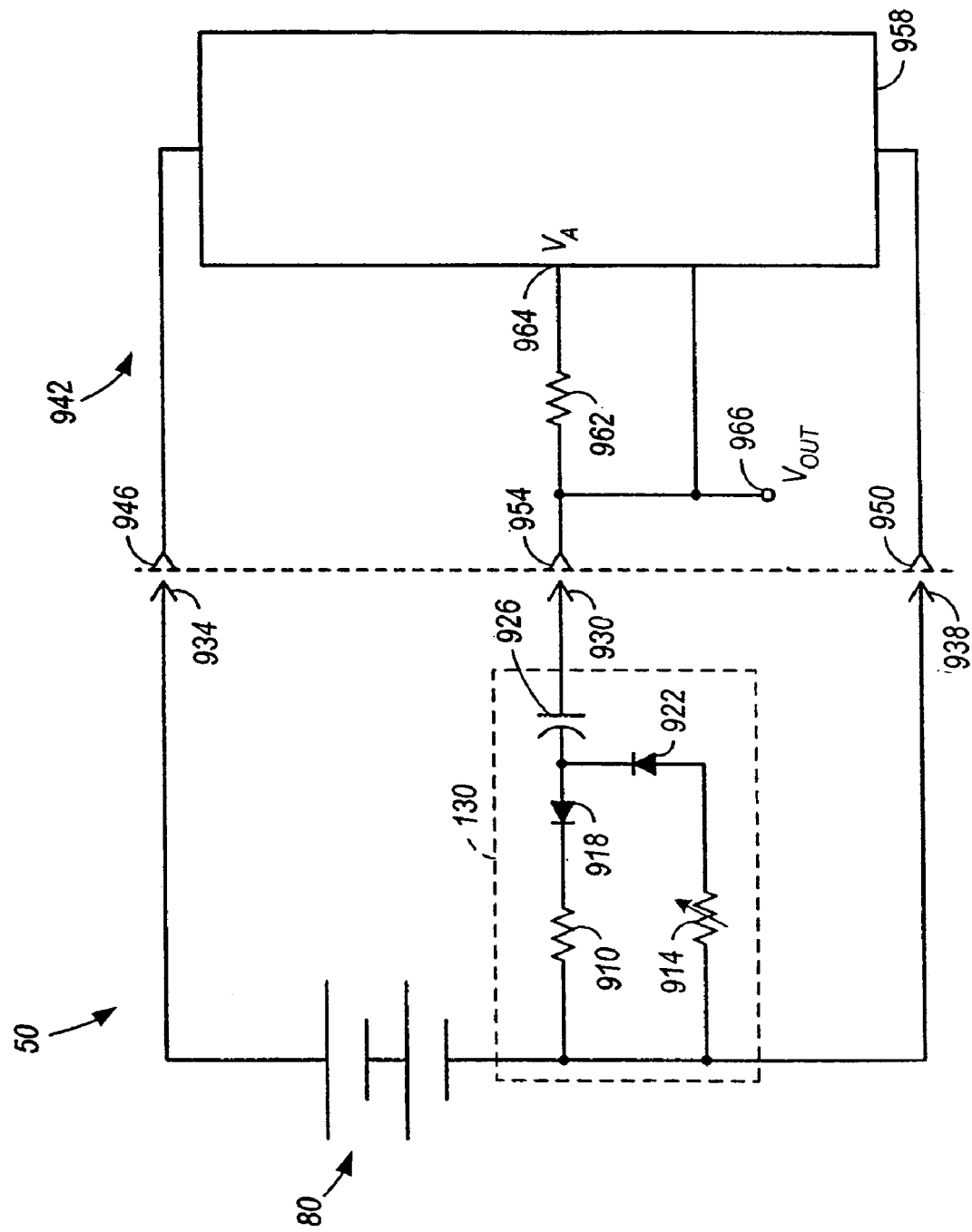
FIG. 29 is a schematic diagram of another construction of the battery charging system.

The battery 50, shown schematically in FIG. 29, electrically connects to an electrical device, such as a battery charger 942 (also shown schematically). The battery charger 942 includes a positive terminal 946, a negative terminal 950 and a sense terminal 954. In a manner similar to the battery 50 and battery charger 820 illustrated in FIG. 28, the positive terminal 934, the negative terminal 938 and the sense terminal 930 of the battery 50 electrically connect to the positive terminal 946, the negative terminal 950 and the sense terminal 954, respectively, of the battery charger 942. The battery charger 942 also includes control circuitry, such as a control device, processor, microcontroller or controller 958 and an electrical component or resistor 962.

Figure 30B:
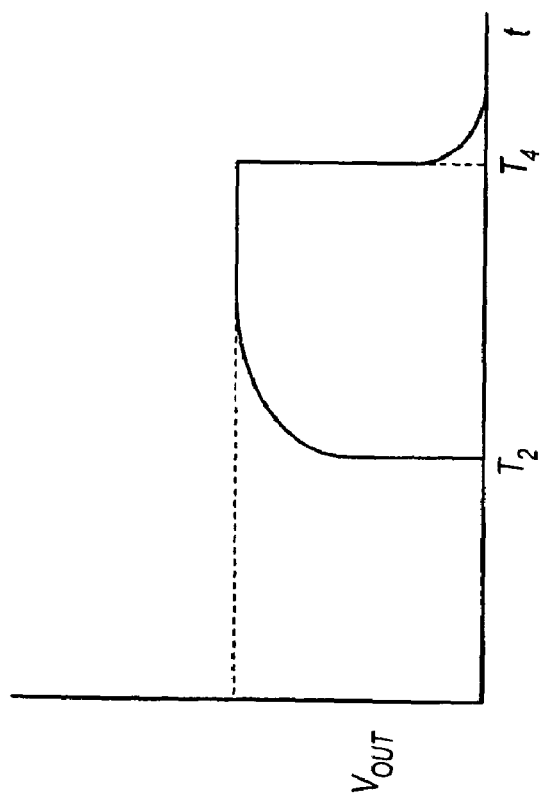
FIGS. 30A–B illustrate the operation of the battery charging system as shown in FIG. 29.
Figure 30A:
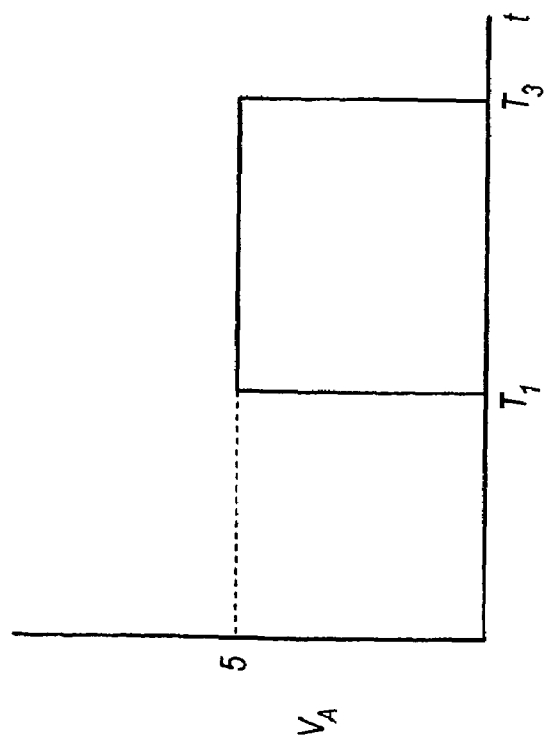

The operation of the battery 50 and battery charger 942 will be discussed with reference to FIGS. 29 and 30A–B. In some constructions, when the battery 50 electrically connects to the battery charger 942 and the capacitor 926 is initially discharged, the controller 958 increases a voltage $V_A$ at a first reference point 964 to approximately a first threshold. In some constructions, the first threshold is approximately 5 V. As shown in FIG. 30A, the controller 958 increases the voltage $V_A$ to the first threshold at approximately a time $T_1$.

When the first threshold is applied to the first reference point 964, a first current path is established within the battery 50 and battery charger 942. The first current path includes the resistor 962, the capacitor 926, the first diode 918 and the identification resistor 910. Once the voltage $V_A$ is raised to approximately the first threshold, the controller

958 measures the voltage $V_{OUT}$ at a second reference point 966. The voltage $V_{OUT}$ at the second reference point 966 quickly rises to a voltage determined by a voltage divider network comprised of the identification resistor 910, the resistor 962 and the forward voltage drop across the diode 918. In some constructions, voltage $V_{OUT}$ will range from approximately 0 V to slightly less than voltage $V_A$. As shown in FIG. 30B, a rise in the voltage $V_{OUT}$ occurs approximately at a time $T_2$, and the controller 958 measures the voltage $V_{OUT}$ at approximately the time $T_2$ or slightly after time $T_2$. In some constructions, time $T_2$ is approximately equal to time $T_1$. In some constructions, time $T_2$ occurs almost immediately after time $T_1$. Time $T_2$ may be later based on tolerances in measurement.

In one construction, the voltage $V_{OUT}$ measured by the controller 958 corresponds to a resistance value for the identification resistor 910. That resistance value corresponds to the nominal voltage of the battery 50. In some constructions, as the resistance value of the identification resistor 910 decreases, the voltage $V_{OUT}$ also decreases.

In the illustrated construction, the voltage $V_{OUT}$ eventually rises to approximately the voltage $V_A$ once the capacitor 926 becomes fully charged. After the capacitor 926 is fully charged, the controller 958 decreases the voltage $V_A$ at the first reference point 964 to a second threshold. In some constructions, the second threshold is approximately 0 V. As shown in FIG. 30A, the controller 958 decreased the voltage $V_A$ to the second threshold at approximately a time $T_3$.

When the second threshold is applied to the first reference point 964, a second current path is established within the battery 50 and battery charger 942. The second current path includes the resistor 962, the capacitor 926, the second diode 922 and the thermistor 914. Once the voltage $V_A$ is lowered to approximately the second threshold, the controller 958 measures the voltage $V_{OUT}$ again at the second reference point 966. The voltage $V_{OUT}$ at the second reference point 966 quickly decreases to a voltage determined by a voltage divider network comprised of the thermistor 914, the resistor 962 and the forward voltage drop across diode 922. In some constructions, $V_{OUT}$ will range from approximately 0 V to slightly less than voltage $V_A$. As shown in FIG. 30B, a decrease in the voltage $V_{OUT}$ occurs approximately at a time $T_4$, and the controller 958 measures the voltage $V_{OUT}$ at approximately the time $T_4$ or slightly after time $T_4$. In some constructions, time $T_4$ is approximately equal to time $T_3$. In some constructions, time $T_4$ occurs almost immediately after time $T_3$. Time $T_4$ may be later based on tolerances in measurement.

In one construction, the voltage $V_{OUT}$ measured by the controller 958 at time $T_4$ corresponds to a resistance value for the thermistor 914. That resistance value corresponds to the temperature of the battery 50. In some constructions, as the resistance value of the thermistor 914 decreases, the voltage $V_{OUT}$ increases.

In some constructions, the capacitor 926 provides a DC blocking function. The capacitor 926 prevents existing battery chargers (e.g., battery chargers which do not recognize newer power tool battery chemistries, such as, for example, the Li or Li-ion chemistries, and which do not have the required corresponding charging algorithms for such newer chemistries) from being able to charge a battery pack having the circuit 130.

Figure 32:
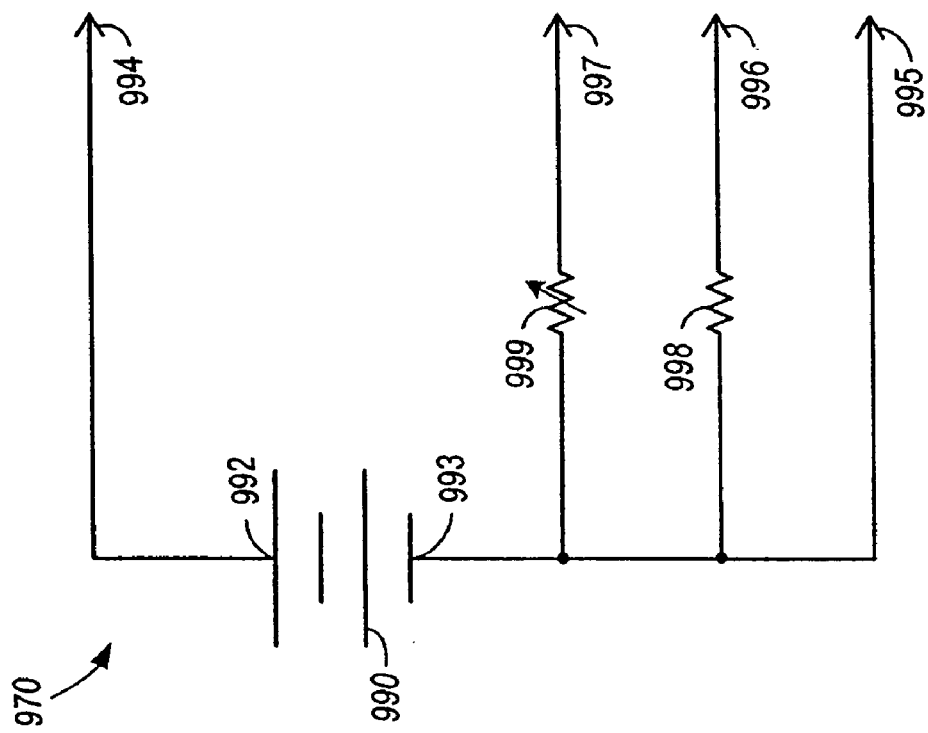
FIG. 32 is a schematic diagram of a battery included in a further construction of the battery charging system.
Figure 31:
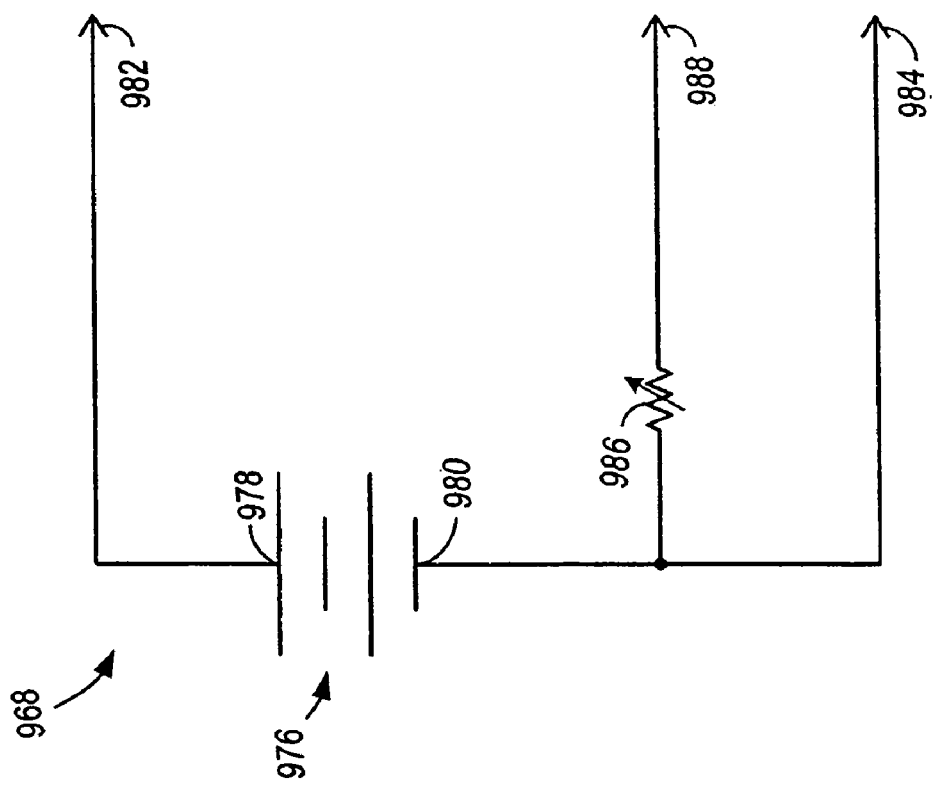
FIG. 31 is a schematic diagram of a prior art battery.

An existing power tool battery 968 is schematically illustrated in FIG. 31, and a further construction of a battery 970 is schematically illustrated in FIG. 32. Referring to FIGS. 31–34, another battery charging system includes both batteries 968 and 970, an existing battery charger 972 (shown in FIG. 33) and a battery charger 974 (shown in FIG. 34) embodying aspects of the invention.

Referring to FIG. 31, the existing battery 968 includes one or more battery cells 976 each having a chemistry and providing a nominal voltage. Typically, the chemistry of the battery cell 976 is lead-acid, NiCd or NiMH. The battery cell 976 includes a positive end 978 and a negative end 980. A positive terminal 982 electrically connects to the positive end 978 of the cell 976, and a negative terminal 984 electrically connects to the negative end 980 of the cell 976.

The battery 968 also includes an electrical component or thermistor 986. The resistance value of the thermistor 986 is indicative of the temperature of the battery cell 976 and changes as the temperature of the battery cell 976 changes. In some constructions, the resistance value of the thermistor 986 is included in a first range of resistance values. The existing battery charger 972 is capable of identifying a resistance value of the thermistor 986 within this first range and charge the existing battery 968 accordingly. For example, this first range of resistance values includes the resistance values approximately equal to and less than 130 k ohms. If the resistance value of the thermistor 986 is not included in the first range of resistance values, the existing battery charger 972 cannot charge the existing battery 968. The existing battery 968 also includes a sense terminal 988 electrically connected to the thermistor 986.

As shown in FIG. 32, the battery 970 includes one or more battery cells 990 each having a chemistry and providing a nominal voltage of the battery 970. Typically, the chemistry of the battery cell 990 includes, for example, Li, Li-ion or another Li-based chemistry. The battery cell 990 includes a positive end 992 and a negative end 993. A positive terminal 994 electrically connects to the positive end 992 of the cell 990, and a negative terminal 995 electrically connects to the negative end 993 of the cell 990.

The battery 970 also includes two sense terminals 996 and 997. The first sense terminal 996 electrically connects to a first electrical component or an identification resistor 998, and the second sense terminal 997 electrically connects to a second electrical component or a temperature-sensing device or thermistor 999. In some constructions, the resistance value of the identification resistor 998 is not included in the first range of resistance values that can be identified by the existing battery charger 972. For example, the resistance value of the identification resistor 998 is approximately equal to or greater than 150 k ohms. The resistance value of the thermistor 986 is indicative of the temperature of the battery cell 990 and changes as the temperature of the battery cell 990 changes.

Figure 34:
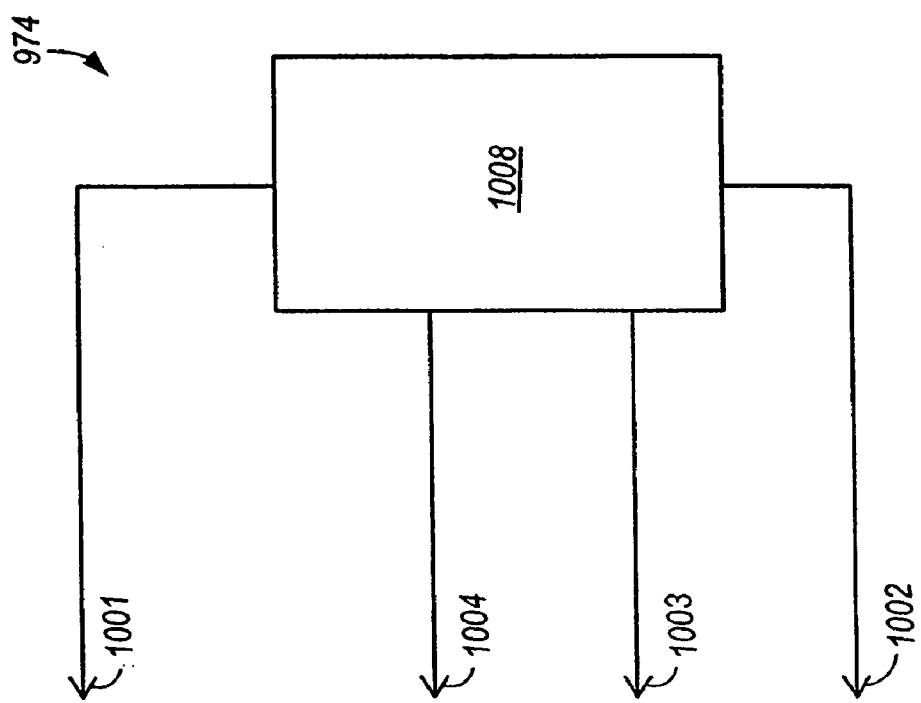
FIG. 34 is a schematic diagram of a battery charger included in the further

As shown in FIG. 34 and in most constructions, the battery charger 974 includes a positive terminal 1001, a negative terminal 1002, a first sense terminal 1003 and a second sense terminal 1004. The first sense terminal 1003 of the battery charger 974 electrically connects to either the first sense terminal 996 of battery 970 or to the sense terminal 988 of the existing battery 968.

Figure 33:
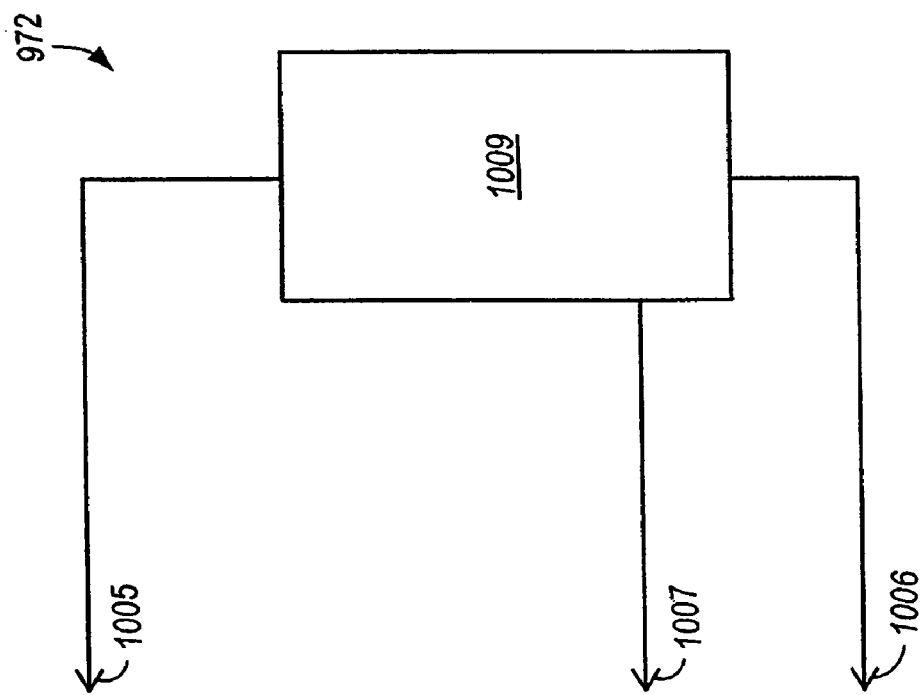
FIG. 33 is a schematic diagram of a prior art battery charger.

As shown in FIG. 33 and in some constructions, the existing battery charger 972 includes a positive terminal 1005, a negative terminal 1006 and a sense terminal 1007. The sense terminal 1007 of the existing battery charger 972 electrically connects to either the first sense terminal 996 of the battery 970 or to the sense terminal 988 of the existing battery 968.

When the existing battery 968 electrically connects to the battery charger 974, the second sense terminal 1004 of the battery charger 974 is not electrically connected to any battery terminal. In some constructions, a control device, microprocessor, microcontroller or controller 1008 included in the new battery charger 974 determines the resistance value of the thermistor 986 through the first sense terminal 1003 and identifies the battery 968 as having a NiCd or NiMH chemistry. The controller 1008 selects an appropriate charging method or algorithm for the existing battery 968 based on the chemistry and the temperature of the battery 968. The battery charger 974 charges the existing battery 968 accordingly.

When the battery 970 electrically connects to the battery charger 974, the second sense terminal 1004 of the battery charger 974 electrically connects to the second sense terminal 997 of the battery 970. In some constructions, the controller 1008 determines the resistance value of the identification resistor 998 and identifies the battery 970 as having, for example, a Li, Li-ion or another Li-based chemistry. For example, a resistance value of approximately 150 k ohms or greater for the identification resistor 998 corresponds to Li, Li-ion or another Li-based chemistry.

In some constructions, the resistance value of the identification resistor 998 is further chosen based on the nominal voltage of the battery 970. For example, a resistance value of approximately 150 k ohms for the identification resistor 998 indicates that the battery 970 has a nominal voltage of approximately 21 V. A resistance value of approximately 300 k ohms corresponds to a nominal voltage of approximately 16.8 V, and a resistance value of approximately 450 k ohms corresponds to a nominal voltage of approximately 12.6 V. In some constructions, as the resistance value of the identification resistor 998 increases, the nominal voltage of the battery 970 decreases. In some constructions, the controller 1008 also determines the resistance value of the thermistor 385. The controller 1008 selects an appropriate charging method or algorithm for the battery 970 based on its chemistry, nominal voltage and/or temperature. The battery charger 974 charges the battery 970 accordingly.

When the existing battery 968 is electrically connected to the existing battery charger 972, the sense terminal 1007 of the battery charger 972 electrically connects to the sense terminal 988 of the existing battery 968. In some constructions, the microcontroller 1009 included in the existing battery charger 972 determines the resistance value of the thermistor 986 and identifies the battery 968 as having a NiCd or NiMH chemistry, if the resistance value of the thermistor 986 is included in the first range of resistance values. The existing battery charger 972 determines the temperature of the existing battery 968 based on the resistance value of the thermistor 986 and selects an appropriate charging method or algorithm for the battery 968 based on its temperature. The existing battery charger 972 charges the existing battery 968 accordingly.

When the battery 970 is electrically connected to the existing battery charger 972, the sense terminal 1007 of the existing battery charger 972 electrically connects to the first sense terminal 996 of the battery 970. The second sense terminal 997 of the battery 970 is not electrically connected to any battery charger terminal of the existing battery charger 972. In some constructions, the microcontroller 1009 determines the resistance value of the identification resistor 998. In some constructions, the resistance value of the identification resistor 998 is not included in the first range of resistance values that are recognized by the microcontroller 1009. Since the microcontroller 1009 cannot identify the battery 970, the existing battery charger 972 does not implement a charging method or algorithm. The battery 970 is electronically prevented or "locked-out" from being charged by the existing battery charger 972.

Another battery 1030 embodying aspects of the invention is illustrated in FIGS. 35–37, 40–41, 48A, 49–52. The battery 1030 can be similar to the battery 50 illustrated in FIGS. 1–5. For example, the battery 1030 can be connectable to an electrical device or equipment, such as, for example, a cordless power tool 1034 (shown in FIG. 48A) to selectively power the power tool 1034. The battery 1030 can be removable from the power tool 1034 and can be rechargeable by a battery charger 1038 (shown in FIGS. 40–44).

Figure 35:
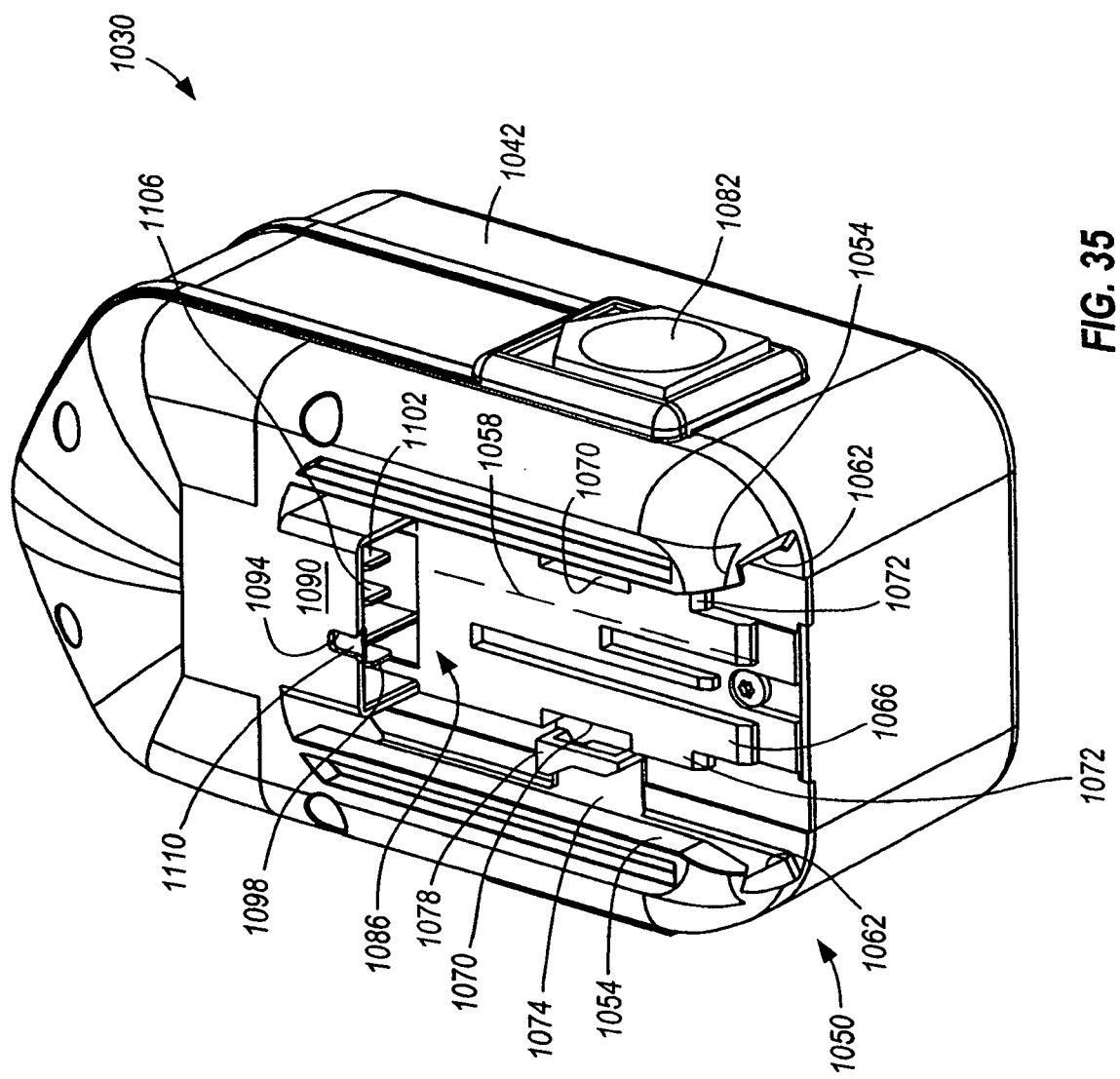
FIG. 35 is a perspective view of a battery.
Figure 36:
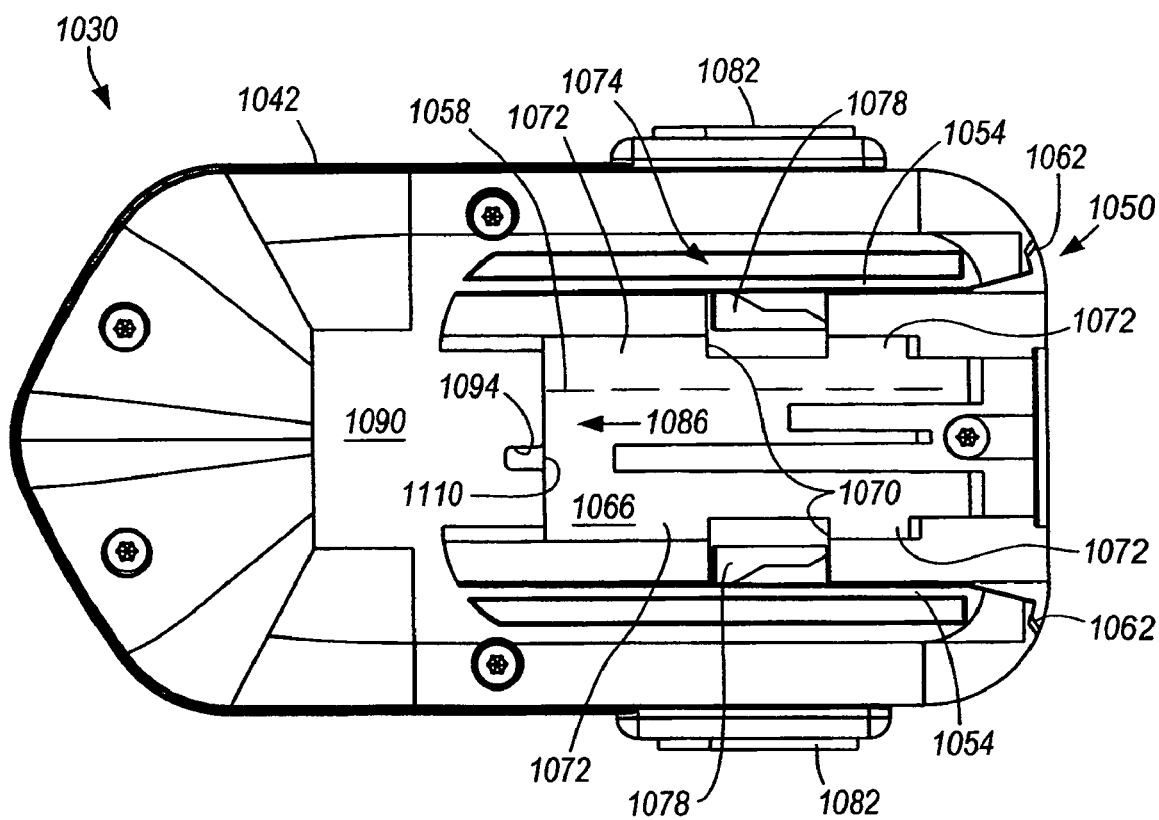
FIG. 36 is a top view of the battery shown in FIG. 35.
Figure 37:
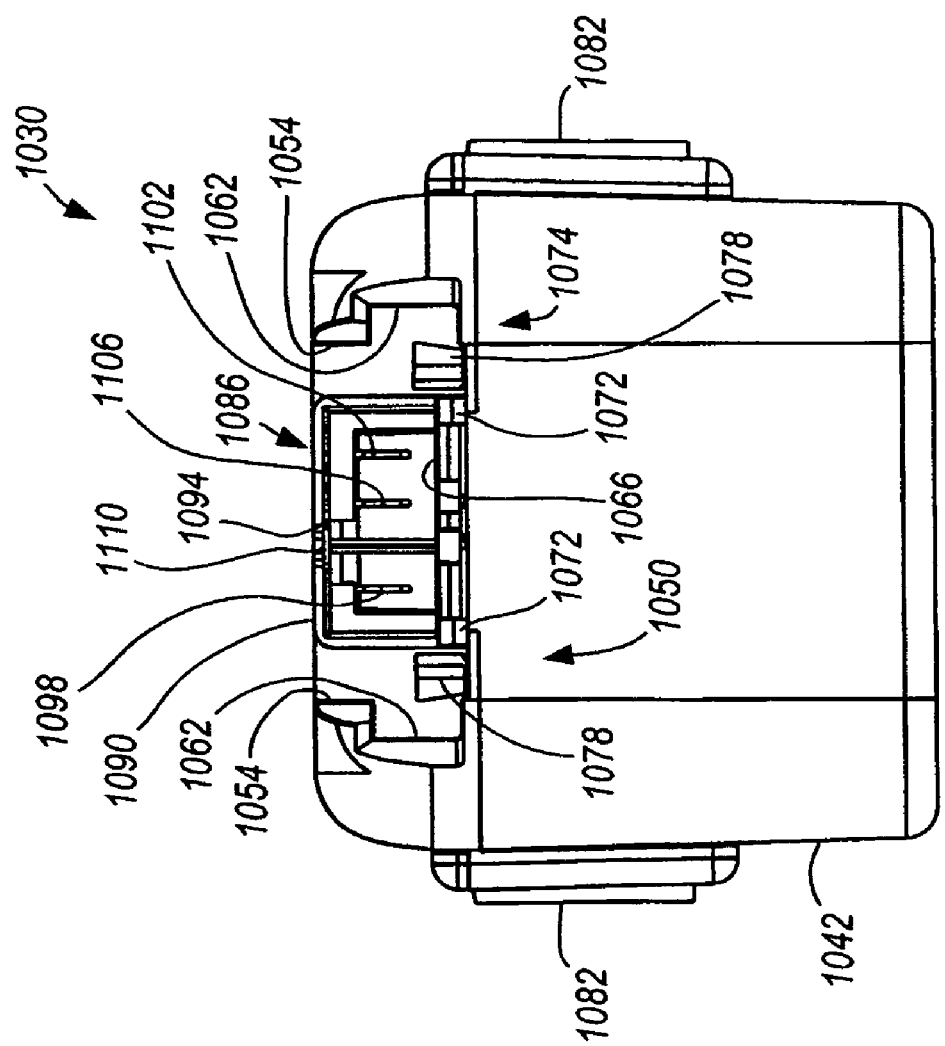
FIG. 37 is a rear view of the battery shown in FIG. 35.
Figure 38:
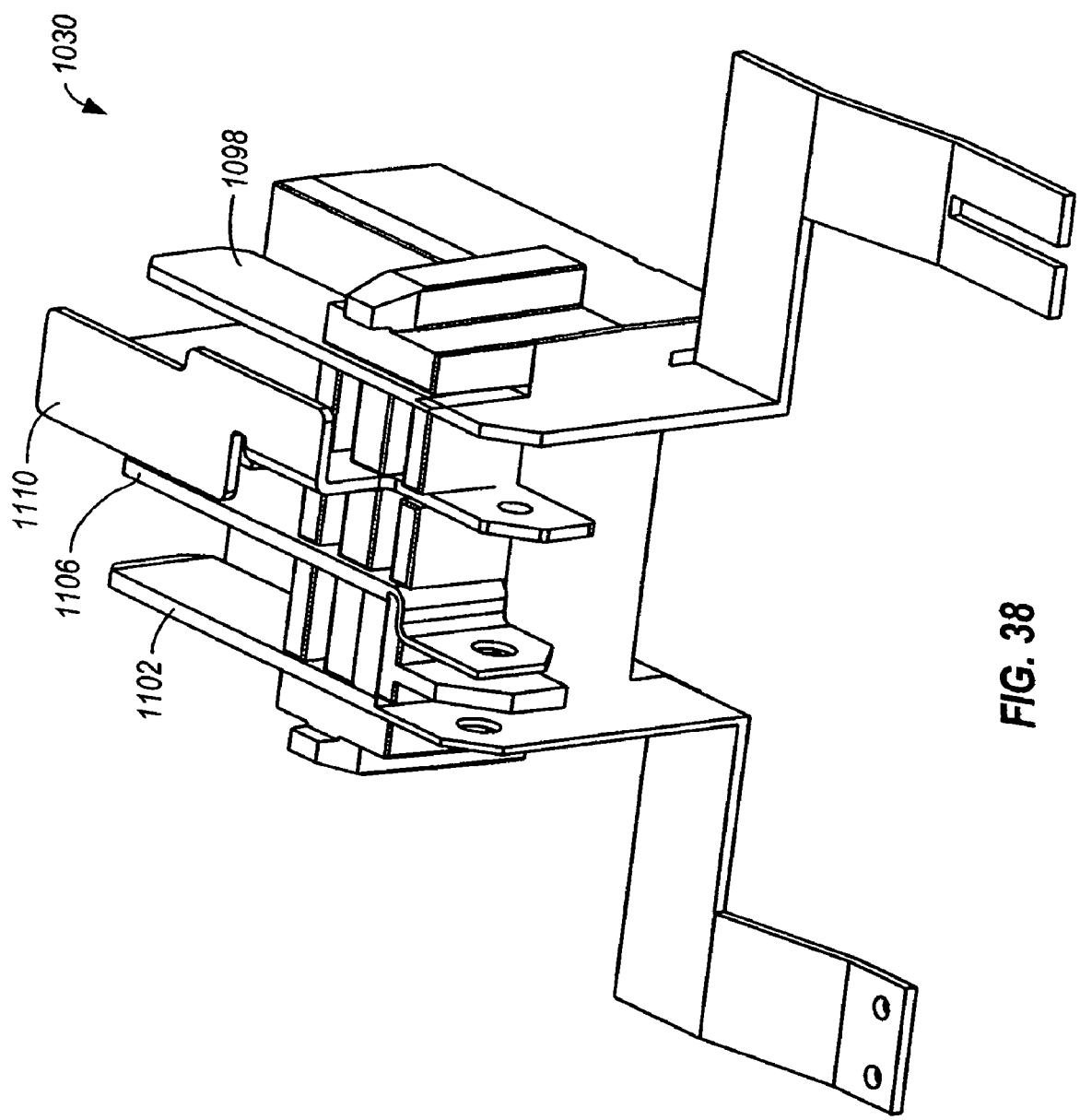
FIG. 38 is a rear perspective view of the terminal assembly of the battery shown in FIG. 35.

As shown in FIGS. 35–37, the battery 1030 can include a housing 1042 and at least one rechargeable battery cell 1046 (schematically illustrated in FIG. 41) supported by the housing 1042. In the illustrated construction, the battery 1030 can be a 18 V battery pack including five approximately 3.6 V battery cells 1046 (one shown) connected in series or can be a 21 V battery pack including five approximately 4.2V battery cells 1046 (one shown) connected in series. In other constructions (not shown), the battery 1030 may have another nominal battery voltage, such as, for example, 9.6 V, 12 V, 14.4 V, 24 V, 28 V, and the like, to power the electrical equipment and be charged by the battery charger 1038. It should be understood that, in other constructions (not shown), the battery cells 1046 can have a different nominal cell voltage and/or may be connected in another configuration, such as, for example, in parallel or in a parallel/series combination.

The battery cell 1046 can be any rechargeable battery cell chemistry type, such as, for example, nickel cadmium (NiCd), nickel-metal hydride (NiMH), Lithium (Li), Lithium-ion (Li-ion), other Lithium-based chemistry, other rechargeable battery cell chemistry, etc. In the illustrated construction, the battery cells 1046 are Li-ion battery cells.

The housing 1042 can provide a support portion 1050 for supporting the battery 1030 on an electrical device, such as the power tool 1034 or the battery charger 1038. In the illustrated construction, the support portion 1050 can provide a C-shaped cross section (see FIG. 37) which is connectable to a complementary T-shaped shaped cross section support portion on the electrical device. As shown in FIGS. 35–37, the support portion 1050 can include rails 1054 extending along a support axis 1058 and defining grooves 1062. An intermediate ridge 1066 can also be provided to engage with a surface of the electrical device support portion. Recesses 1070 (see FIGS. 35–36) can be defined in the ridge 1066 so that the ridge 1066 has laterally-outwardly extended portions 1072.

The battery 1030 can also include (see FIGS. 35–37) a locking assembly 1074 operable to lock the battery 1030 to an electrical device, such as, for example, to the power tool 1034 and/or to a battery charger 1038. In some constructions, the locking assembly 1034 can include locking members 1078 which are movable between a locked position, in which the locking members 1078 engage a corresponding locking member on the electrical device to lock the battery 1030 to the electrical device, and an unlocked position. The locking assembly 1074 can also include actuators 1082 for moving the locking members 1078 between the locked position and the unlocked position. Biasing members (not shown) can bias the locking members 1078 toward the locked position.

Figure 41:
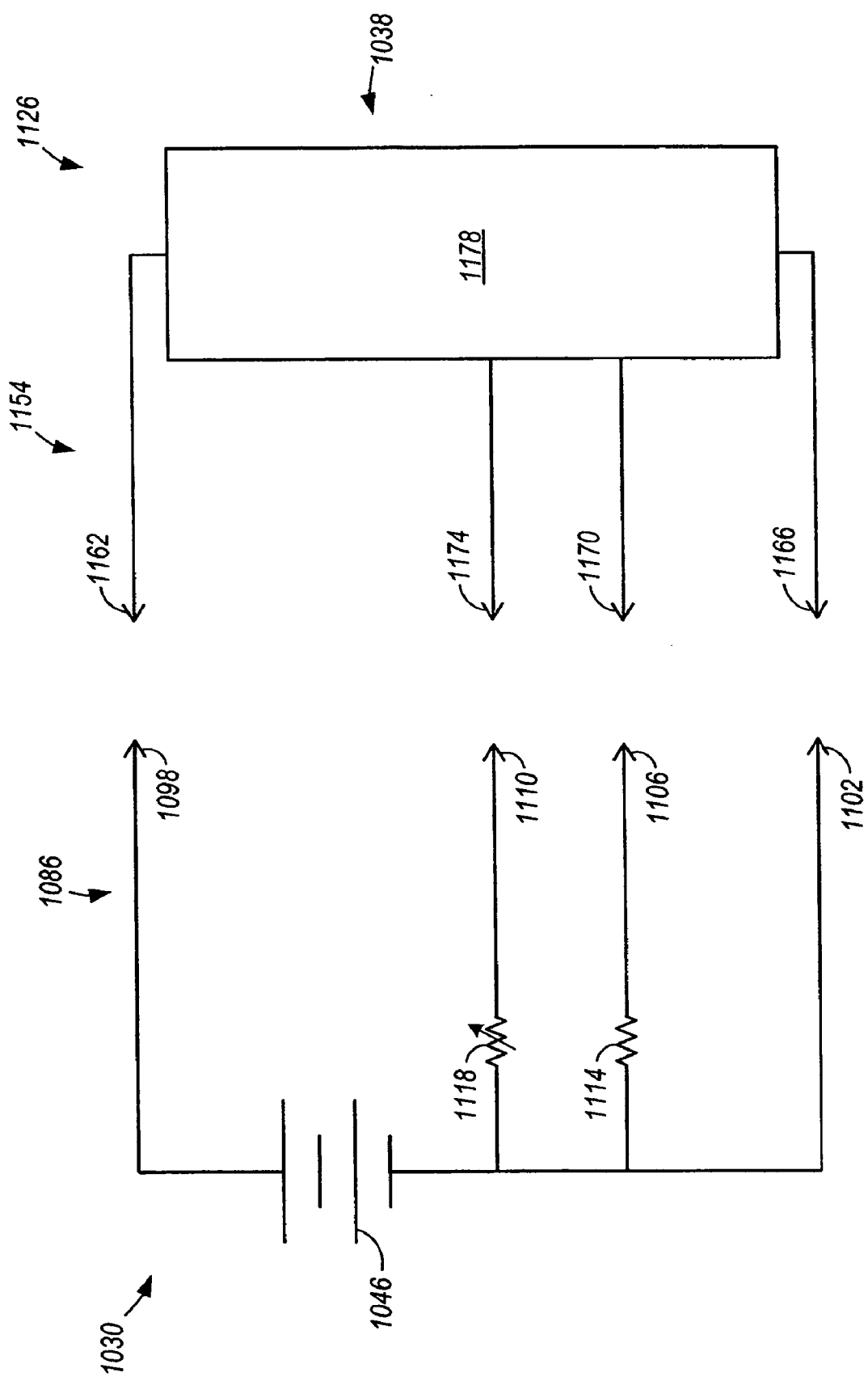
FIG. 41 is a schematic diagram of the battery and the battery charger shown in FIG. 40.

The battery 1030 can also include (see FIGS. 35–39 and 41) a terminal assembly 1086 operable to electrically connect the battery cells 1046 to a circuit in the electrical device. The terminal assembly 1086 can include (see FIGS. 35–37) a terminal housing 1090 provided by the housing 1042. In the illustrated construction and in some aspects, a window or opening 1094 can be provided in the terminal housing 1090. The terminal assembly 1086 can include (see FIGS. 35, 37–39 and 41) a positive battery terminal 1098, a ground terminal 1102, a first sense terminal 1106 and a second sense terminal 1110. As schematically illustrated in FIG. 41, the terminals 1098 and 1102 are connected to the opposite ends of the cell or series of cells 1046.

The sense terminals 1106 and 1110 can be connected to electrical components 1114 and 1118, respectively, which are connected in the circuit of the battery 1030. The sense terminals 1106 and 1110 can communicate information regarding the battery 1030 to an electrical device. For example, one electrical component, such as the electrical component 1114, connected to the sense terminal 1106 may be an identification component, such as a resistor, to communicate the identification of a characteristic of the battery 1030, such as, for example, the chemistry of the battery cells 1046, the nominal voltage of the battery 1030, etc. The other electrical component, such as the electrical component 1118, connected to the sense terminal 1110 may be a temperature-sensing device or thermistor to communicate the temperature of the battery 1030 and/or of the battery cell(s) 1046.

In other constructions, the electrical components 1114 and 1118 can be other suitable electrical components capable of generating an electrical signal such as, for example, a microprocessor, a controller, digital logic components, and the like, or the components 1114 and 1118 can be other suitable passive electrical components such as, for example, resistors, capacitors, inductors, diodes, and the like.

It should be understood that, in other constructions (not shown), the electrical components 1114 and 1118 may be other types of electrical components and may communicate other characteristics or information about the battery 1030 and/or of the battery cell(s) 1046. It should also be understood that "communication" and "communicate", as used with respect to the electrical components 1114 and 1118, may also encompass the electrical component(s) 1114 and/or 1118 having or being in a condition or state which is sensed by a sensor or device capable of determining the condition or state of the electrical component(s) 1114 and/or 1118.

Figure 39:
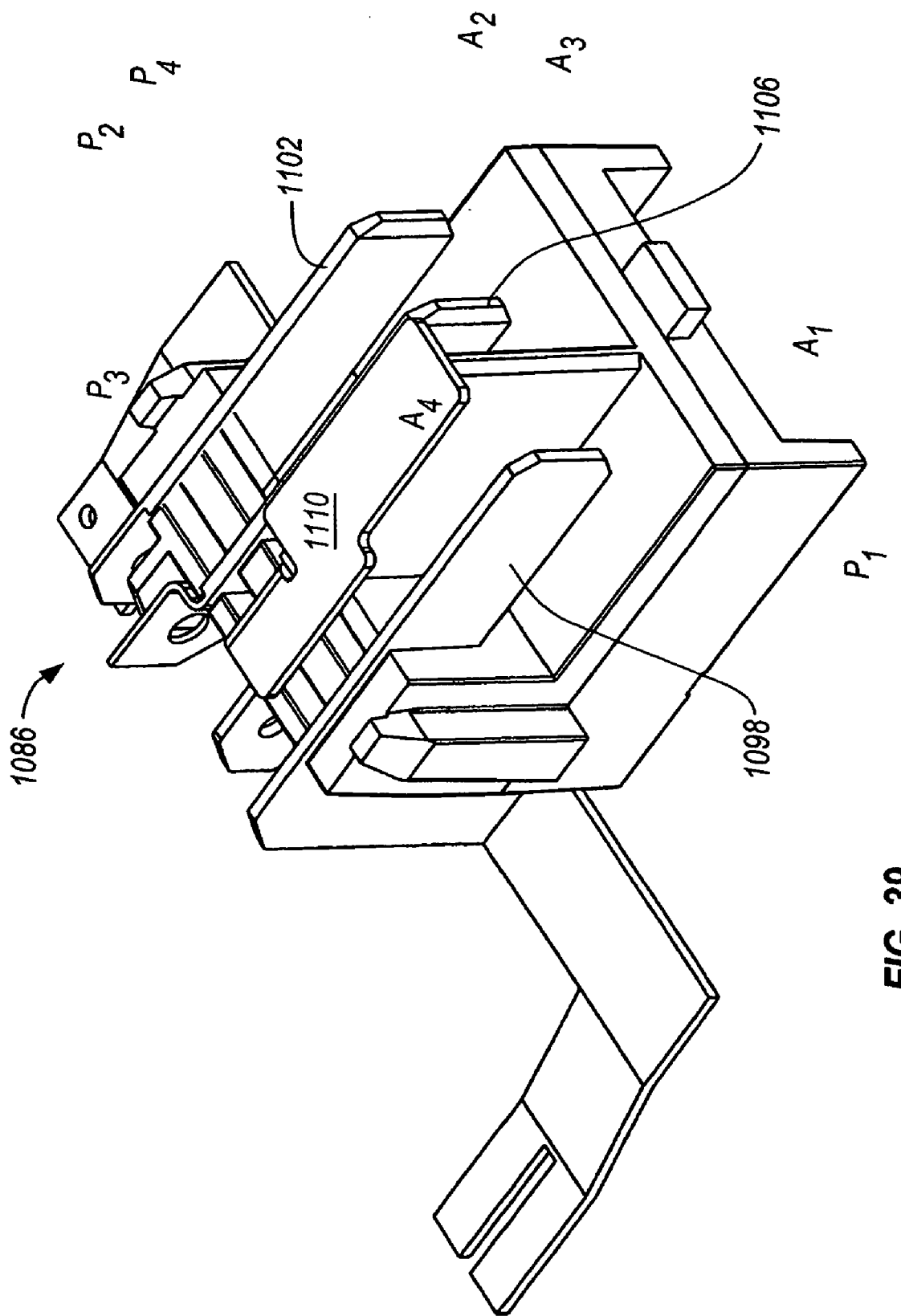
FIG. 39 is a front perspective view of the terminal assembly of the battery shown in FIG. 35.

As shown in FIG. 39, the terminals 1098, 1102 and 1106 can be oriented in planes $P_1$, $P_2$ and $P_3$, respectively, which are substantially parallel to one another. The terminal 1110 can be oriented in a plane $P_4$ which is oriented to be non-parallel to at least one of, and, in the illustrated construction, to all of the other planes $P_1$, $P_2$ and $P_3$. In one construction, the plane $P_4$ can be normal to the planes $P_1$, $P_2$ and $P_3$. The terminals 1098, 1102, 1106 and 1110 can extend along respective axes $A_1$, $A_2$, $A_3$ and $A_4$, and, in the illustrated construction, the terminal axes $A_1$, $A_2$, $A_3$ and $A_4$ are parallel to (see FIGS. 35 and 37) the support axis 1058.

Figure 40:
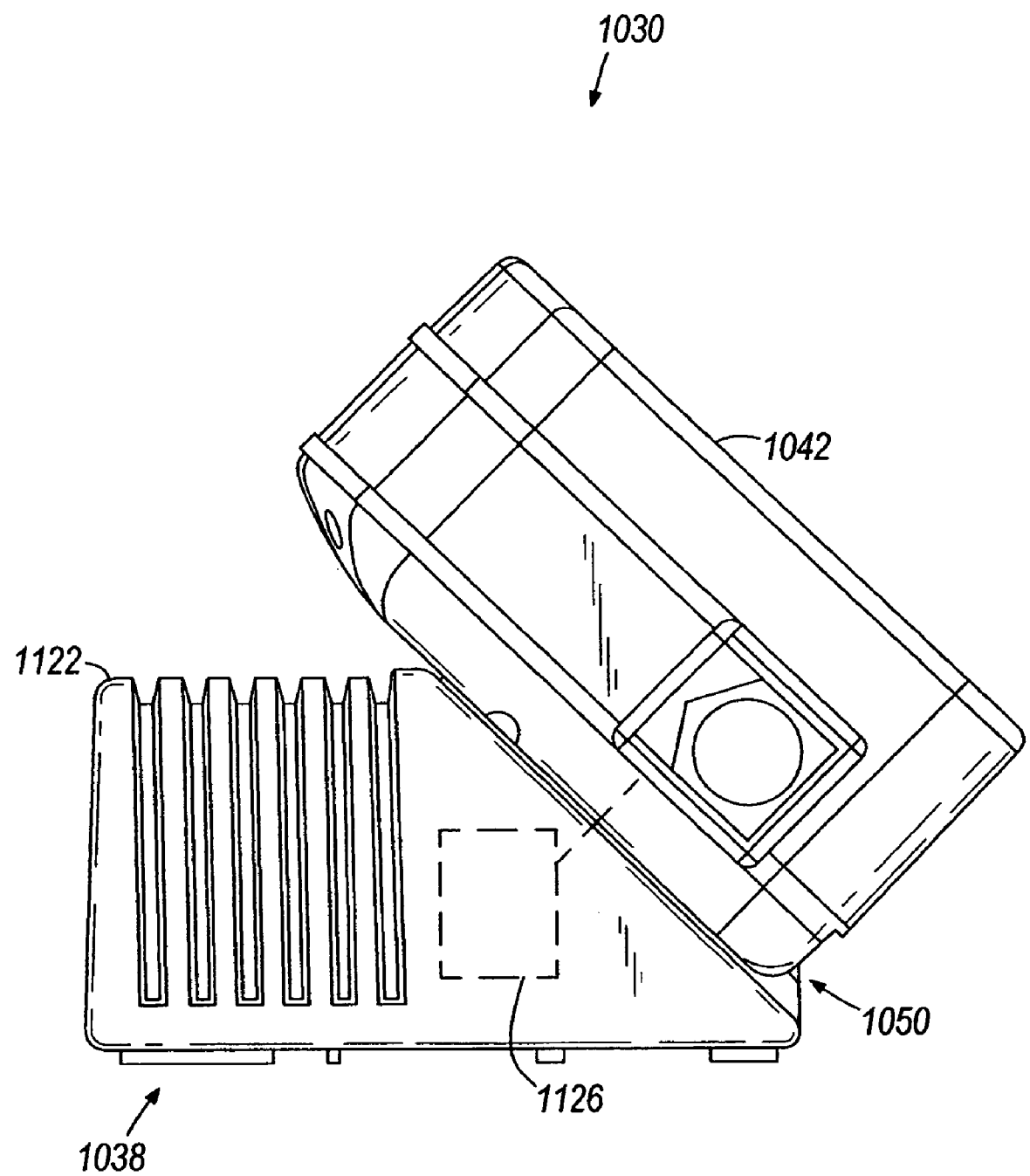
FIG. 40 is a side view of the battery shown in FIG. 35 and an electrical component, such as a battery charger.

As shown in FIGS. 40–44, the battery charger 1038 embodying aspects of the invention can be connectable to the battery 1030 (as shown in FIG. 40) and can be operable to charge the battery 1030. The battery charger 1038 can include a charger housing 1122 and a charging circuit 1126 (schematically illustrated in FIG. 41) supported by the housing 1122 and connectable to a power source (not shown). The charging circuit 1126 can be connectable to the terminal assembly 1086 of the battery 1030 (schematically illustrated in FIG. 41) and can be operable to transfer power to the battery 1030 to charge the battery cell(s) 1046.

In some constructions and in some aspects, the charging circuit 1126 can operate to charge the battery 1030 in a manner similar to that described in U.S. Pat. No. 6,456,035, issued Sep. 24, 2002, and U.S. Pat. No. 6,222,343, issued Apr. 24, 2001, which are hereby incorporated by reference.

In other constructions, the charging circuit 1126 can operate to charge the battery 1030 in a manner similar to that described in prior filed U.S. provisional application Ser. No. 60/440,692 filed Jan. 17, 2003, the entire contents of which are hereby incorporated by reference.

Figure 42:
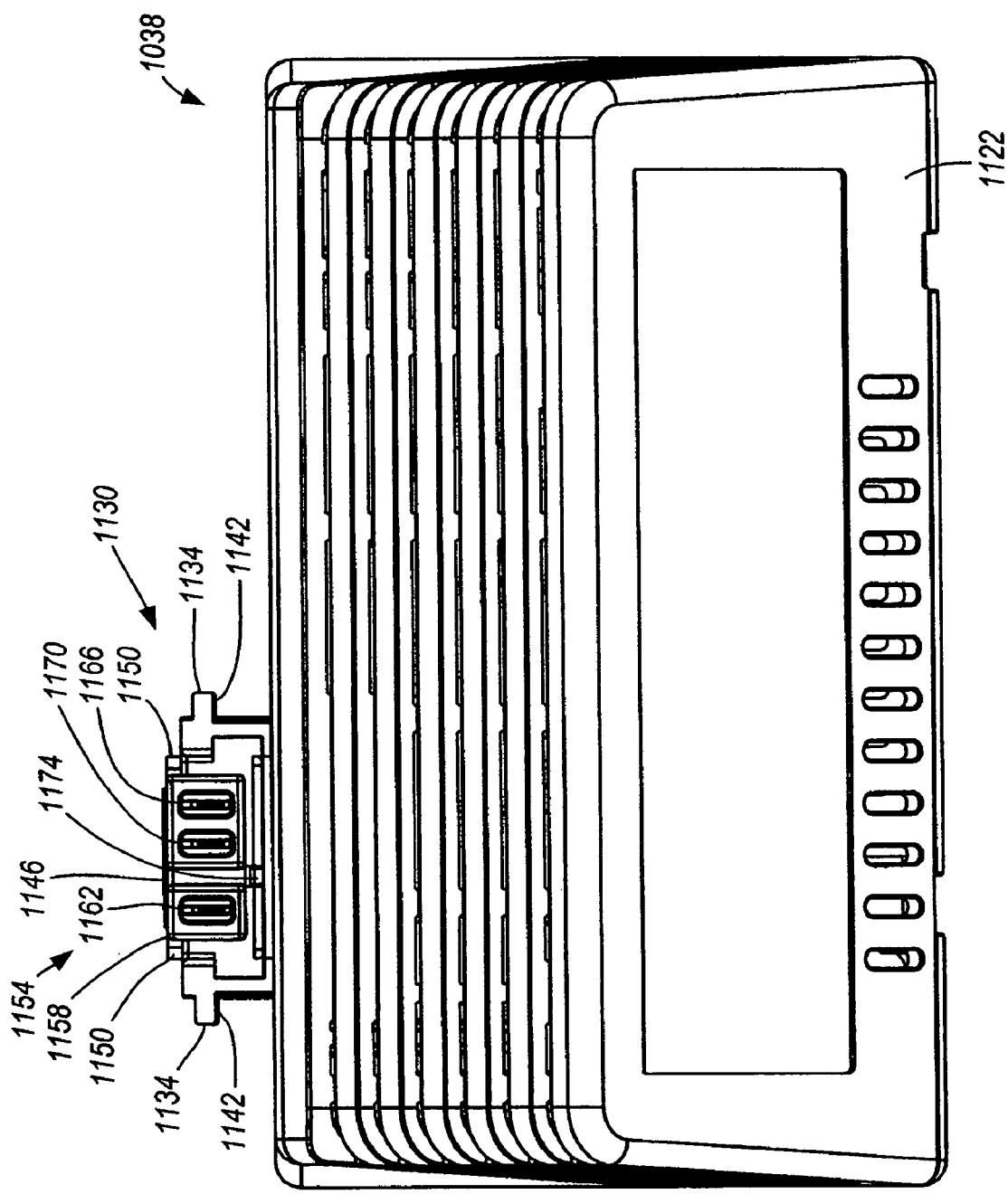
FIG. 42 is a perspective view of the battery charger shown in FIG. 40.
Figure 43:
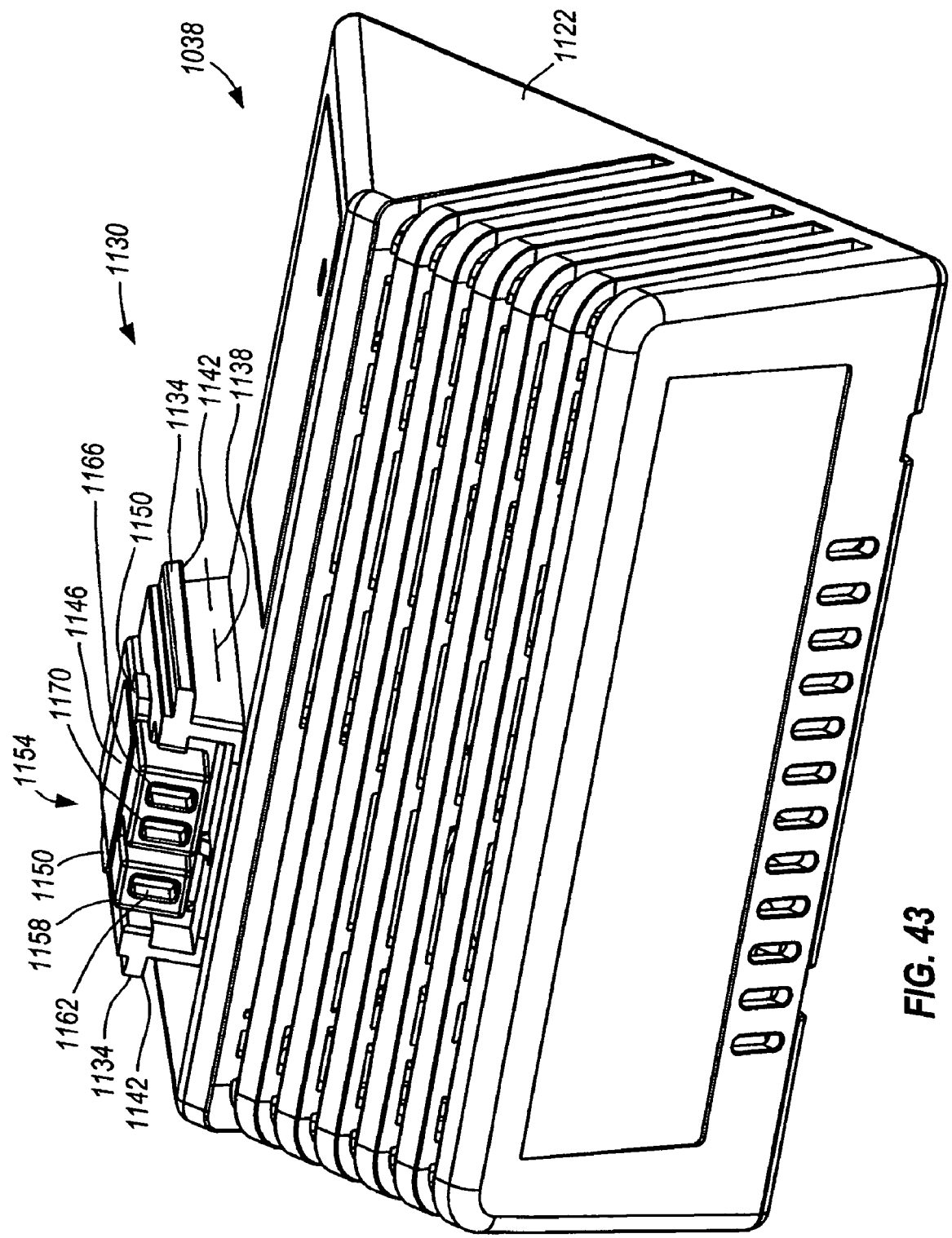
FIG. 43 is another perspective view of the battery charger shown in FIG. 40.
Figure 44:
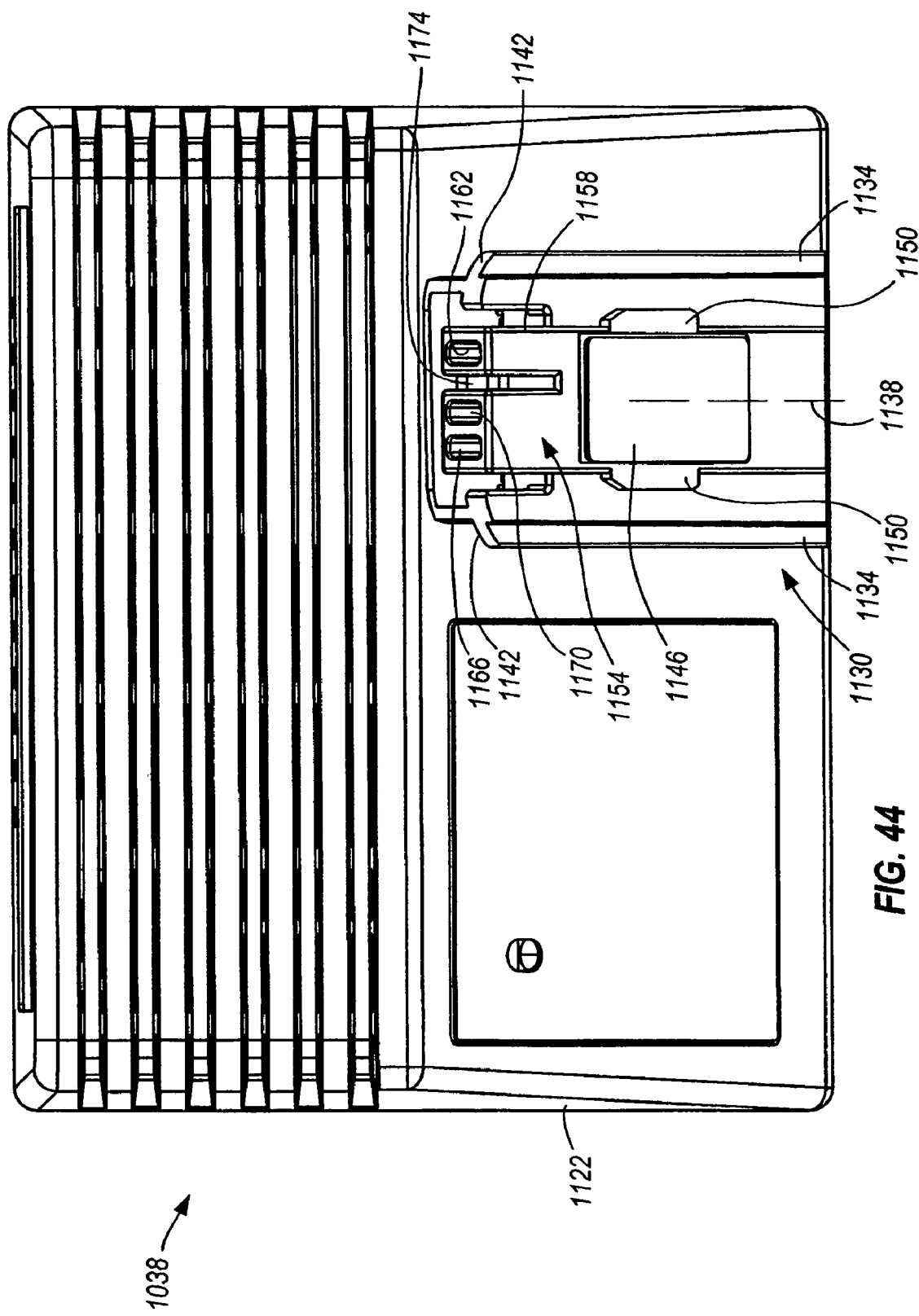
FIG. 44 is a top view of the battery charger shown in FIG. 40.
Figure 45:
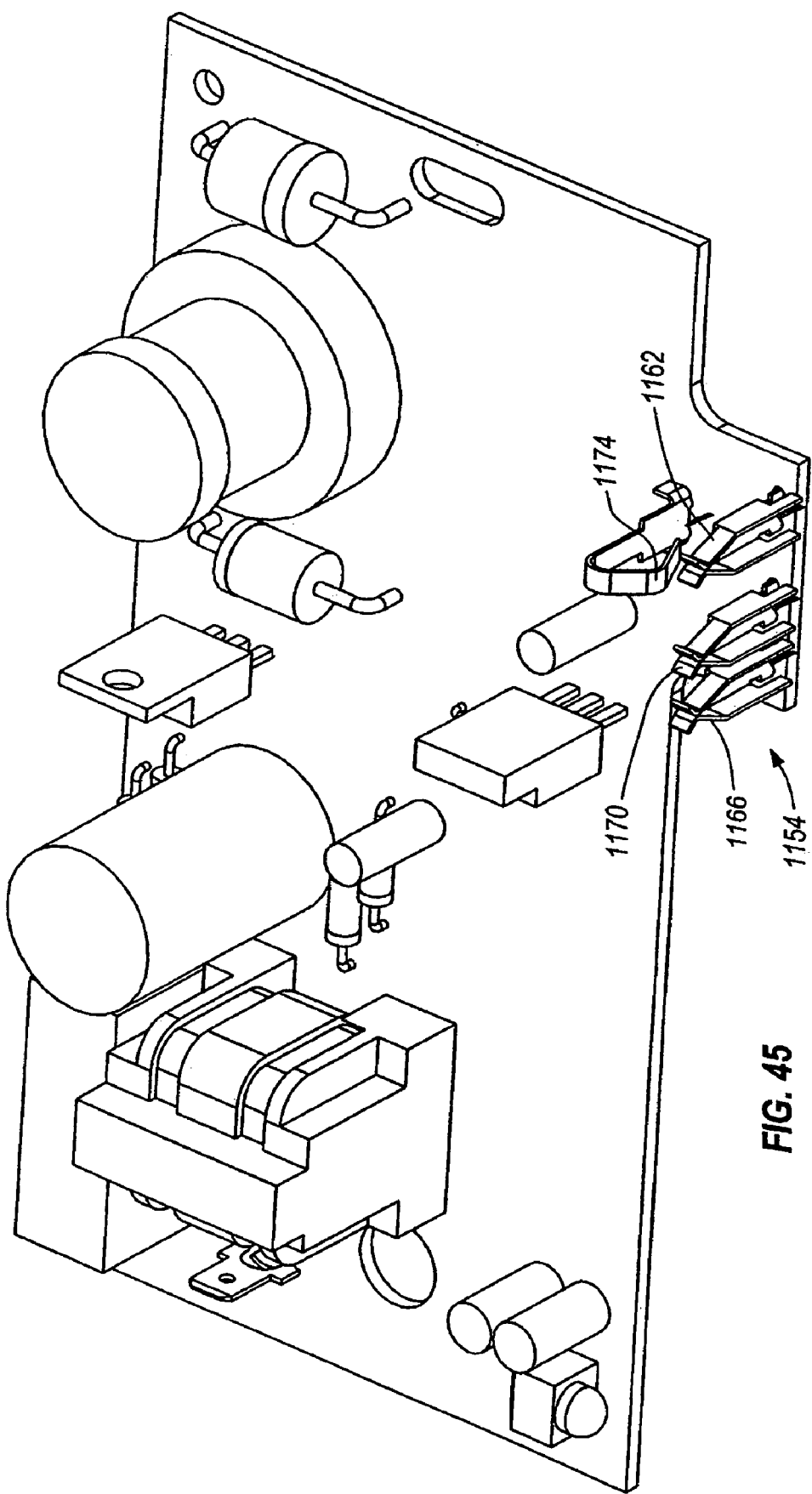
FIG. 45 is a perspective view of the terminal assembly of the battery charger shown in FIG. 40.
Figure 46:
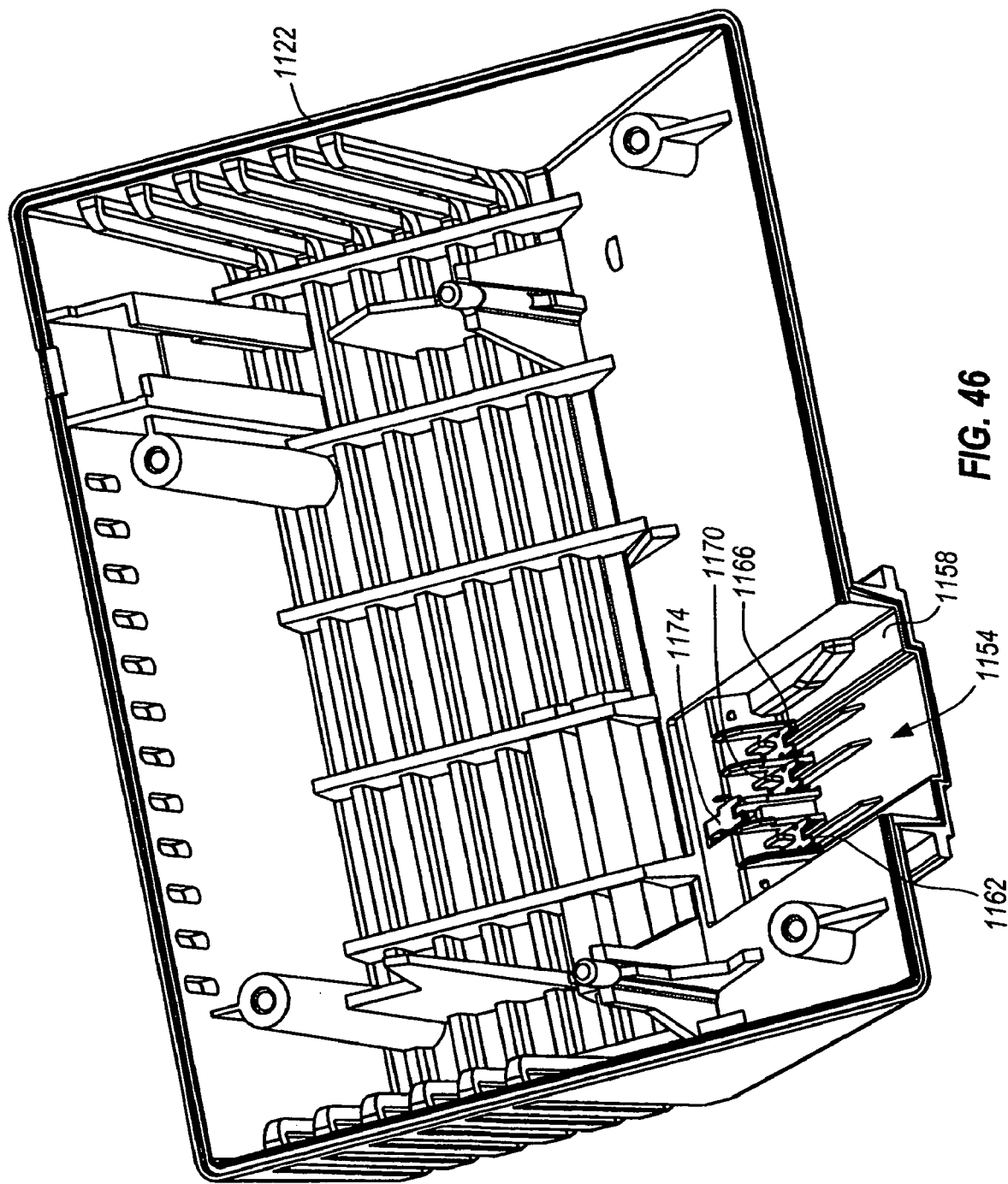
FIG. 46 is a perspective view of the inner portion of the housing of the battery charger shown in FIG. 40.
Figure 47:
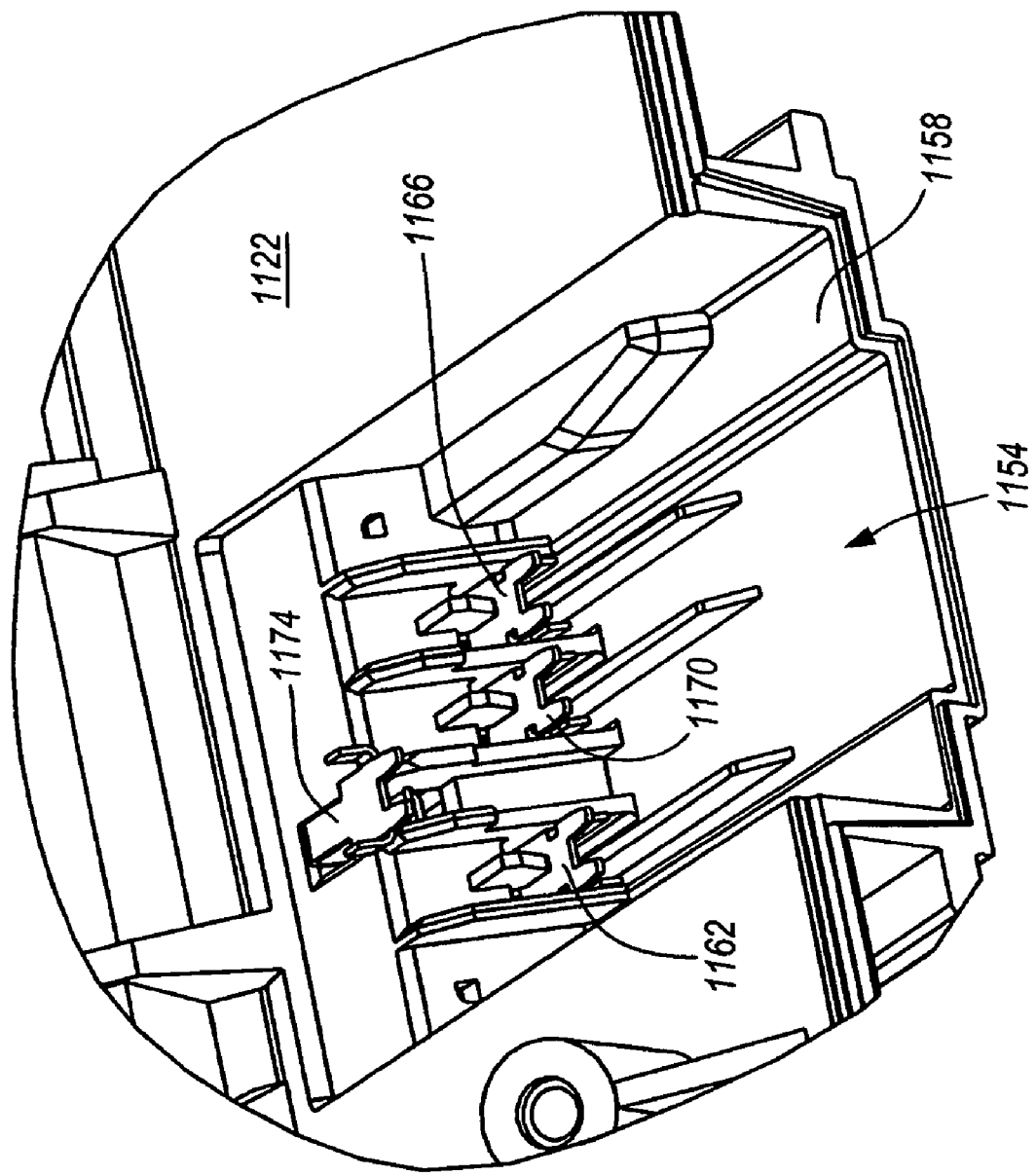
FIG. 47 is an enlarged perspective view of a portion of the battery charger shown in FIG. 46 and illustrating the terminal assembly of the battery charger.

As shown in FIGS. 42–44, the housing 1122 can provide a battery support portion 1130 for supporting the battery 1030. The support portion 1130 can have (see FIG. 42) a generally T-shaped cross section which can be complementary to the C-shaped cross section of the support portion 1050 of the battery 1030. The support portion 1130 can include (see FIGS. 42–44) rails 1134 which extend along a support axis 1138 and which define grooves 1142. The support portion 1130 can also include a surface 1146 which is engageable with the ridge 1066.

Projections or ribs 1150 can extend from the surface 1146. When the battery 1030 is positioned on the support portion 1130, the ribs 1150 can be generally laterally aligned with the locking members 1078 to maintain the locking members 1078 in the locking position. In one constructions, the ribs 1150 are lowered to ensure that the ribs 1150 do not engage with the ridge 1066 on the support portion 1050 of the battery 1030, which would prevent the battery 1030 from being connected to the battery charger 1038.

The battery charger 1038 can also include (see FIGS. 41–47) a terminal assembly 1154 operable to electrically connect the charging circuit 1126 to the terminal assembly 1086 of the battery 1030 (as schematically illustrated in FIG. 41). As shown in FIGS. 42–44 and 46–47, the terminal assembly 1154 can include a terminal housing 1158 provided by the support portion 1130. The terminal assembly 1154 also can include (see FIGS. 41–47) a positive terminal 1162, a negative terminal 1166, a first sense terminal 1170 and a second sense terminal 1174. The charger terminals 1162, 1166, 1170 and 1174 can be connectable to the battery terminals 1098, 1102, 1106 and 1110, respectively (as schematically illustrated in FIG. 41).

The charger terminals 1162, 1166, 1170 and 1174 can be connected to the charging circuit 1126. The charging circuit 1126 can include a microcontroller 1178 for controlling charging of the battery 1030. The controller 1178 is operable to communicate with or sense the condition or state of the electrical components 1114 and 1118 of the battery 1030 to identify one or more characteristics and/or conditions of the battery 1030, such as, for example, the nominal voltage of the battery 1030, the chemistry of the battery cell(s) 1046, the temperature of the battery 1030 and/or of the battery cell(s) 1046, etc. Based upon determinations made by the controller 1178, the controller 1178 can control the charging circuit 1126 to properly charge the battery 1030.

As shown in FIGS. 35, 37–39, the battery terminals 1098, 1102 and 1106 can be male blade terminals. As shown in FIG. 42, the charger terminals 1162, 1166 and 1170 can be female terminals operable to receive the male blade terminals 1098, 1102 and 1106. The battery terminal 1110 (see FIGS. 35–39) and the charger terminal 1174 (see FIGS. 42–44) can provide a cantilever spring-type engagement. In the illustrated construction (see FIGS. 42–44), the charger terminal 1174 can extend generally perpendicularly to the support axis 1138 to provide a sliding engagement and contact with the battery terminal 1110.

Figure 48A:
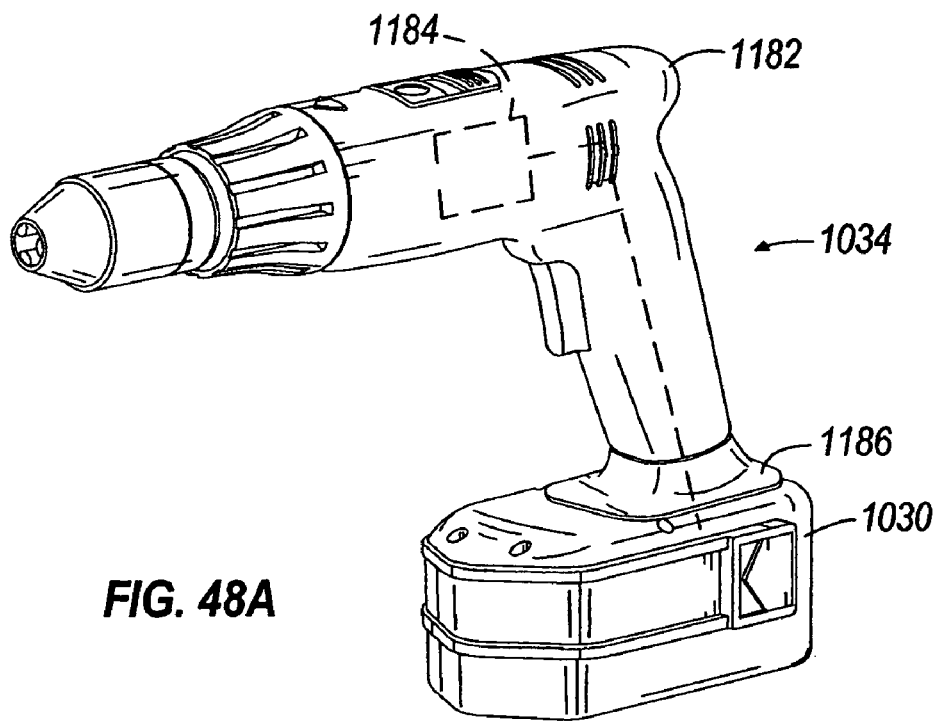
FIG. 48A is a perspective view of an electrical device, such as a power tool, for use with the battery shown in FIG. 35.
Figure 48B:
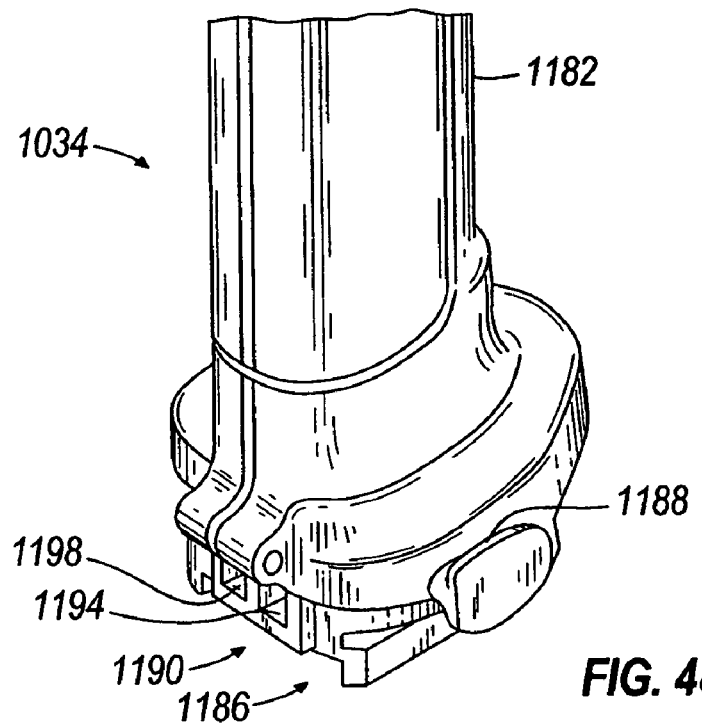
FIG. 48B is a perspective view of the support portion of the power tool shown in FIG. 48A.
Figure 49:
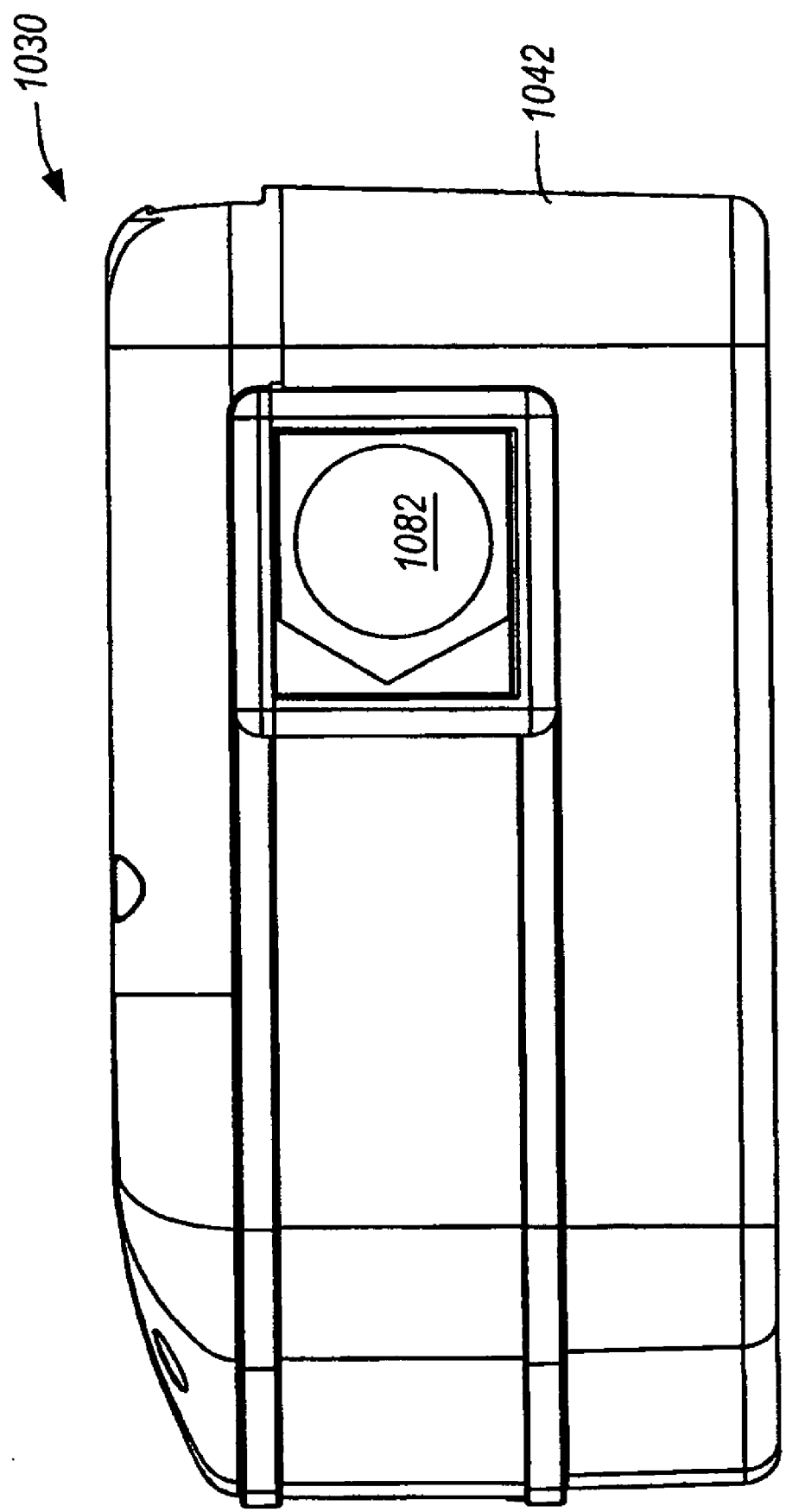
FIG. 49 is a right side view of the battery shown in FIG. 35.
Figure 50:
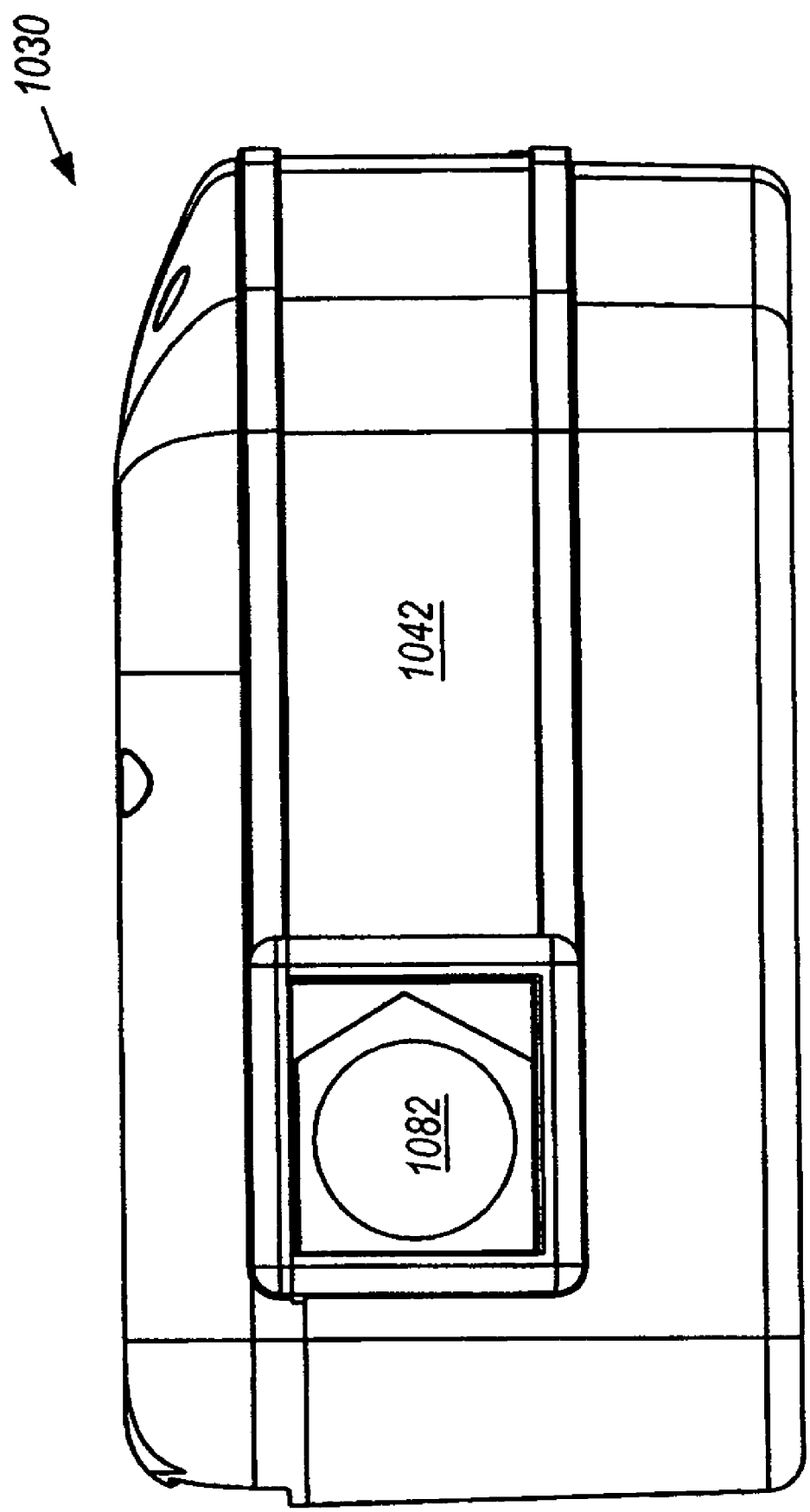
FIG. 50 is a left side view of the battery shown in FIG. 35.
Figure 51:
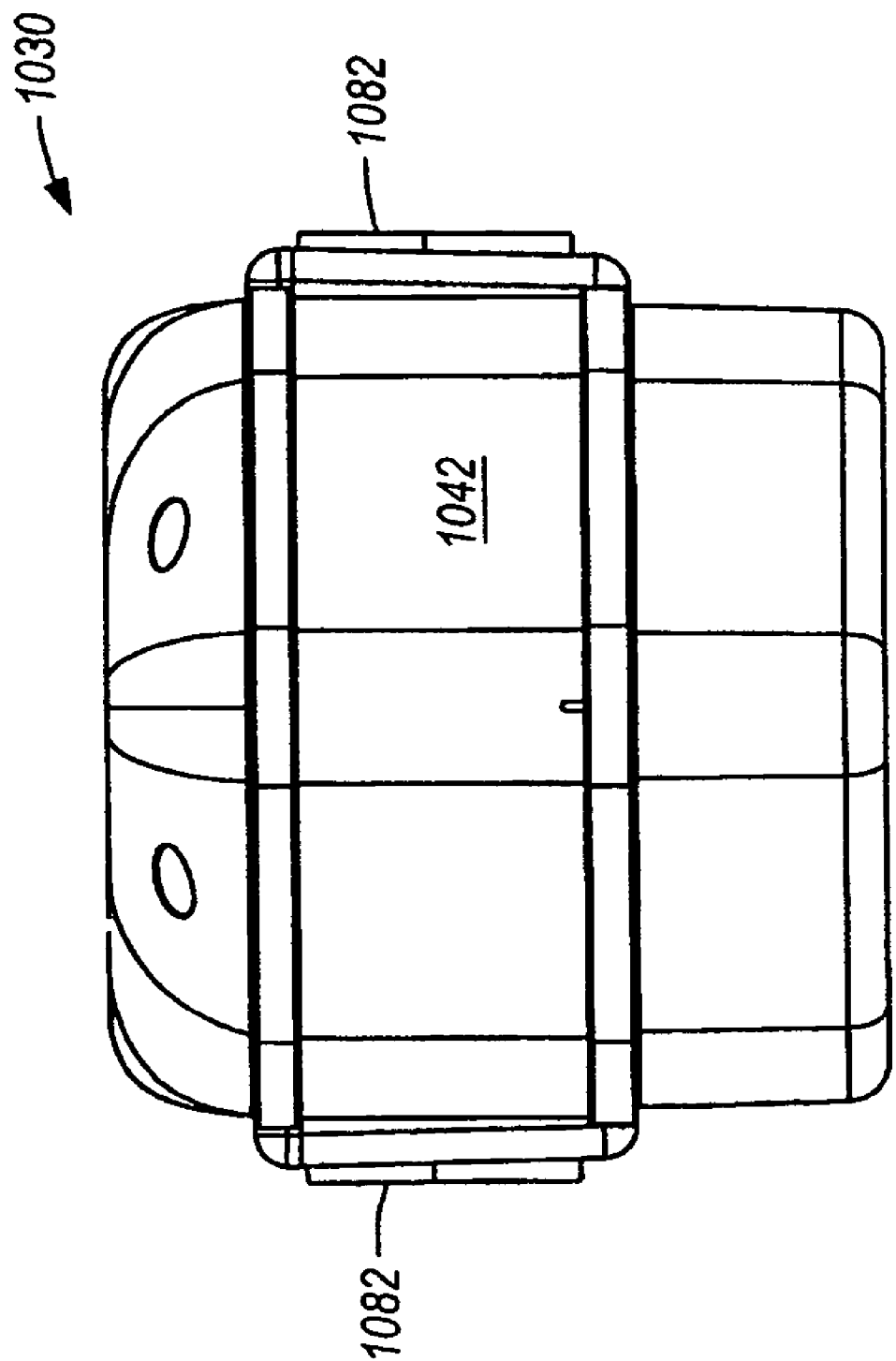
FIG. 51 is a front view of the battery shown in FIG. 35.
Figure 52:
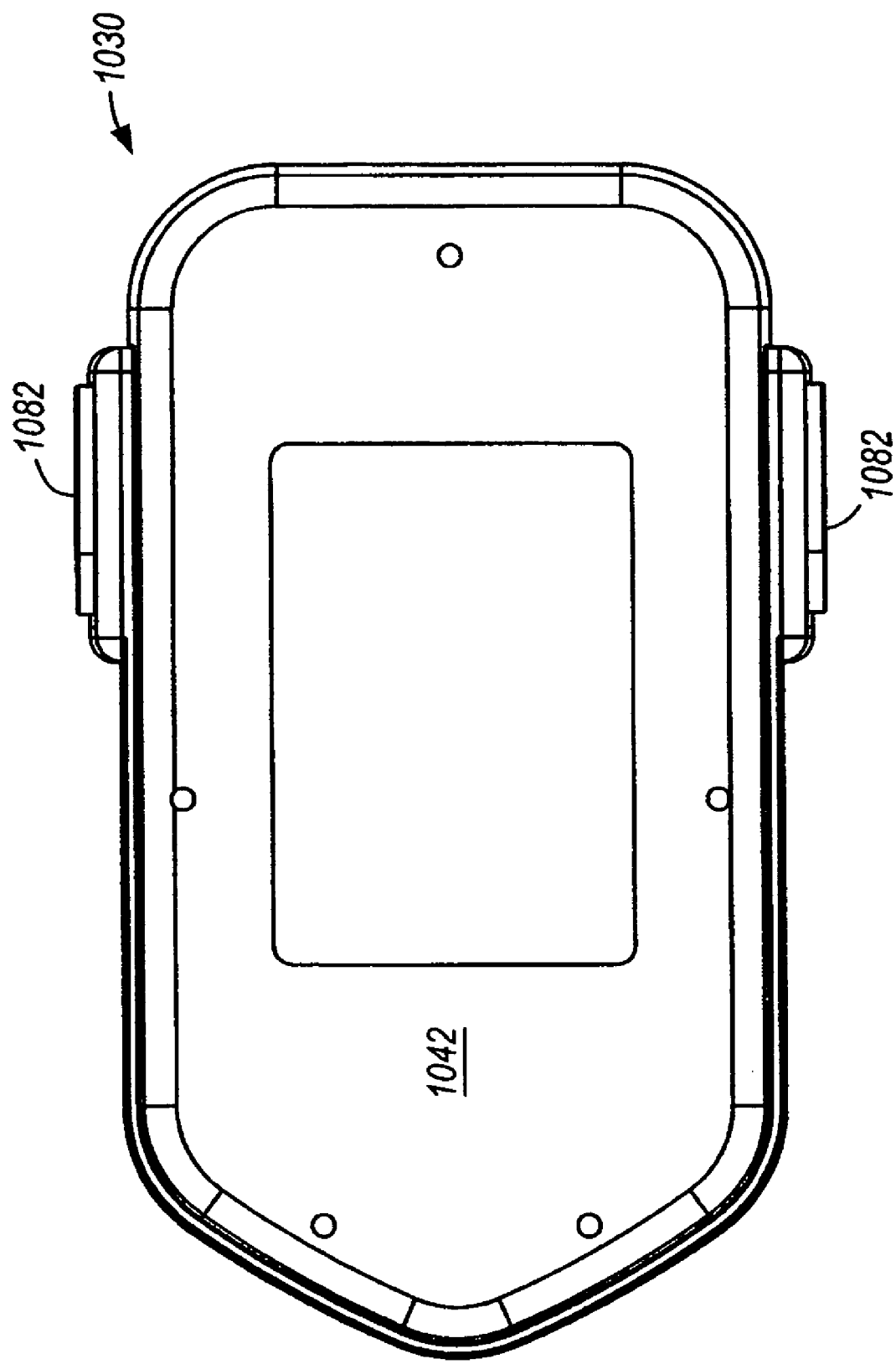
FIG. 52 is a bottom view of the battery shown in FIG. 35.
Figure 53:
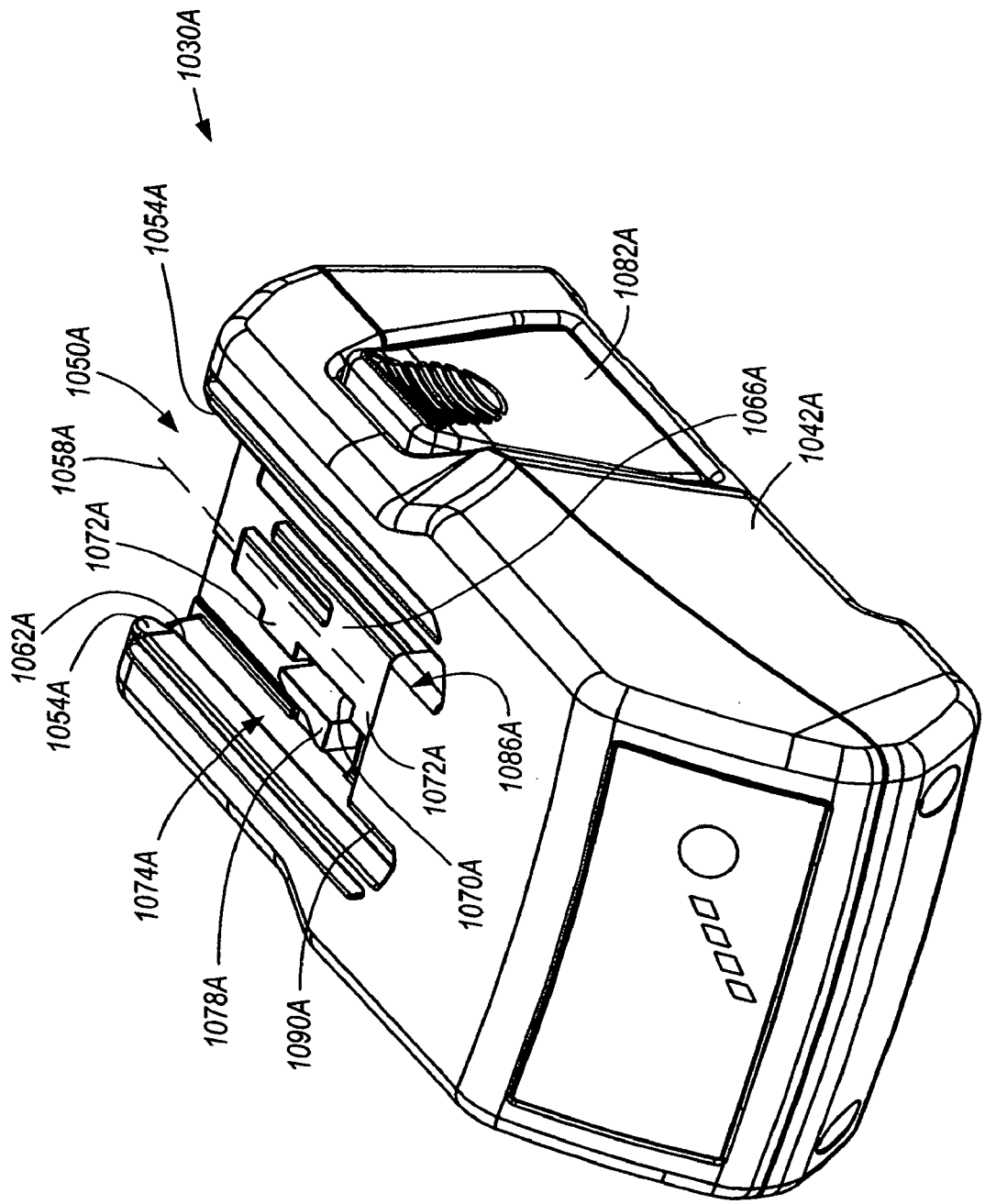
FIG. 53 is a front perspective view of an alternate construction of a battery.
Figure 54:
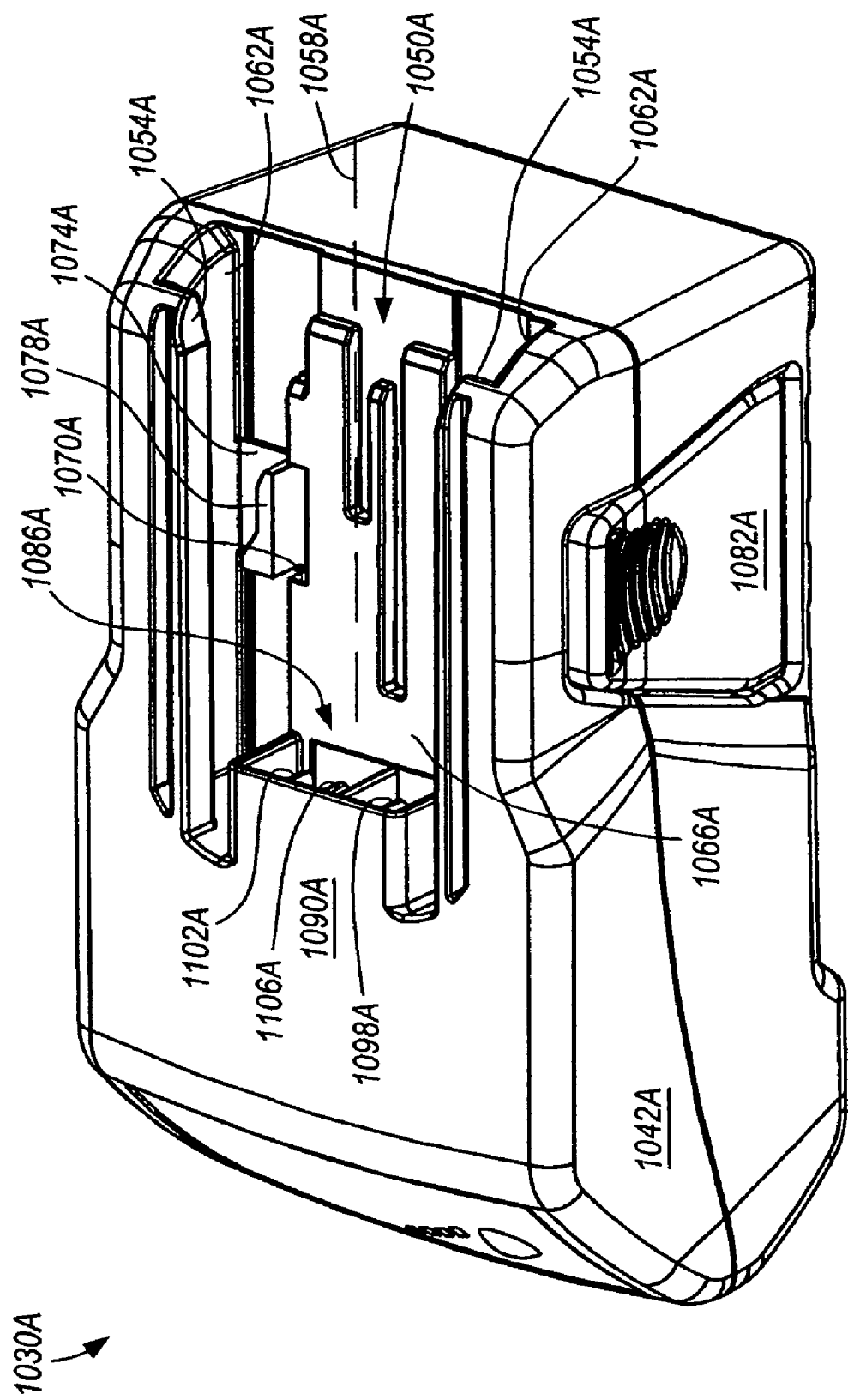
FIG. 54 is a rear perspective view of the battery shown in FIG. 53.

The battery 1030 can be connectable to electrical equipment, such as, for example, the power tool 1034 (shown in FIG. 48A), to power the tool 1034. The power tool 1034 includes a housing 1182 supporting an electric motor 1184 (schematically illustrated) selectively powered by the battery 1030. The housing 1182 can provide (see FIG. 48B) a support portion 1186 on which the battery 1030 can be supported. The support portion 1186 can have a generally T-shaped cross section which can be complementary to the C-shaped cross section of the support portion 1050 of the battery 1030. The support portion 1186 also can define locking recesses 1188 (one shown) in which the locking members 1078 are engageable to lock the battery 1030 to the power tool 1034.

The power tool 1034 can also include a terminal assembly 1190 (partially shown in FIG. 48B) connectable to the terminal assembly 1086 of the battery 1030 so that power is transferable from the battery 1030 to the power tool 1034. In the illustrated construction, the terminal assembly 1190 can include a positive terminal 1194 and a negative terminal 1198 which are connected to the terminals 1098 and 1102, respectively, of the battery 1030.

It should be understood that, in other constructions (not shown), the terminal assembly 1190 may include additional terminals (not shown) which are connectable to the sense terminals 1106 and/or 1110 so that information regarding the battery 1030, such as, for example, one or more characteristics of the battery 1030 and/or conditions of the battery 1030, may be communicated to or sensed by the power tool 1034. In such constructions, the power tool 1034 may include a controller (not shown) to determine the communicated or sensed information regarding the battery 1030 and to control operation of the power tool 1034 based on this information.

An alternative construction of a battery 1030A embodying aspects of the invention is illustrated in FIGS. 53–56. Common elements are identified by the same reference number "A".

As shown in FIGS. 53–56, the battery 1030A can include a housing 1042A supporting one or more cells (not shown but similar to the cells 1046). The battery 1030A can include a support portion 1050A which has (see FIG. 56) a generally C-shaped cross section which can be complementary to (see FIG. 42) the support portion 1130 of the battery charger 1038 and to (see FIG. 48B) the support portion 1186 of the power tool 1034 so that the battery 1030A is connectable to the battery charger 1038 and the power tool 1034.

Figure 55:
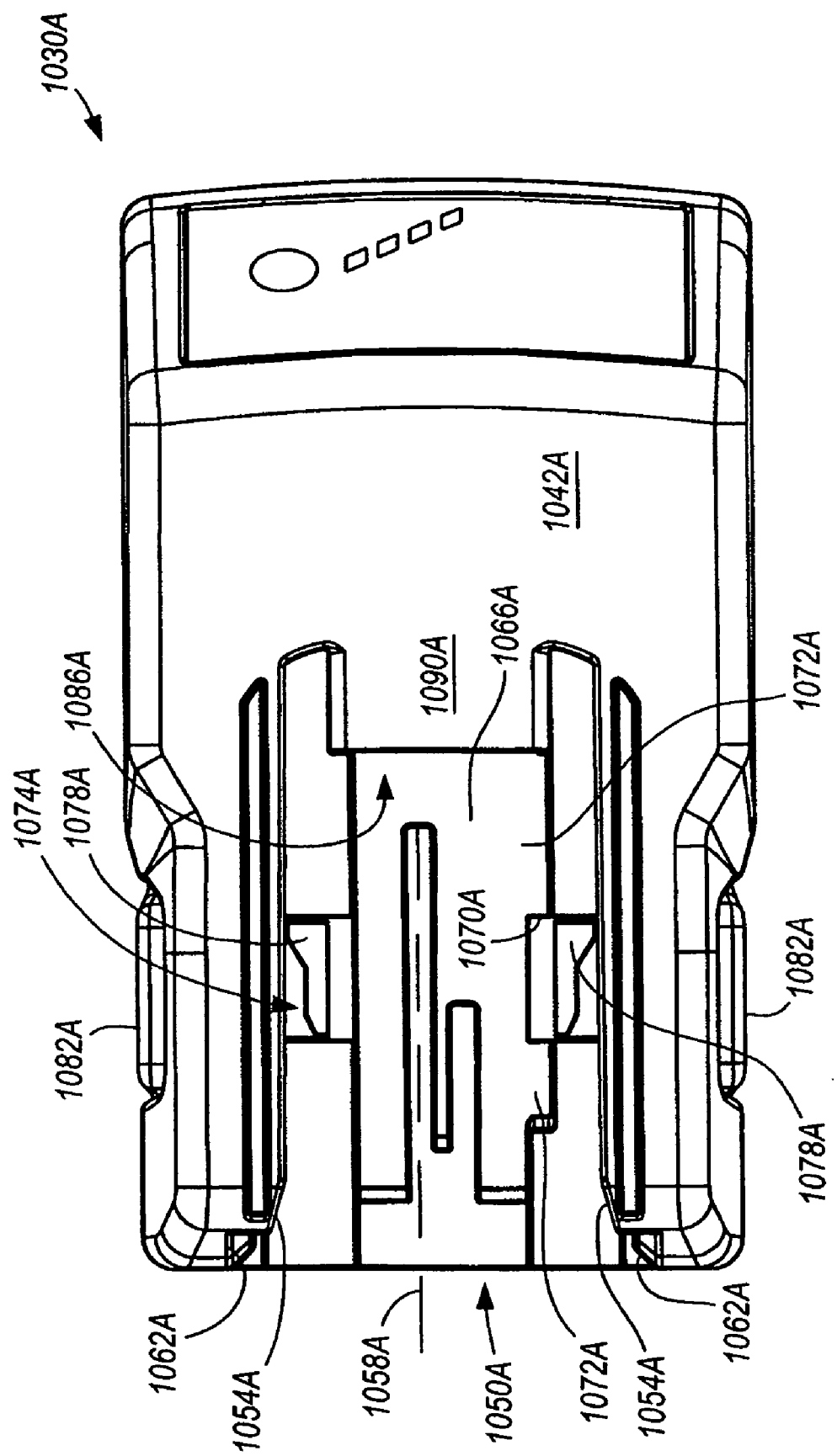
FIG. 55 is a top view of the battery shown in FIG. 53.
Figure 56:
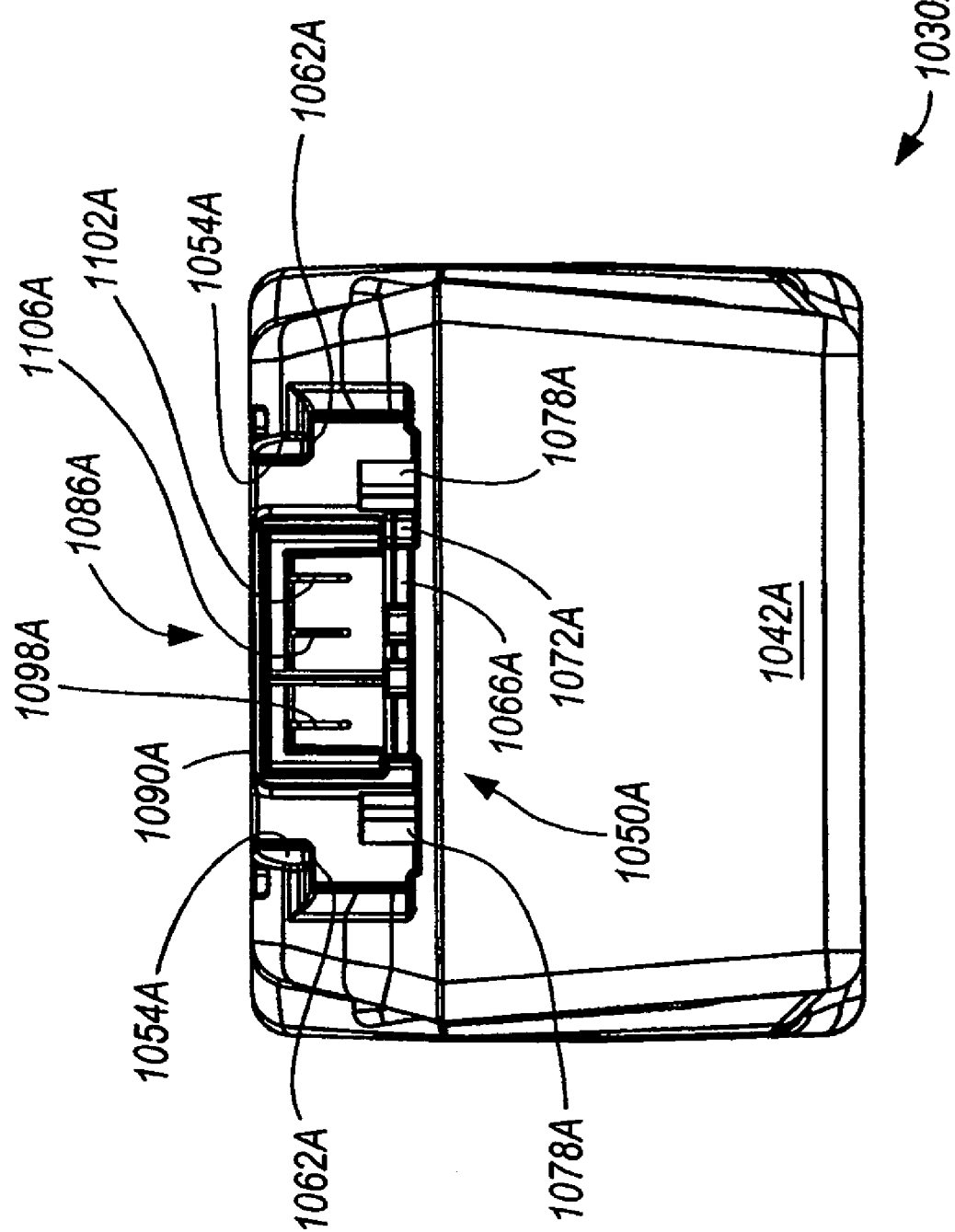
FIG. 56 is a rear view of the battery shown in FIG. 53.
Figure 57:
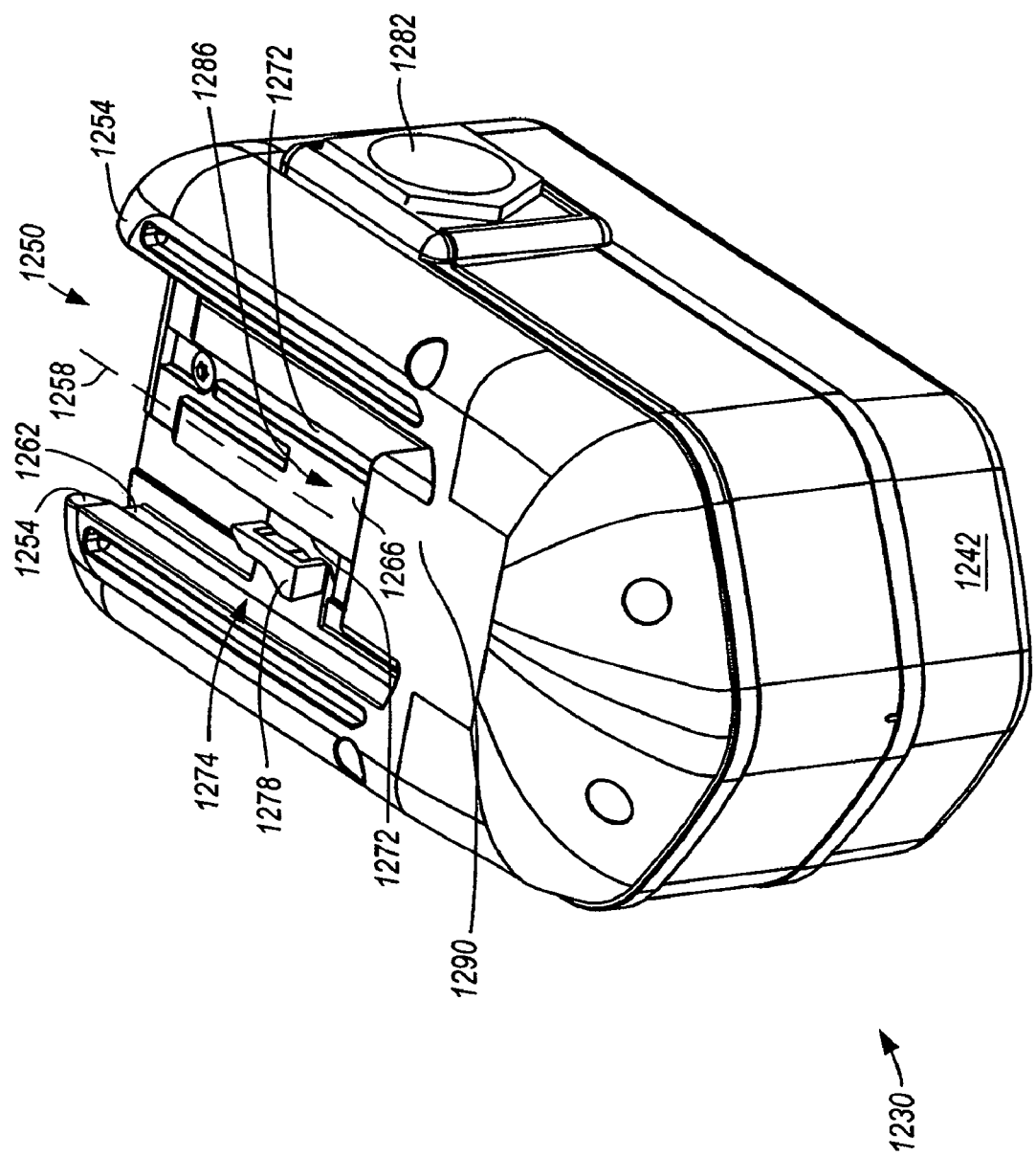
FIG. 57 is a front perspective view of a prior art battery.

As shown in FIGS. 53–56, the support portion 1050A can include the ridge 1066A. As shown in FIG. 55, the ridge 1066A can extend farther to one lateral side (the lower lateral side in FIG. 55) to provide a laterally-outwardly extended portion 1072A.

For some constructions and for some aspects, additional independent features, structure and operation of the battery 1030A are described in more detail above.

When the battery 1030A is positioned on the support portion 1130 of the battery charger 1038, the lowered ribs 1150 (shown in FIG. 42) do not engage with (see FIG. 55) the extended portion 1072A of the ridge 1066A on the support portion 1050A of the battery 1030A so that the battery 1030A is not prevented from being connected to the battery charger 1038.

FIGS. 57–61 illustrate a prior art battery 1230. The battery 1230 can include a housing 1242 and at least one rechargeable battery cell 1246 (schematically illustrated in FIG. 61) supported by the housing 1242. In the illustrated construction, the battery 1230 is an 18V battery pack including 15 approximately 1.2 V battery cells 1246 connected in series. In other constructions (not shown), the battery 1230 may have another nominal voltage, such as, for example, 9.6V, 12V, 14.4V, 24V, etc., to power the electrical equipment and be charged by the battery charger 1038. It should be understood that, in other constructions (not shown), the battery cells 1246 may have a different nominal cell voltage and/or may be connected in another configuration, such as, for example, in parallel or in a parallel series combination. The battery cells 1246 may be a rechargeable battery cell chemistry type, such as, for example, NiCd or NiMH.

As shown in FIGS. 57–60, the housing 1242 can provide a support portion 1250 for supporting the battery 1230 on an electrical device, such as the power tool 1034 (shown in FIG. 48) or the battery charger 1038 (shown in FIG. 42). In the illustrated construction, the support portion 1250 can provide (see FIG. 60) a C-shaped cross section which is connectable to a complementary T-shaped cross section support portion on the electrical device (the support portion 1186 on the power tool 1034 (shown in FIG. 48B) and/or the battery support portion 1130 on the battery charger 1038 (shown in FIG. 42)). As shown in FIGS. 57–60, the support portion 1250 can include rails 1254 extending along a support axis 1258 and defining grooves 1262, an intermediate ridge 1266 can be provided to engage with a surface of the electrical device support portion. The ridge 1266 can have substantially linear and uninterrupted lateral surfaces 1272. The ridge 1266 does not provide laterally-outwardly extended portions (like the extended portions 1072 of the battery 1030 (shown in FIG. 36) or the extended portion 1072A of the battery 1030A (shown in FIG. 55)).

The battery 1230 also can include (see FIGS. 57–60) a locking assembly 1274 operable to lock the battery 1230 to an electrical device, such as, for example, to the power tool 1034 (shown in FIG. 48A) and/or to a battery charger. The locking assembly 1274 can include (see FIGS. 57–60) locking members 1278 which are moveable between a locked position, in which the locking members 1278 can engage a corresponding locking member on the electrical device (such as the locking recess 1188 on the power tool 1034) to lock the battery 1230 to the electrical device, in an unlocked position. The locking assembly 1274 can also include actuators 1282 for moving the locking members 1278 between the locked position and the unlocked position. Biasing members (not shown) can bias the locking members 1278 toward the locked position.

Figure 58:
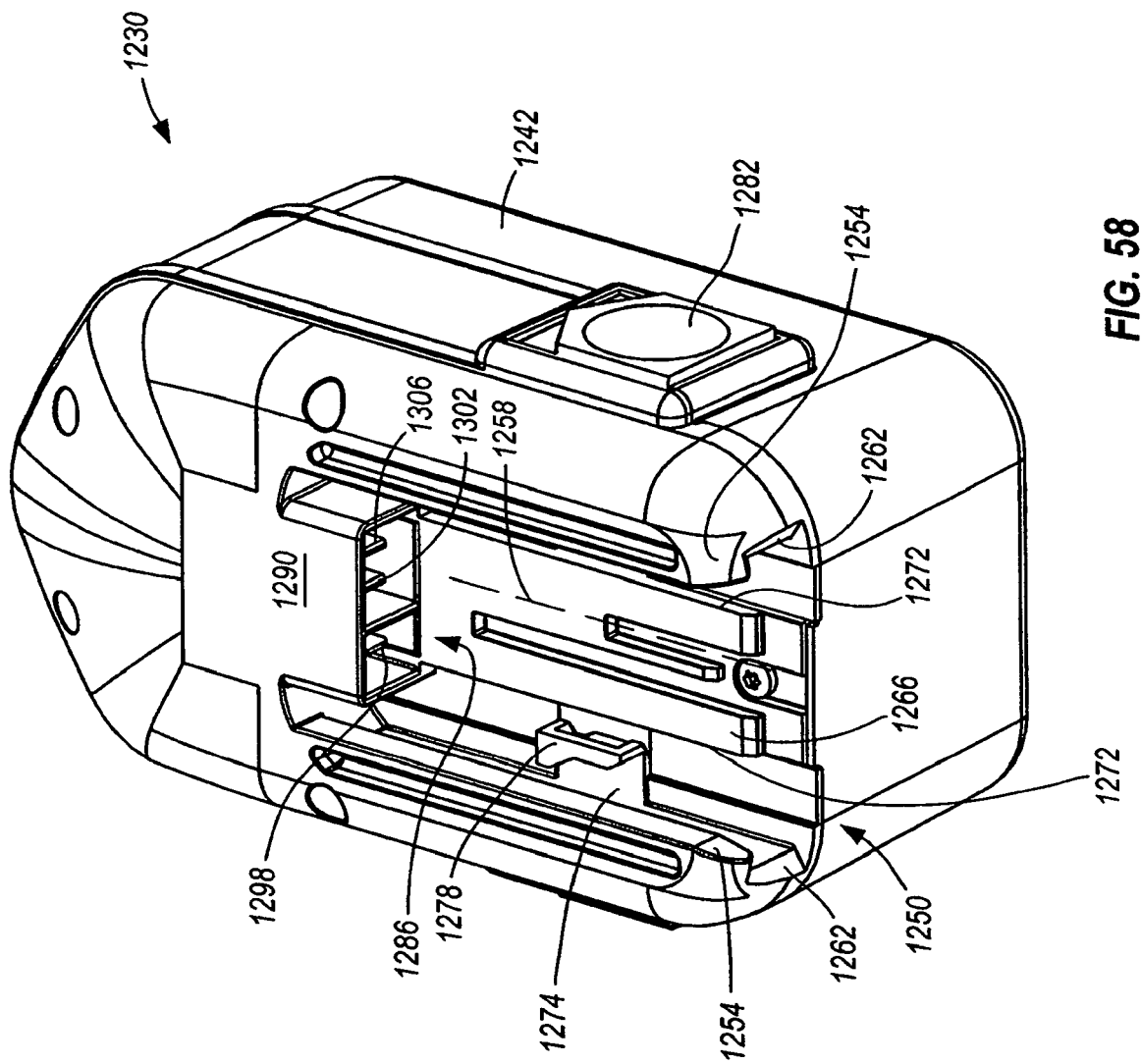
FIG. 58 is a rear perspective view of the battery shown in FIG. 57.
Figure 59:
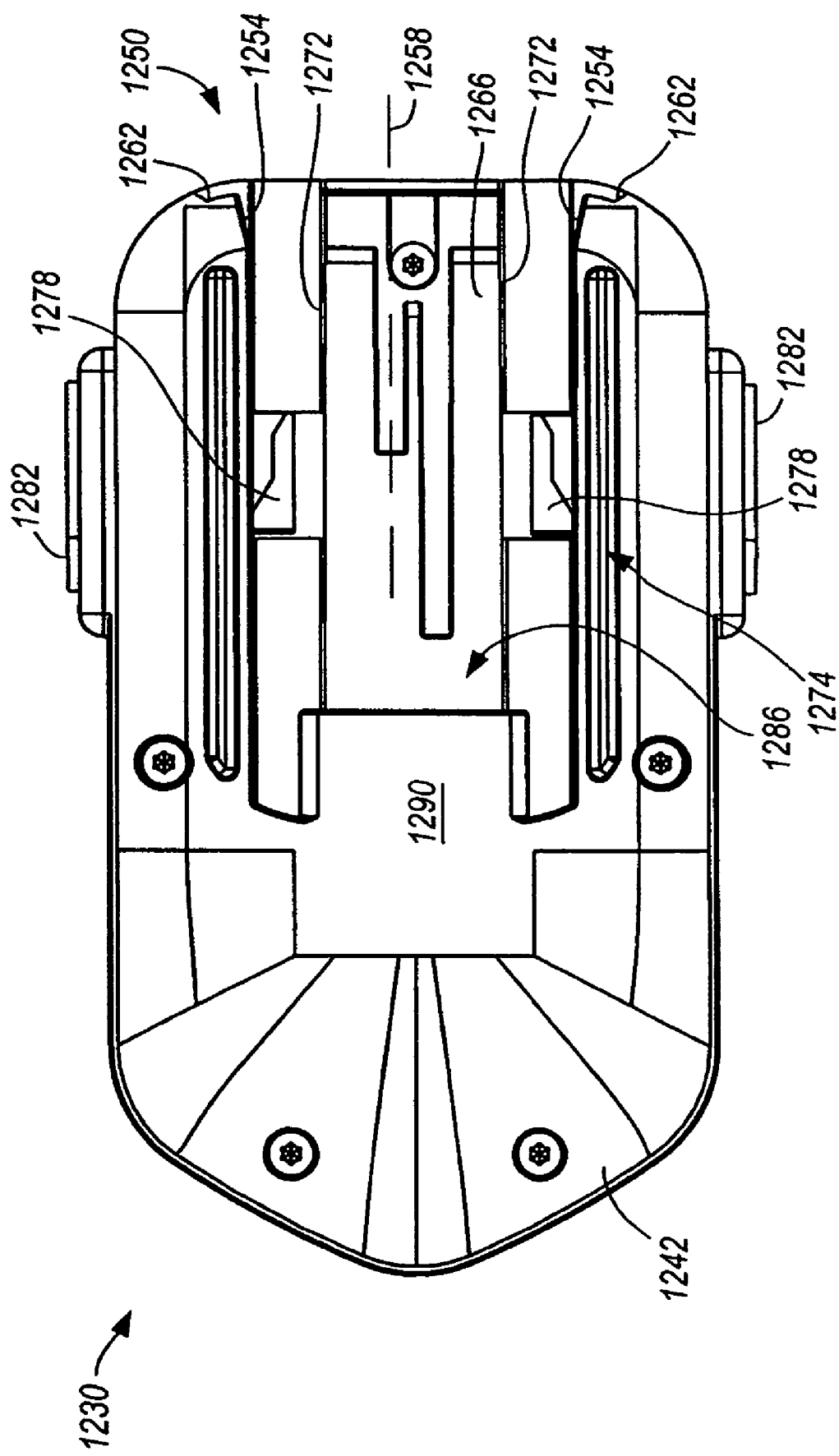
FIG. 59 is a top view of the battery shown in FIG. 57.
Figure 60:
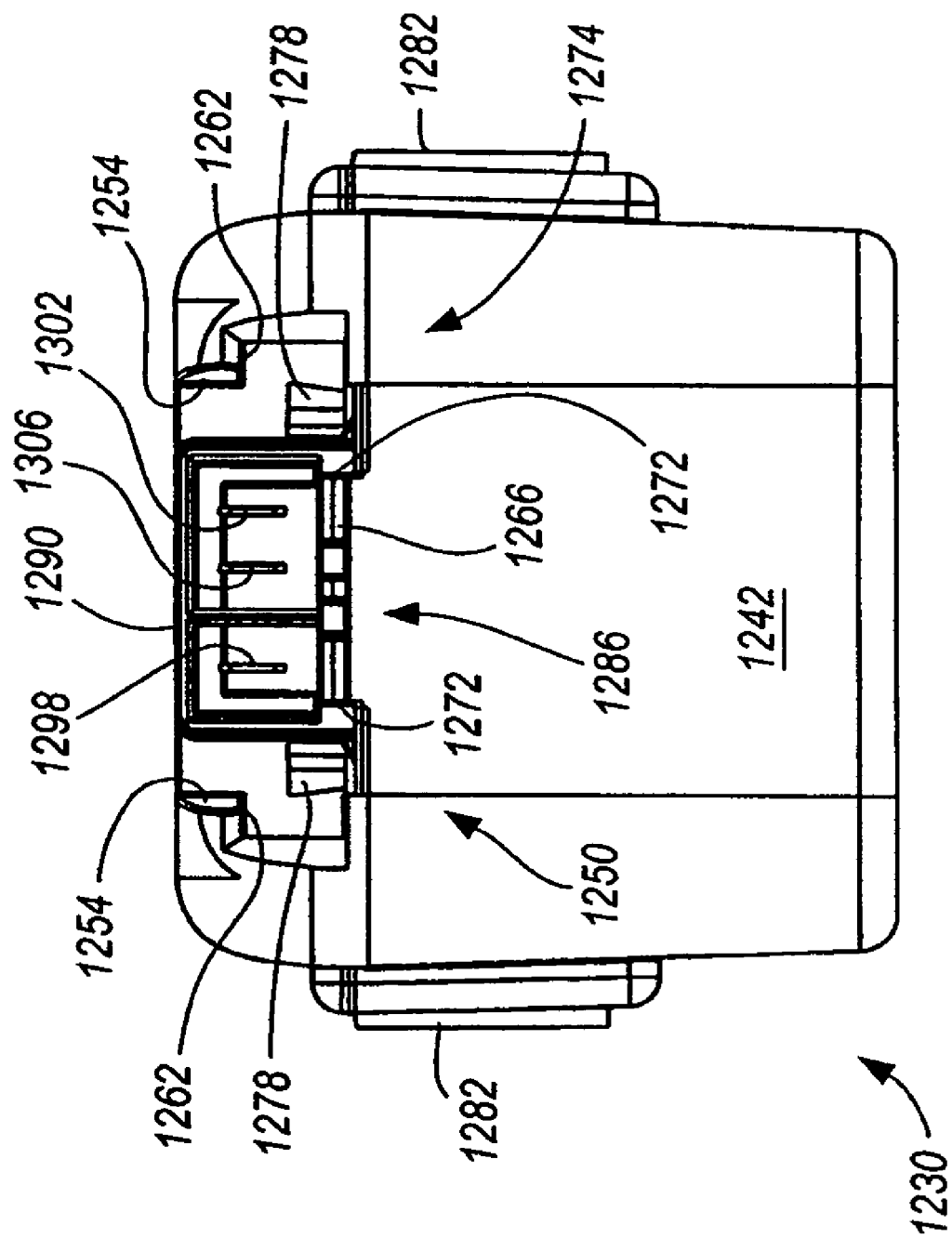
FIG. 60 is a rear view of the battery shown in FIG. 57.

The battery 1230 can include (see FIGS. 58 and 60) a terminal assembly 1286 operable to electrically connect battery cells 1246 to a circuit in the electrical device. The terminal assembly 1286 includes a terminal housing 1290 provided by the housing 1242. The terminal assembly 1286 can include a positive battery terminal 1298, a ground terminal 1302, and a sense terminal 1306. As shown in FIGS. 58 and 60, the terminals 1298, 1302 and 1306 can be oriented in planes which are substantially parallel to one another and can extend along respective axes which are parallel to the support axis 1258.

Figure 61:
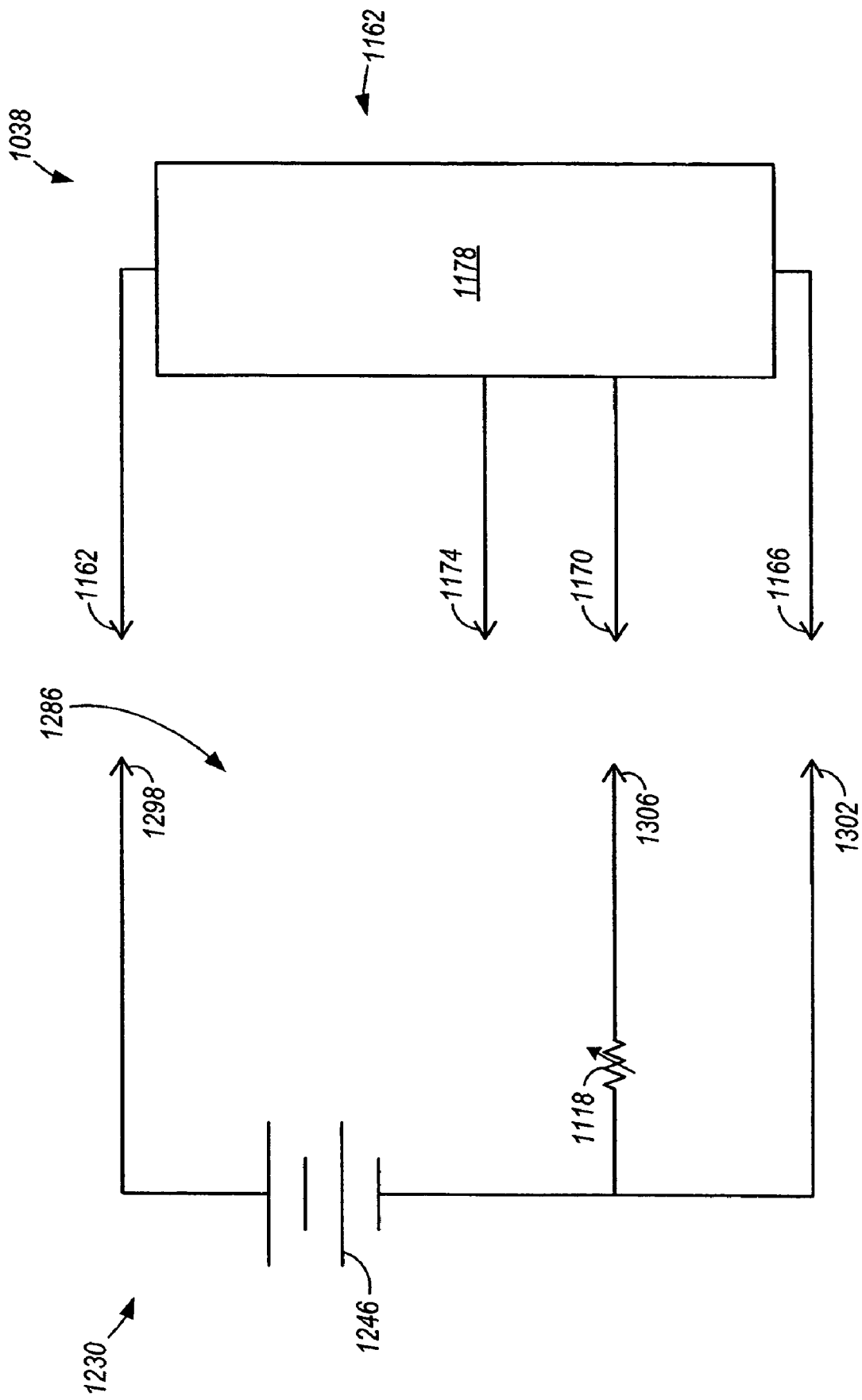
FIG. 61 is a schematic diagram of the prior art battery shown in FIG. 57 and the battery charger shown in FIG. 40.

As schematically illustrated in FIG. 61, the terminals 1298 and 1302 can be connected to the opposite ends of the cell or series of cells 1246. The sense terminal 1306 can be connected to an electrical component 1314 which is connected in the circuit of the battery 1230. In the illustrated construction, the electrical component 1314 can be a temperature-sensing device or thermistor to communicate the temperature of the battery 1230 and/or of the battery cells 1246.

As schematically illustrated in FIG. 61, the battery 1230 can be connectable to the battery charger 1038, and the battery charger 1038 can be operable to charge the battery 1230. The battery terminals 1298, 1302 and 1306 can be connectable to three of the charger terminals 1162, 1166 and 1170, respectively. The microcontroller 1178 can identify the battery 1230 (or determines that the battery 1230 is not a battery 1030 or a battery 1030A) and identify the condition of the electrical component 1314 or thermistor to sense the temperature of the battery 1230. The microcontroller 1178 can control charging of the battery 1230.

The battery 1230 can be supported on the support portion 1130 of the battery charger 1038. The ribs 1150 (shown in FIG. 42) may not engage the ridge 1266 on the support portion 1250 of the battery 1230 (shown in FIGS. 57–60) so that the battery 1230 is not prevented from being connected to the battery charger 1038.

The battery 1230 can be connectable to electrical equipment, such as, for example, the power tool 1034 (shown in FIG. 48A), to power the power tool 1034. The battery 1230 can be supported on the support portion 1186 of the power tool 1034 (shown in FIG. 48B) and can be connectable to the motor 1184 (schematically illustrated in FIG. 48A) to power the motor 1184.

FIGS. 62–65 illustrate another battery charger 1338. The battery charger 1338 can include a charger housing 1342 and a charging circuit 1346 (schematically illustrated in FIG. 65) supported by the housing 1342 and connectable to a power source (not shown). The charging circuit 1346 can be connectable to the terminal assembly 1286 of the battery 1230 and can be operable to transfer power to the battery 1230 to charge the battery cells 1246.

Figure 62:
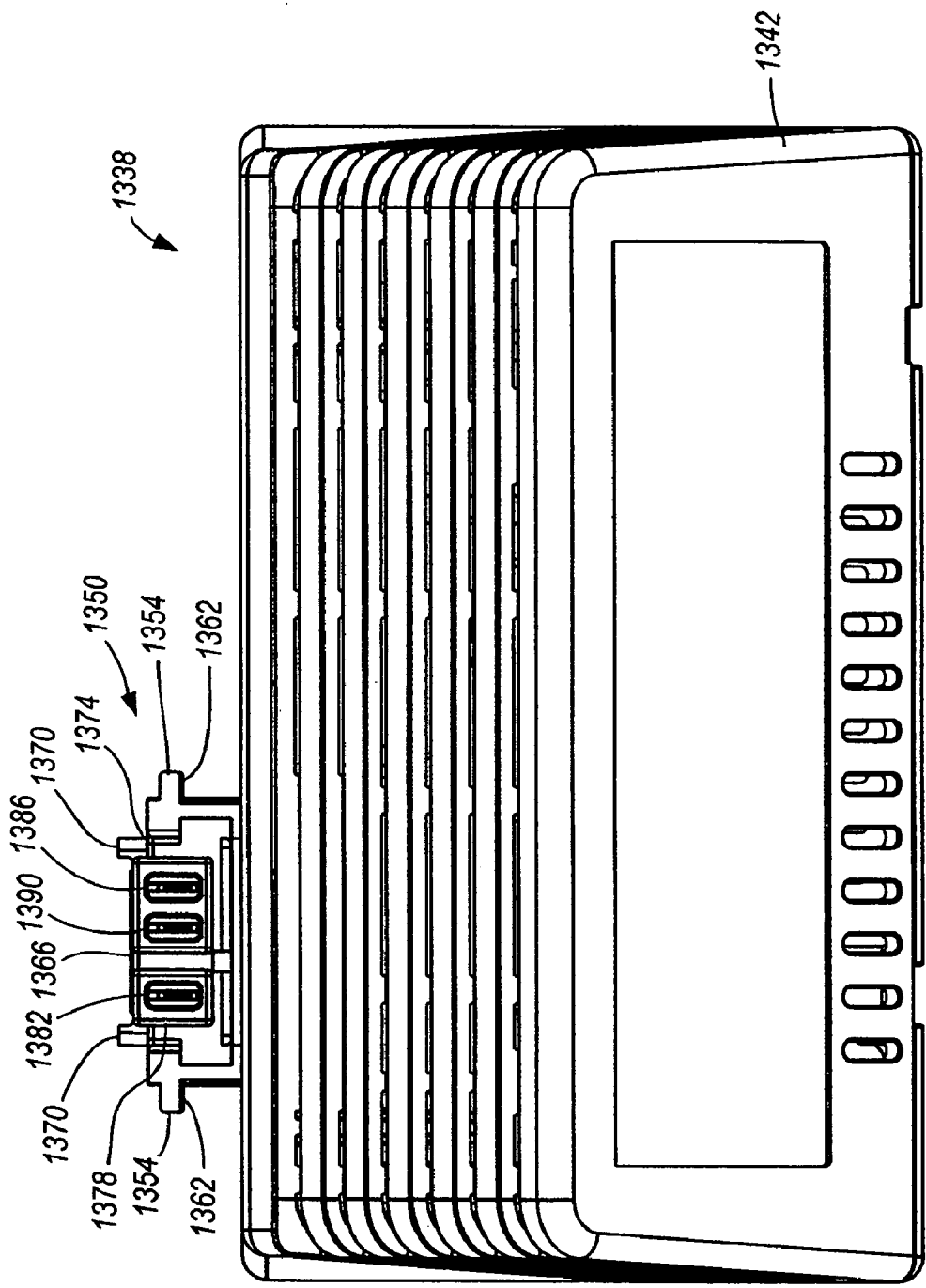
FIG. 62 is a perspective view of a prior art battery charger.
Figure 63:
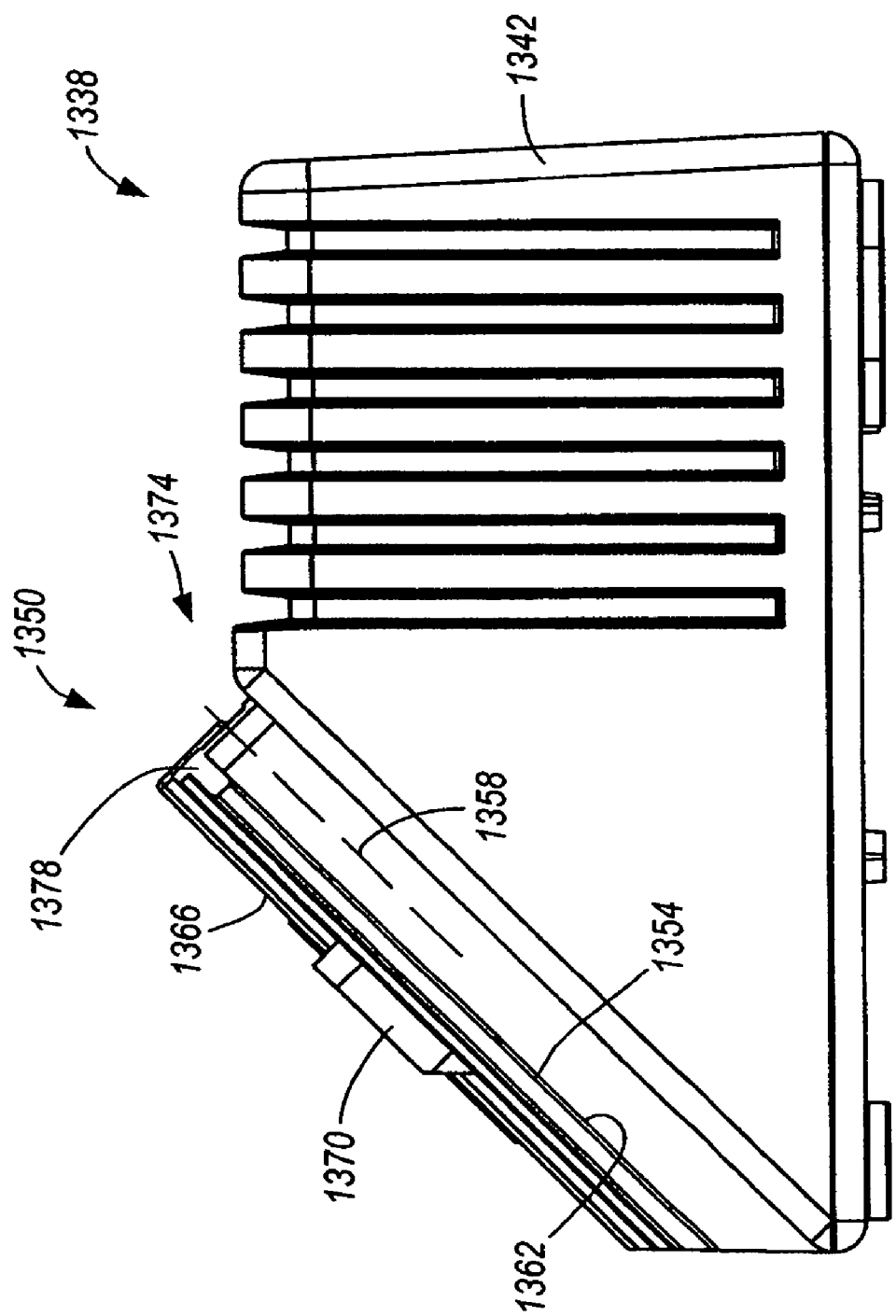
FIG. 63 is a side view of the battery charger shown in FIG. 62.
Figure 64:
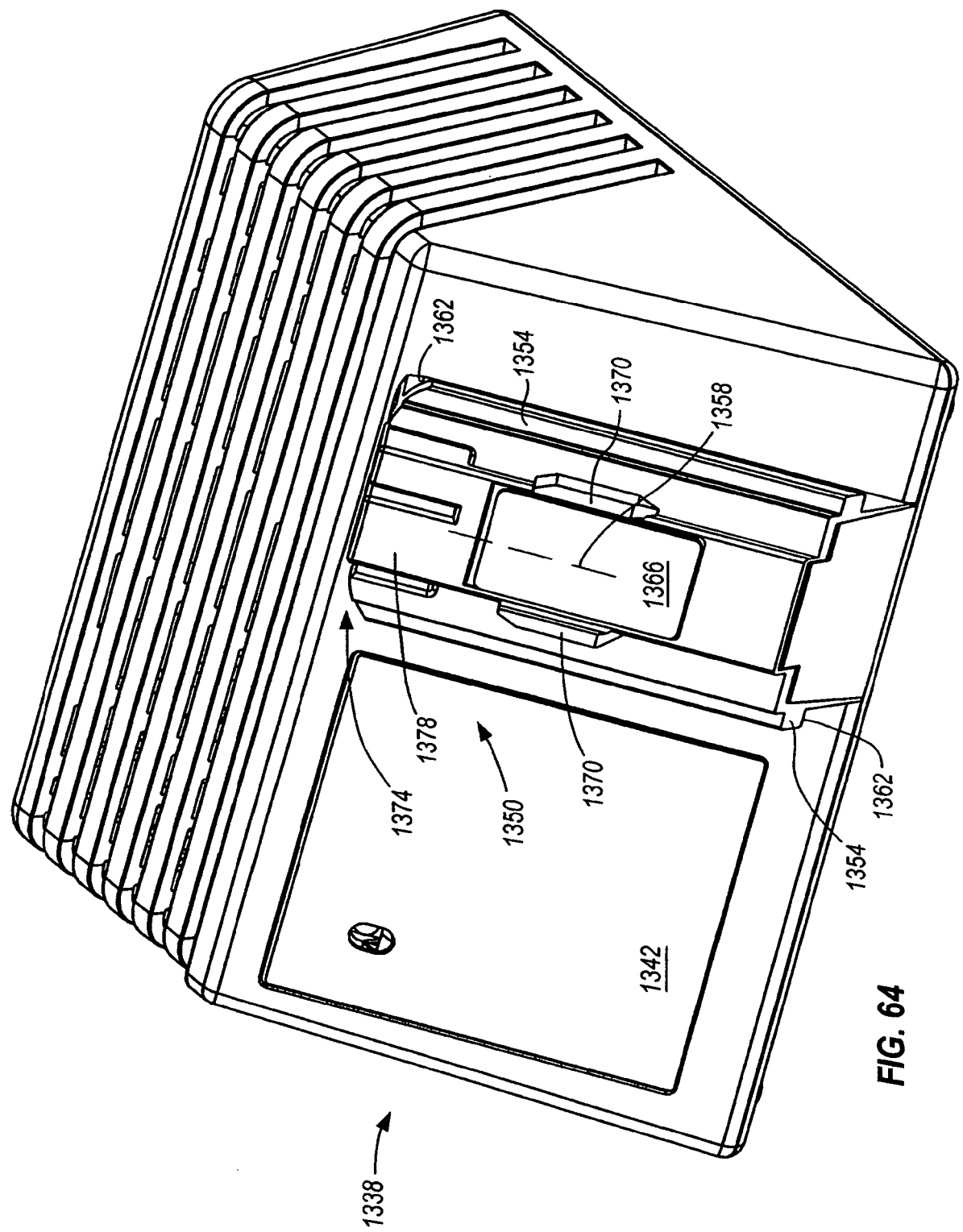
FIG. 64 is another view of the battery charger shown in FIG. 62.

As shown in FIGS. 62–64, the housing 1342 can provide a battery support portion 1350 for supporting the battery 1230. The support portion 1350 can have (see FIG. 62) a generally T-shaped cross section which may be complementary to the C-shaped cross section of the support portion 1250 of the battery 1230 (shown in FIG. 60). The support portion 1350 can include (see FIGS. 62–64) rails 1354 which extend along a support axis 1358 and which define grooves 1362. The support portion 1350 can include a surface 1366 which can be engageable with the ridge 1266.

Projections or ribs 1370 can extend from the surface 1366. The ribs 1370 can extend farther from the surface 1366 than (see FIGS. 43–44) the ribs 1150 extend from the surface 1146 of the battery charger 1038. When the battery 1230 is supported on the support portion 1350, the ribs 1370 can slide along (see FIG. 59) the lateral edges of the ridge 1266 so that the battery 1230 is connectable to the battery charger 1338. The ridge 1266 of the battery 1230 may be more narrow in a lateral direction than (see FIG. 36) the ridge 1066 of the battery 1030 and may not include the extended portions 1072.

Figure 65:
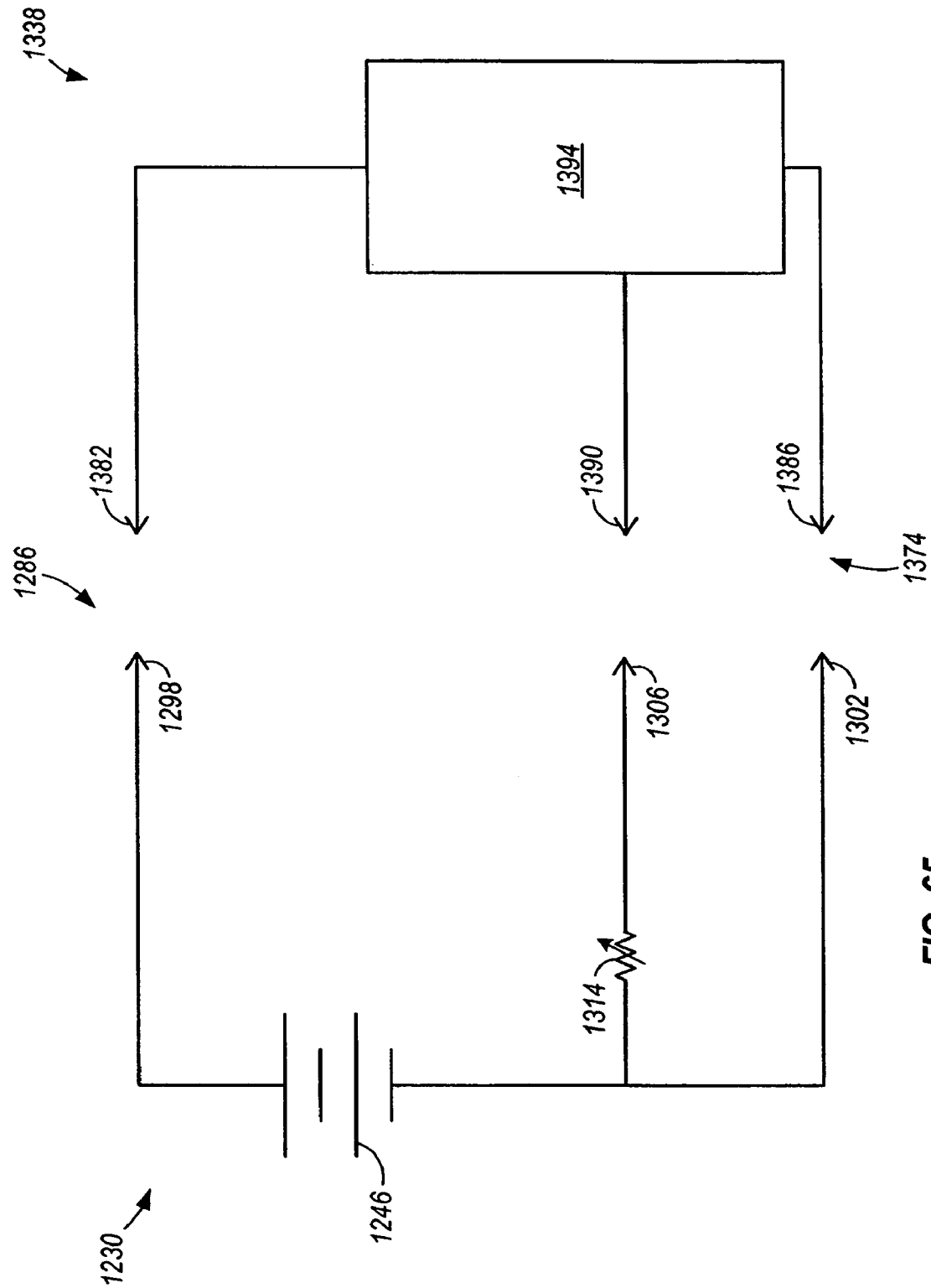
FIG. 65 is a schematic diagram of the prior art battery shown in FIG. 57 and the prior art battery charger shown in FIG. 62.
Figure 13C:
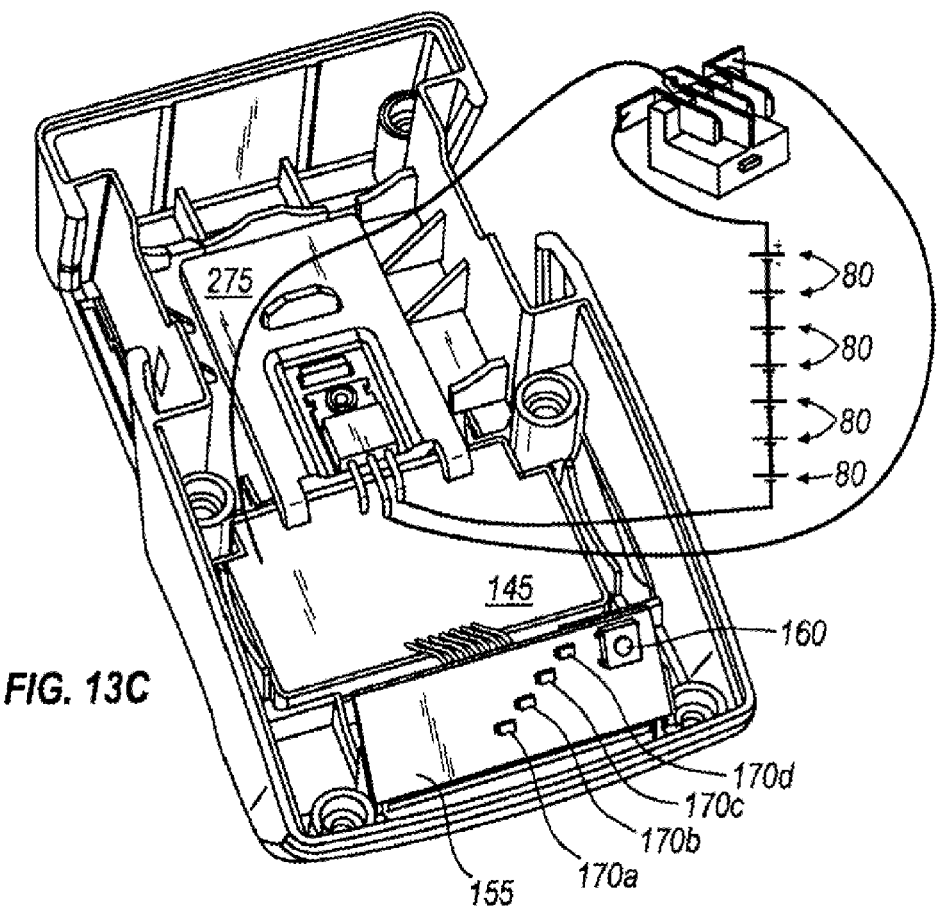
Figure 19:
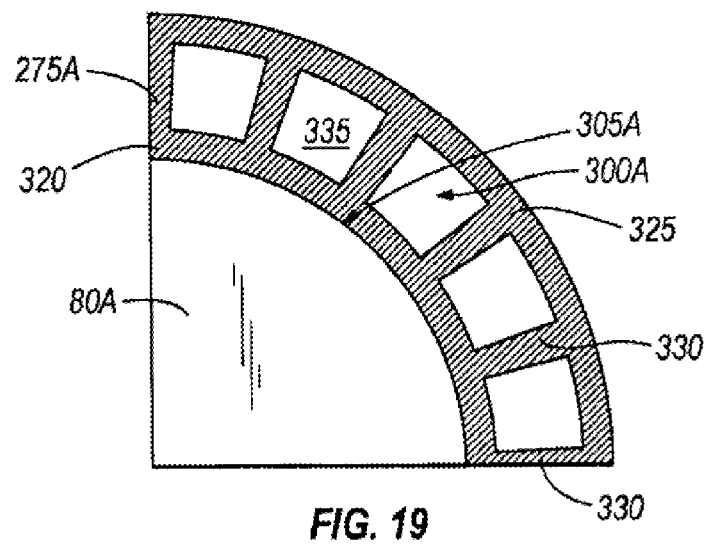
Figure 18:
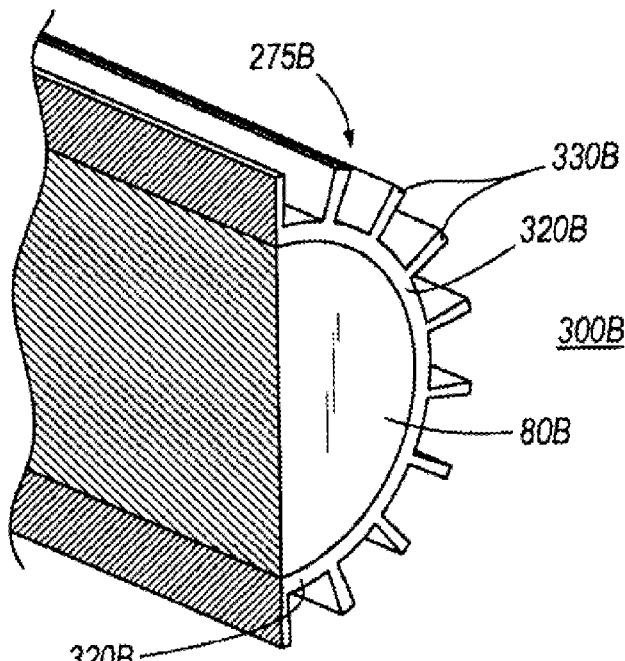
Figure 17:
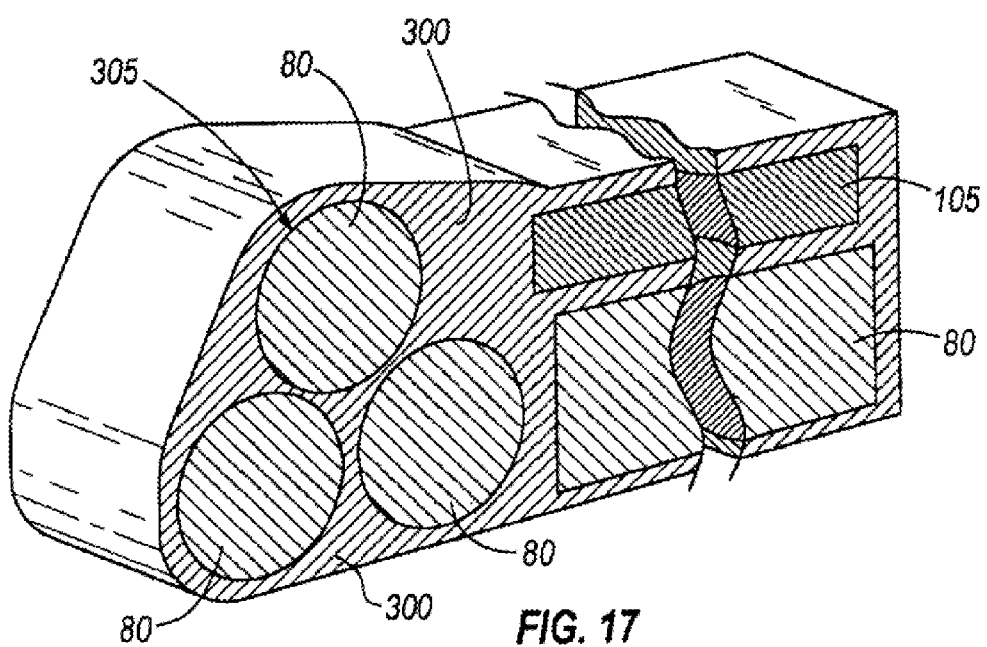
Figure 29:
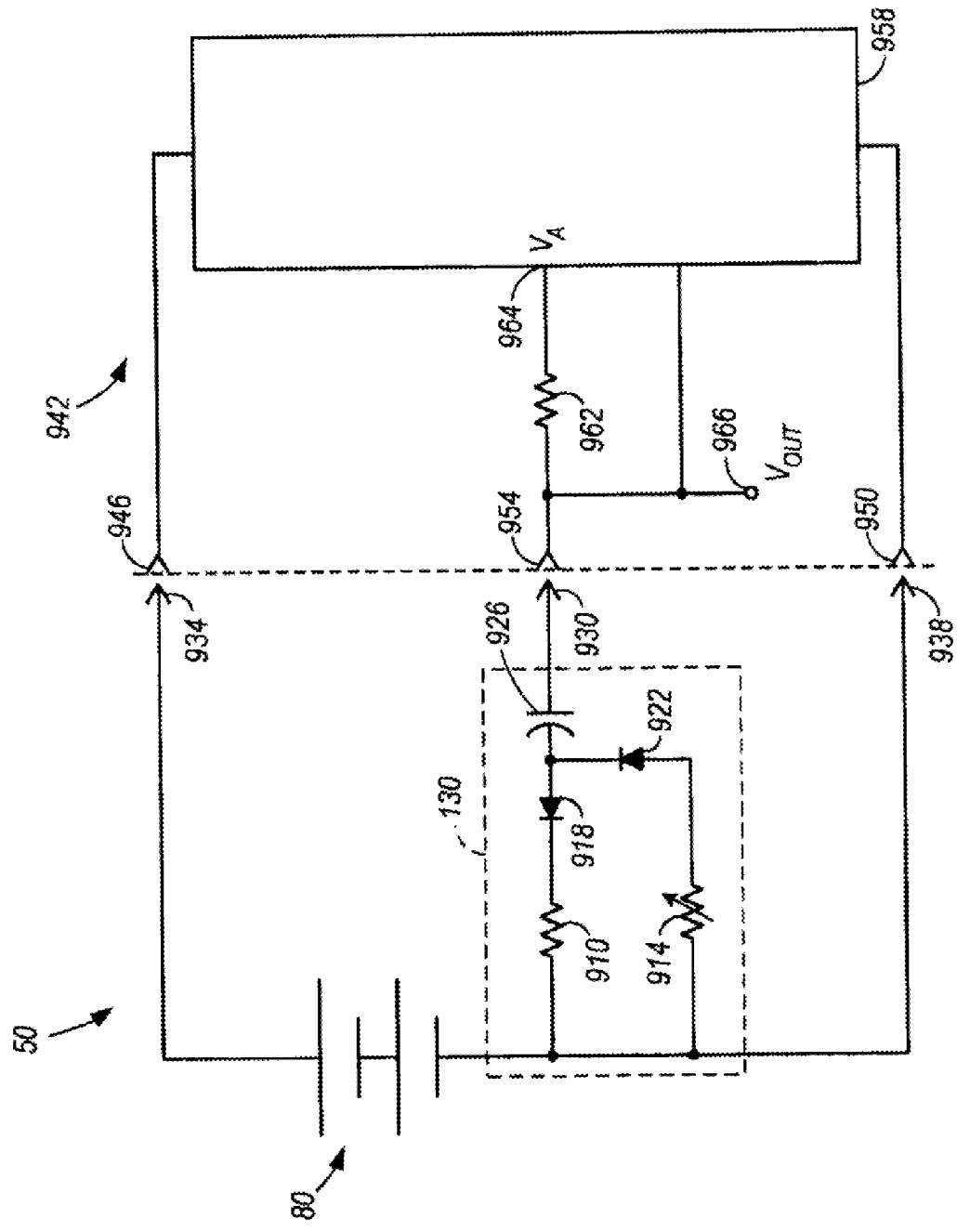
Figure 32:
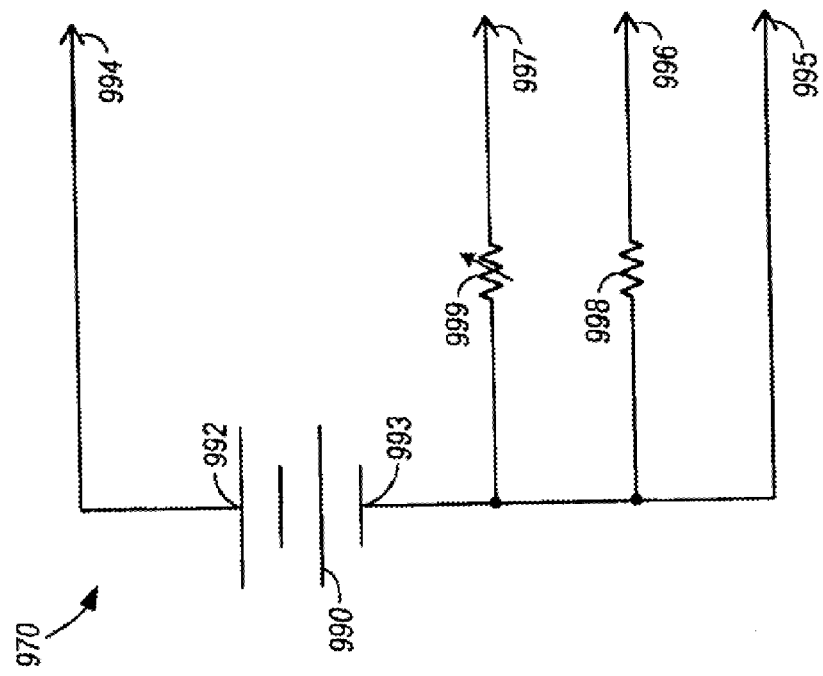
Figure 31:
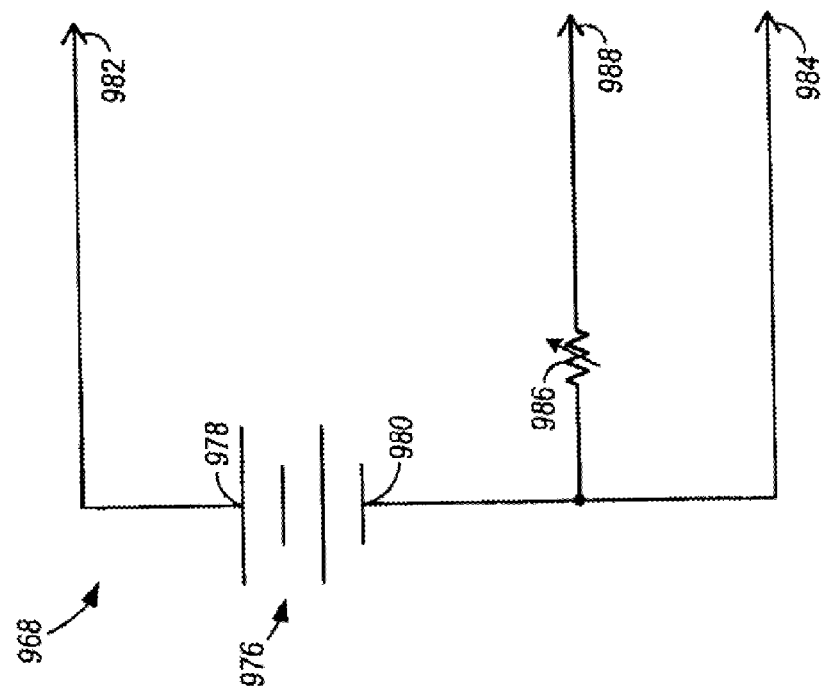
Figure 34:
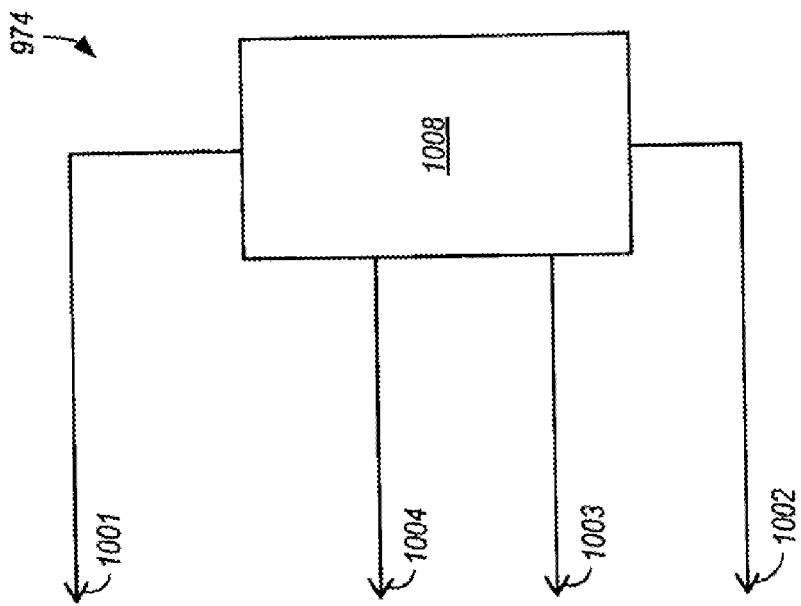
Figure 33:
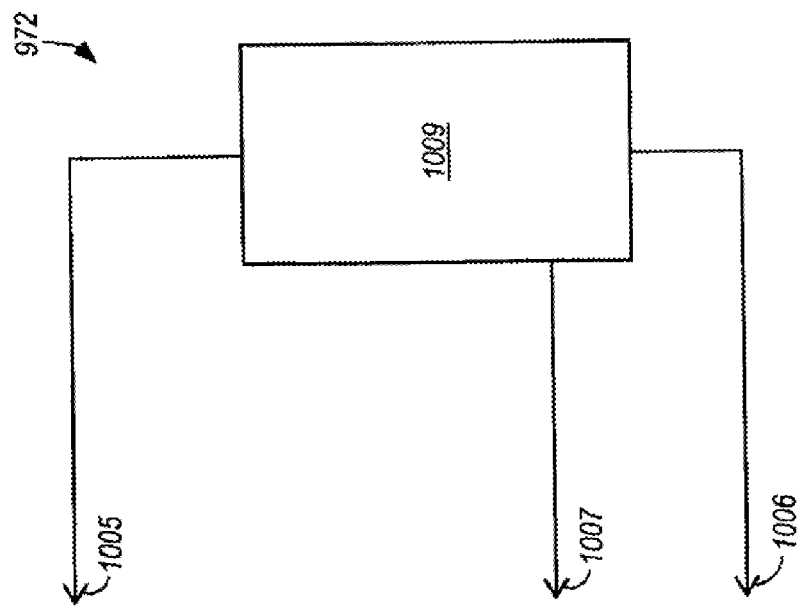

As shown in FIGS. 62–65, the battery charger 1338 can include a terminal assembly 1374 operable to electrically connect the charging circuit 1346 to the terminal assembly 1286 of the battery 1230. The terminal assembly 1374 can include (see FIGS. 62–64) a terminal housing 1378 provided by the support portion 1350. The terminal assembly 1374 also can include a positive terminal 1382, a negative terminal 1386 and a sense terminal 1390. As schematically illustrated in FIG. 65, the charger terminals, 1382, 1386 and 1390 can be connectable to the battery terminals 1298, 1302 and 1306, respectively.

The charging circuit 1346 can include a microcontroller 1394 for controlling charging of the battery 1230. The controller 1394 can determine the temperature of the battery 1230 by sensing the condition of the electrical component 1314 or thermistor. Based upon the determinations made by the controller 1394, the controller 1394 can control the charging circuit 1346 to properly charge the battery 1230.

In an exemplary implementation, if a user attempts to connect the battery 1030 to the battery charger 1338, a portion of the battery charger 1338, such as the upwardly-extended ribs 1370 (shown in FIG. 62), may prevent the battery 1030 from being connected to the battery charger 1338. As the battery 1030 is positioned on the support portion 1350, the ribs 1370 engage the laterally-wider extended portions 1072 of the ridge 1066 of the support portion 1050 of the battery 1030 (shown in FIG. 36) to prevent the battery 1030 from being fully connected to the battery charger 1338. The ribs 1370 are positioned on the support portion 1350 so that the terminal assembly 1086 of the battery 1030 is not connectable to the terminal assembly 1374 of the charger 1338.

In some aspects, the invention provides a battery, such as the battery 1030 or 1030A, and/or a battery charger, such as the battery charger 1038, having additional communication or sense path(s). In some aspects, the invention provides a charger, such as the charger 1038, which is capable of charging battery packs having additional communication or sense path(s), such as the battery 1030 or 1030A, and batteries not having the additional communication or sense path(s), such as the battery 1230. In some aspects, the invention provides a "mechanical lockout" to prevent a battery, such as the battery 1030 or 1030A, from being connected to a charger, such as an existing charger 1338, while the battery, such as the battery 1030 or 1030A, may be used with a corresponding existing electrical device, such as the power tool 1034.

The constructions described above and illustrated in the figures are presented by way of example only and are not intended as a limitation upon the concepts and principles of the present invention. As such, it will be appreciated by one having ordinary skill in the art that various changes in the elements and their configuration and arrangement are possible without departing from the spirit and scope of the present invention as set forth in the appended claims.

The invention claimed is:

1. A Lithium-ion battery pack configured to be interfaced with a power tool, the battery pack comprising:
    a housing;
    a plurality of terminals;
    a plurality of rechargeable Lithium-ion battery cells arranged within and supported by the housing, each of the battery cells having a respective state of charge, power being transferable between the battery cells and the power tool, the battery cells being operable to collectively supply a discharge current of at least 20 Amperes to power the power tool;
    a control circuit supported by the housing and operable to control a plurality of functions of the battery pack including discharging functions, the control circuit including a controller and a thermistor, the control circuit configured to monitor the respective state of charge of each of the battery cells, a state of charge of the battery pack, and a battery pack temperature, the control circuit further configured to control at least one function of the battery pack based on the monitored respective states of charge of the battery cells, the monitored state of charge of the battery pack, or the monitored battery pack temperature;
    a switch configured, when open, to disable transfer of power between the battery cells and the power tool, the switch further configured, when closed, to enable transfer of power between the battery cells and the power tool, the switch including at least one field effect transistor (FET); and
    a heat sink in heat transfer relationship with the switch and operable to dissipate heat from the switch.

2. The battery pack as set forth in claim 1 wherein the heat sink is in heat transfer relationship with the controller and operable to dissipate heat from the controller.

3. The battery pack as set forth in claim 1 wherein a function controlled by the control circuit includes interrupting the transfer of power between the battery cells and the power tool.

4. The battery pack as set forth in claim 1 wherein the switch is coupled to the heat sink.

5. The battery pack as set forth in claim 1 wherein the supply of discharge current is conducted through the switch, the switch generating heat when conducting the supply of discharge current.

6. The battery pack as set forth in claim 1 wherein the FET is physically mounted on the heat sink and in heat transfer relationship with the heat sink.

7. The battery pack as set forth in claim 1 wherein the switch includes a first FET and a second FET, and wherein the heat sink is in heat transfer relationship with the first FET and the second FET and operable to dissipate heat from the first FET and the second FET.

8. The battery pack as set forth in claim 1 wherein the control circuit is further configured to identify an electrical device based at least in part on a resistor contained in the electrical device.

9. The battery pack as set forth in claim 8 wherein the electrical device is the battery pack.

10. The battery pack as set forth in claim 1 wherein the control circuit is further configured to control an operating parameter of the power tool.

11. The battery pack as set forth in claim 10 wherein the operating parameter is motor speed.

12. The battery pack as set forth in claim 1 wherein the power tool is one of a circular saw and a driver drill.

13. The battery pack as set forth in claim 1 wherein the switch is electrically connected to the control circuit.

* * * * *

UNITED STATES PATENT AND TRADEMARK OFFICE
CERTIFICATE OF CORRECTION

| | | |
|---|---|---|
| PATENT NO. | : 7,164,257 B2 | Page 1 of 1 |
| APPLICATION NO. | : 11/322862 | |
| DATED | : January 16, 2007 | |
| INVENTOR(S) | : Todd W. Johnson et al. | |

It is certified that error appears in the above-identified patent and that said Letters Patent is hereby corrected as shown below:

Title Page, item (56)

Page 2 - Foreign Patent Documents

EP 0950864 should be EP 0940864

Signed and Sealed this

Fifth Day of June, 2007

JON W. DUDAS
*Director of the United States Patent and Trademark Office*

UNITED STATES PATENT AND TRADEMARK OFFICE
CERTIFICATE OF CORRECTION

PATENT NO. : 7,164,257 B2
APPLICATION NO. : 11/322862
DATED : January 16, 2007
INVENTOR(S) : Todd W. Johnson et al.

It is certified that error appears in the above-identified patent and that said Letters Patent is hereby corrected as shown below:

Figures 17-19, 29, and 31-34 include numbering errors. Please correct Figures 17-19, 29, and 31-34 by replacing them with the attached figures of the same numbers. Attached Figures 17-19, 29, and 31-34 correct mis-numbered reference numbers and include reference numbers that were inadvertently omitted.

Column 5, line 23, delete "the" after "In".

Column 6, line 52, insert --110, 115 and 120-- after "terminals"; line 65, "print" should read --printed--.

Column 7, line 24, "illustrate" should read --illustrated--.

Column 8, line 42, "fall" should read --falls--.

Column 9, line 42, "providing" should read --provide--.

Column 10, line 42, "from" should read --for--.

Column 11, line 17, "11e" should read --11E--.

Figure 10:
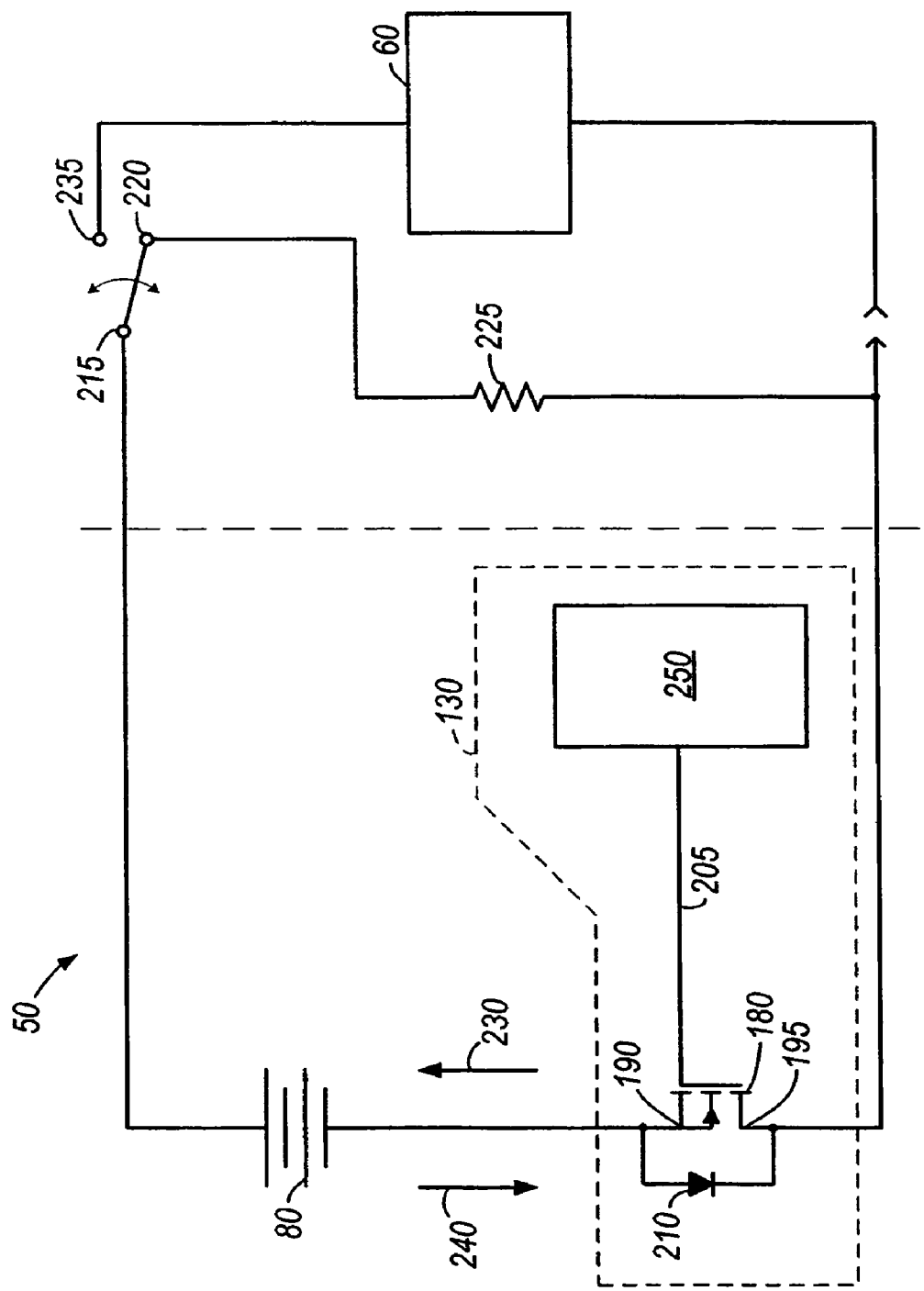
FIG. 10 is still another schematic view of a battery, such as one of the batteries shown in FIGS. 1–3.

Column 12, line 1, "FIGS. 7-9" should read --FIG. 7--; line 42, "4 and 5" should read --9 and 10--; lines 47 and 53, "FIG. 5" should read --FIG. 10-- in both instances.

Column 13, lines 61 and 64, "that" should read --the-- in both instances.

Column 14, line 7, "20" should read --50--; line 64, "my" should read --may--.

Column 15, lines 31 and 33, "20" should read --50-- in both instances; line 32, "disable" should read --disabling--.

Column 17, lines 11 and 14, "20-22" should read --17-19-- in both instances; line 25, "20" should read --17--; line 66, "21 and 22" should read --18 and 19--.

Figure 19:
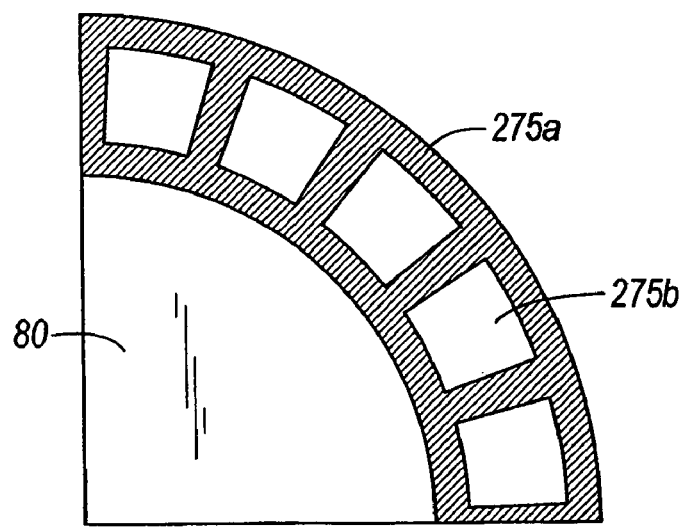
FIG. 19 is a cross-sectional view of a portion of yet another alternate construction of a battery, including a phase change material and a heat sink.
Figure 14D:
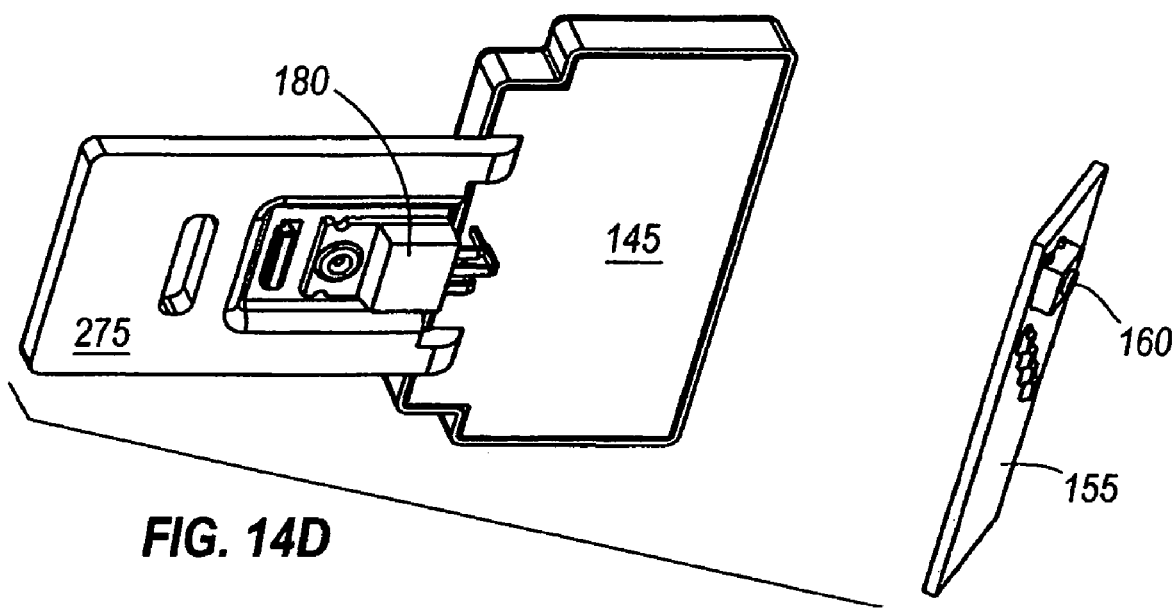
Figure 14E:
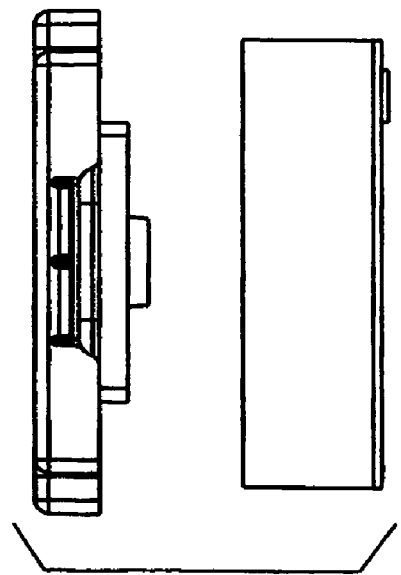
Figure 15:
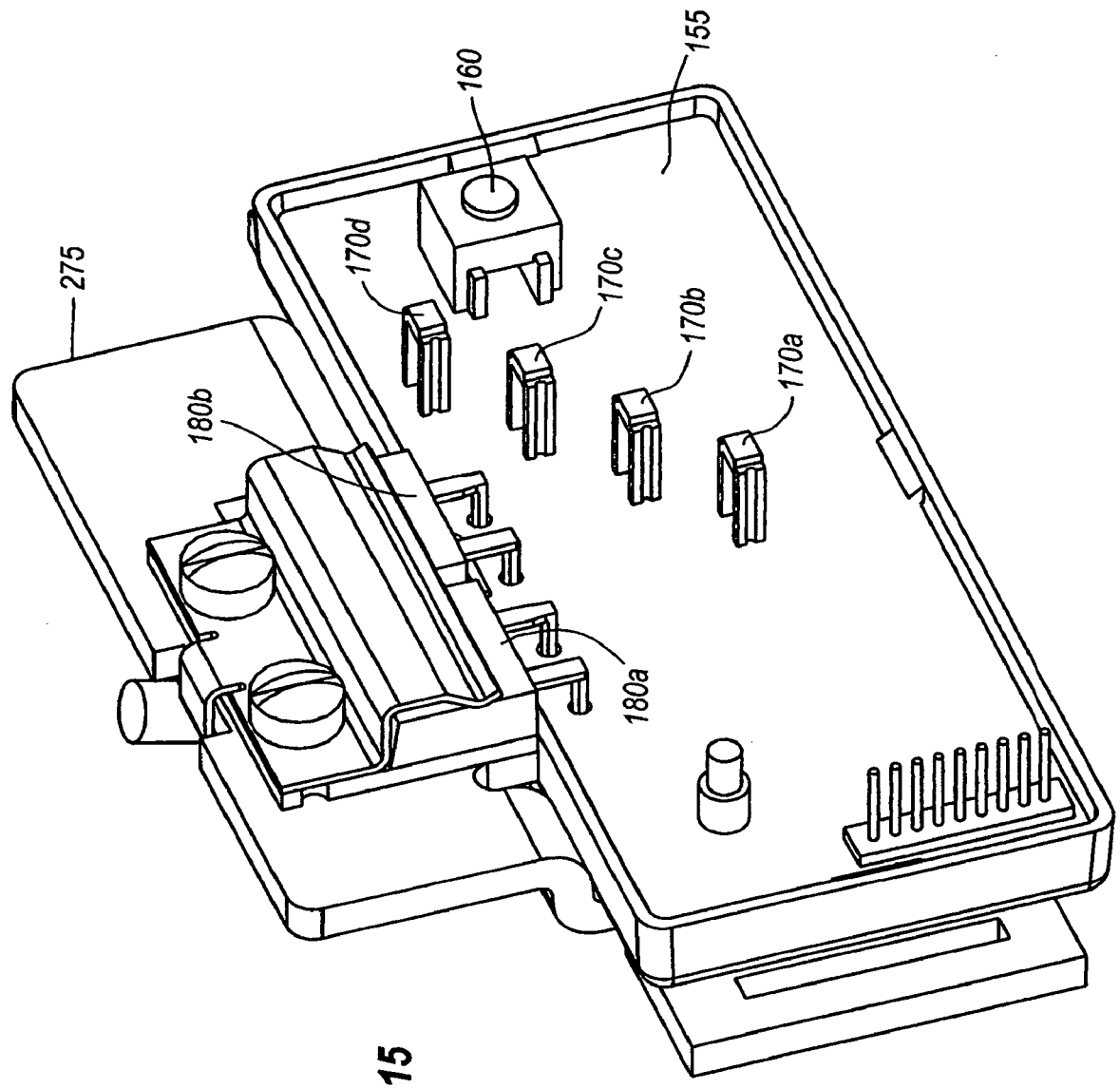
FIG. 15 is a perspective view of a portion of a battery, such as one of the batteries shown in FIGS. 1–3, with portions removed and illustrates the FET and the heat sink
Figure 16:
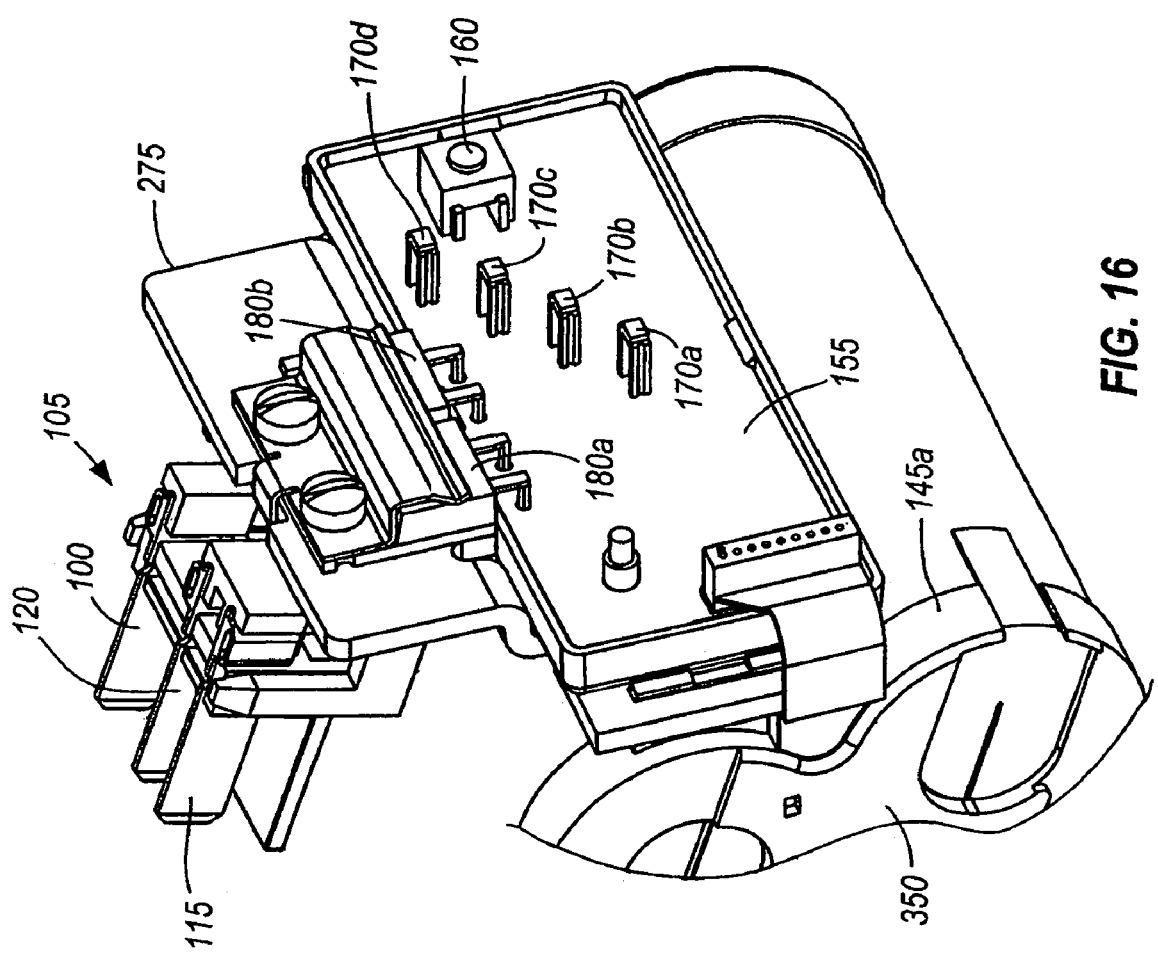
FIG. 16 is another perspective view of a portion of a battery, such as one of the batteries shown in FIGS. 1–3, with portions removed and illustrates the FET and the heat sink.
Figure 18:
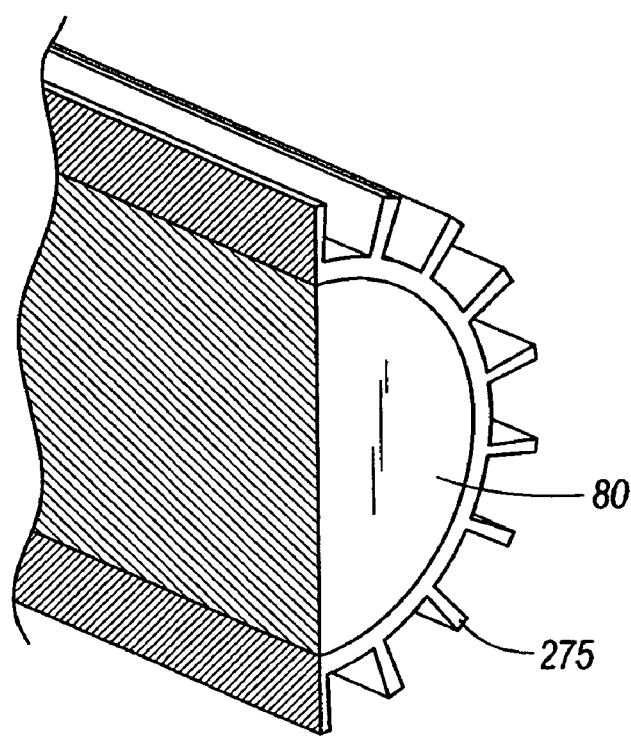
FIG. 18 is a cross-sectional view of a portion of another alternate construction of a battery including a phase change material and a heat sink.
Figure 17:
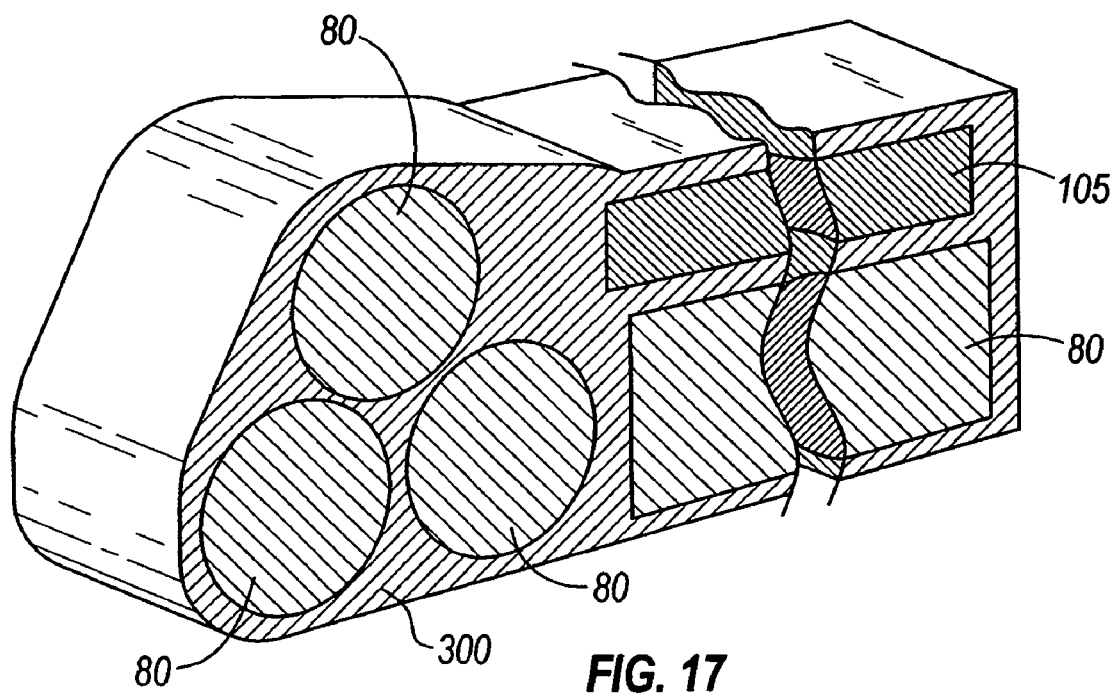
FIG. 17 is a perspective cross-sectional view of a portion of an alternate construction of a battery, including a phase change material.
Figure 20B:
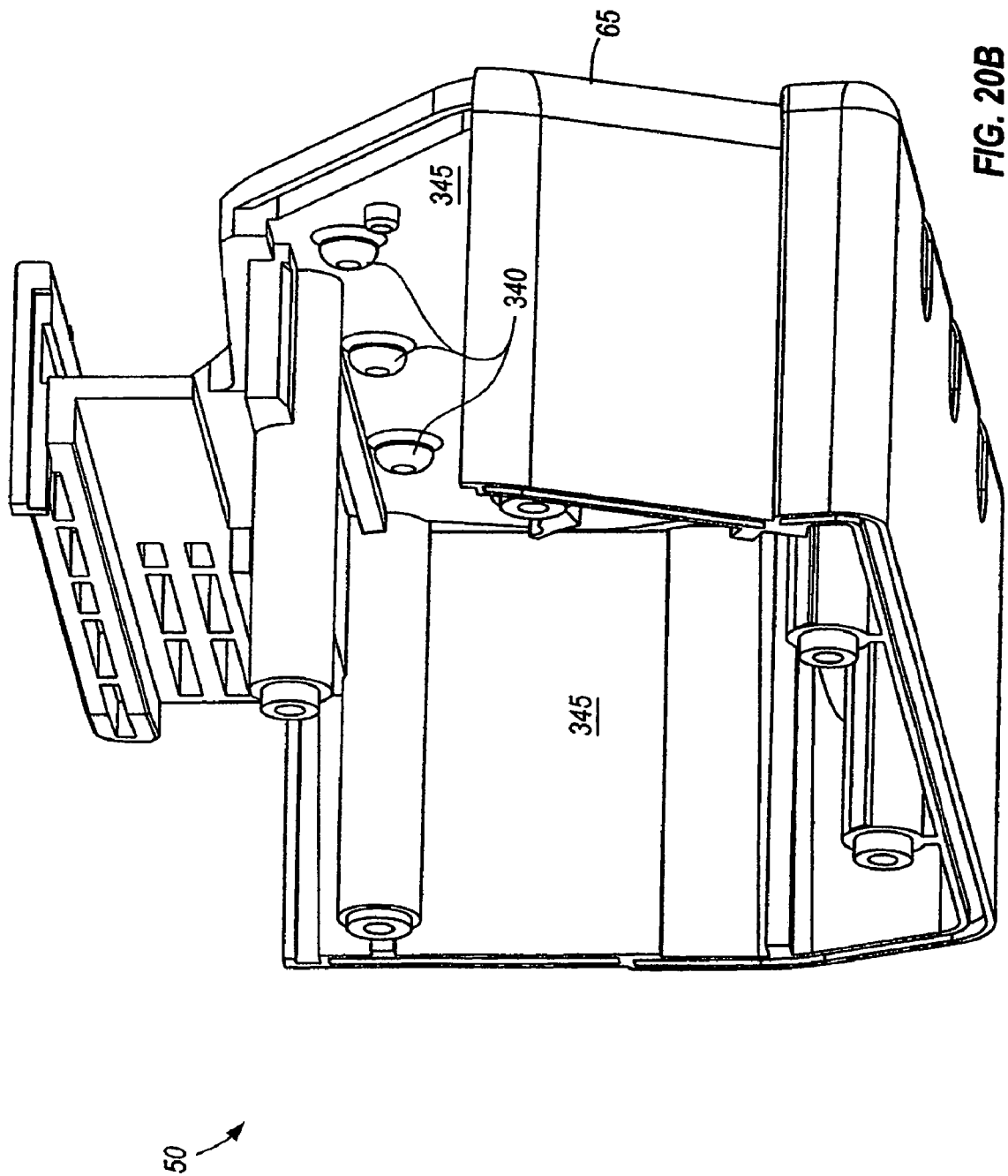

Column 18, line 12, "21 and 22" should read --18 and 19--; lines 13 and 22, "FIG. 21" should read --FIG. 19-- in both instances; line 27, "FIG. 22" should read --FIG. 18--; lines 47 and 50, "345" should read --340-- in both instances; line 56, insert --400-- after "housing"; line 57, "connecting" should read --connection--.

Column 19, line 36, "pack" should read --battery--.

UNITED STATES PATENT AND TRADEMARK OFFICE
CERTIFICATE OF CORRECTION

PATENT NO. : 7,164,257 B2
APPLICATION NO. : 11/322862
DATED : January 16, 2007
INVENTOR(S) : Todd W. Johnson et al.

It is certified that error appears in the above-identified patent and that said Letters Patent is hereby corrected as shown below:

Column 20, line 15, "sown" should read --shown--; line 20, "115a" should read --155a--; line 26, "160" should read --160a--; line 31, "include" should read --includes--; line 35, "105" should read --110--; line 36, "110" should read --115--.

Column 22, line 29, delete "a" after "are"; line 66, "cell" should read --cells--.

Column 23, line 8, delete "included" after "longer"; line 12, "construction" should read --constructions--.

Column 25, line 6, insert --other-- after "chemistry" and insert --those-- after "than".

Column 30, line 52, "1034" should read --1074--.

Column 32, line 20, "constructions" should read --construction--; line 51, "35, 37-39" should read --35 and 37-39--.

Column 34, line 18, insert --and-- after "1262,".

Signed and Sealed this

Twenty-ninth Day of July, 2008

JON W. DUDAS
*Director of the United States Patent and Trademark Office*

US007164257C1

(12) EX PARTE REEXAMINATION CERTIFICATE (9646th)
United States Patent
Johnson et al.

(10) Number: US 7,164,257 C1
(45) Certificate Issued: May 13, 2013

(54) METHOD AND SYSTEM FOR PROTECTION OF A LITHIUM-BASED MULTICELL BATTERY PACK INCLUDING A HEAT SINK

(75) Inventors: Todd W. Johnson, Wauwatosa, WI (US); Dennis J. Grzybowski, New Berlin, WI (US); Mark A. Kubale, West Bend, WI (US); Jay J. Rosenbecker, Menomonee Falls, WI (US); Karl F. Scheucher, Waite Hill, OH (US); Gary D. Meyer, Waukesha, WI (US); Jeffrey M. Zeiler, Delafield, WI (US); Kevin L. Glasgow, Lomira, WI (US)

(73) Assignee: Milwaukee Electric Tool Corporation, Brookfield, WI (US)

Reexamination Request:
No. 90/012,039, Dec. 9, 2011

Reexamination Certificate for:
Patent No.: 7,164,257
Issued: Jan. 16, 2007
Appl. No.: 11/322,862
Filed: Dec. 30, 2005

Certificate of Correction issued Jun. 5, 2007
Certificate of Correction issued Jul. 29, 2008

Related U.S. Application Data

(62) Division of application No. 10/720,027, filed on Nov. 20, 2003, now Pat. No. 7,157,882.

(60) Provisional application No. 60/523,716, filed on Nov. 19, 2003, provisional application No. 60/523,712, filed on Nov. 19, 2003, provisional application No. 60/440,693, filed on Jan. 17, 2003, provisional application No. 60/440,692, filed on Jan. 17, 2003, provisional application No. 60/428,358, filed on Nov. 22, 2002, provisional application No. 60/428,452, filed on Nov. 22, 2002, provisional application No. 60/428,450, filed on Nov. 22, 2002.

(51) Int. Cl.
*H01M 10/46* (2006.01)

(52) U.S. Cl.
USPC ............................ 320/134; 320/114; 361/709

(58) Field of Classification Search
None
See application file for complete search history.

(56) References Cited

To view the complete listing of prior art documents cited during the proceeding for Reexamination Control Number 90/012,039, please refer to the USPTO's public Patent Application Information Retrieval (PAIR) system under the Display References tab.

*Primary Examiner* — Anjan Deb

(57) ABSTRACT

A system and method for battery protection. In some aspects, a battery pack including a housing, a cell supported by the housing and power being transferable between the cell and an electrical device, a circuit supported by the housing and operable to control a function of the battery pack, and a heat sink in heat transfer relationship with the circuit and operable to dissipate heat from the circuit.

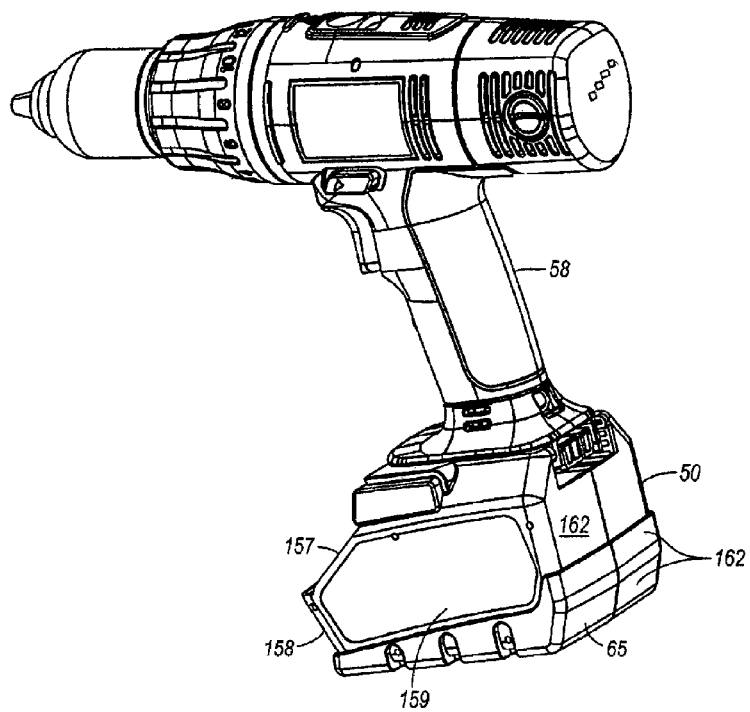

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 4, 6, 7 and 12 are determined to be patentable as amended.

Claims 2, 3, 5, 8, 9, 10, 11 and 13, dependent on an amended claim, are determined to be patentable.

New claims 14-21 are added and determined to be patentable.

1. A Lithium-ion battery pack configured to be interfaced with a *hand held* power tool, the battery pack comprising:
   a housing *connectable to and supportable by the hand held power tool*;
   a plurality of terminals;
   a plurality of rechargeable Lithium-ion battery cells arranged within and supported by the housing, each of the battery cells having a respective state of charge, power being transferable between the battery cells and the power tool, the battery cells being operable to collectively supply a discharge current of at least 20 Amperes to power the power tool;
   a control circuit supported by the housing and operable to control a plurality of functions of the battery pack including discharging functions, the control circuit including a controller and a thermistor, the control circuit configured to monitor the respective state of charge of each of the battery cells, a state of charge of the battery pack, and a battery pack temperature, the control circuit further configured to control at least one function of the battery pack based on the monitored respective states of charge of the battery cells, the monitored state of charge of the battery pack, or the monitored battery pack temperature;
   a switch configured, when open, to disable transfer of power between the battery cells and the power tool, the switch further configured, when closed, to enable transfer of power between the battery cells and the power tool, the switch including at least one field effect transistor (FET); and
   a heat sink in heat transfer relationship with the switch and operable to dissipate heat from the switch.

4. [The battery pack as set forth in claim 1] *A Lithium-ion battery pack configured to be interfaced with a power tool, the battery pack comprising:*
   *a housing;*
   *a plurality of terminals;*
   *a plurality of rechargeable Lithium-ion battery cells arranged within and supported by the housing, each of the battery cells having a respective state of charge, power being transferable between the battery cells and the power tool, the battery cells being operable to collectively supply a discharge current of at least 20 Amperes to power the power tool;*
   *a control circuit supported by the housing and operable to control a plurality of functions of the battery pack including discharging functions, the control circuit including a controller and a thermistor, the control circuit configured to monitor the respective state of charge of each of the battery cells, a state of charge of the battery pack, and a battery pack temperature, the control circuit further configured to control at least one function of the battery pack based on the monitored respective states of charge of the battery cells, the monitored state of charge of the battery pack, or the monitored battery pack temperature;*
   *a switch configured, when open, to disable transfer of power between the battery cells and the power tool, the switch further configured, when closed, to enable transfer of power between the battery cells and the power tool, the switch including at least one field effect transistor (FET); and*
   *a heat sink in heat transfer relationship with the switch and operable to dissipate heat from the switch;*
   wherein the switch is coupled to the heat sink.

6. [The battery pack as set forth in claim 1] *A Lithium-ion battery pack configured to be interfaced with a power tool, the battery pack comprising:*
   *a housing;*
   *a plurality of terminals;*
   *a plurality of rechargeable Lithium-ion battery cells arranged within and supported by the housing, each of the battery cells having a respective state of charge, power being transferable between the battery cells and the power tool, the battery cells being operable to collectively supply a discharge current of at least 20 Amperes to power the power tool;*
   *a control circuit supported by the housing and operable to control a plurality of functions of the battery pack including discharging functions, the control circuit including a controller and a thermistor, the control circuit configured to monitor the respective state of charge of each of the battery cells, a state of charge of the battery pack, and a battery pack temperature, the control circuit further configured to control at least one function of the battery pack based on the monitored respective states of charge of the battery cells, the monitored state of charge of the battery pack, or the monitored battery pack temperature;*
   *a switch configured, when open, to disable transfer of power between the battery cells and the power tool, the switch further configured, when closed, to enable transfer of power between the battery cells and the power tool, the switch including at least one field effect transistor (FET); and*
   *a heat sink in heat transfer relationship with the switch and operable to dissipate heat from the switch;*
   wherein the FET is physically mounted on the heat sink and in heat transfer relationship with the heat sink.

7. The battery pack as set forth in claim [1] *6* wherein the switch includes [a first FET and] a second FET, and wherein the heat sink is in heat transfer relationship with [the first FET and] the second FET and operable to dissipate heat from [the first FET and] the second FET.

12. [The battery pack as set forth in claim 1] *A Lithium-ion battery pack configured to be interfaced with a power tool, the battery pack comprising:*
    *a housing;*
    *a plurality of terminals;*
    *a plurality of rechargeable Lithium-ion battery cells arranged within and supported by the housing, each of* the battery cells having a respective state of charge, power being transferable between the battery cells and the power tool, the battery cells being operable to collectively supply a discharge current of at least 20 Amperes to power the power tool;

a control circuit supported by the housing and operable to control a plurality of functions of the battery pack including discharging functions, the control circuit including a controller and a thermistor, the control circuit configured to monitor the respective state of charge of each of the battery cells, a state of charge of the battery pack, and a battery pack temperature, the control circuit further configured to control at least one function of the battery pack based on the monitored respective states of charge of the battery cells, the monitored state of charge of the battery pack, or the monitored battery pack temperature;

a switch configured, when open, to disable transfer of power between the battery cells and the power tool, the switch further configured, when closed, to enable transfer of power between the battery cells and the power tool, the switch including at least one field effect transistor (FET); and a heat sink in heat transfer relationship with the switch and operable to dissipate heat from the switch;

wherein the power tool is one of a circular saw and a driver drill.

14. The battery pack as set forth in claim 1 wherein the FET is physically mounted on the heat sink and in heat transfer relationship with the heat sink.

15. The battery pack as set forth in claim 14 wherein the switch includes a second FET, and wherein the heat sink is in heat transfer relationship with the second FET and operable to dissipate heat from the second FET.

16. The battery pack as set forth in claim 1 wherein the hand held power tool is one of a circular saw and a driver drill.

17. The battery pack as set forth in claim 4 wherein the FET is physically mounted on the heat sink and in heat transfer relationship with the heat sink.

18. The battery pack as set forth in claim 4 wherein the power tool is a hand held power tool, and wherein the housing is connectable to and supportable by the hand held power tool.

19. The battery pack as set forth in claim 6 wherein the power tool is a hand held power tool, and wherein the housing is connectable to and supportable by the hand held power tool.

20. The battery pack as set forth in claim 7 wherein the second FET is physically mounted on the heat sink and in heat transfer relationship with the heat sink.

21. The battery pack as set forth in claim 12 wherein the one of the circular saw and the driver drill includes a power tool housing, and wherein the housing of the battery pack is connectable to and supportable by the power tool housing.

* * * * *